US010036838B2

(12) United States Patent
Bak et al.

(10) Patent No.: US 10,036,838 B2
(45) Date of Patent: Jul. 31, 2018

(54) INFRARED RAY ABSORBING COMPOSITION OR INFRARED RAY ABSORBING COMPOSITION KIT, INFRARED RAY CUT FILTER USING THE SAME, METHOD FOR PRODUCING THE INFRARED RAY CUT FILTER, CAMERA MODULE, AND METHOD FOR PRODUCING THE CAMERA MODULE

(71) Applicant: FUJIFILM Corporation, Tokyo (JP)

(72) Inventors: Seongmu Bak, Shizuoka (JP); Toshihide Ezoe, Shizuoka (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 295 days.

(21) Appl. No.: 14/820,619

(22) Filed: Aug. 7, 2015

(65) Prior Publication Data
US 2015/0346404 A1 Dec. 3, 2015

Related U.S. Application Data

(63) Continuation of application No. PCT/JP2014/053449, filed on Feb. 14, 2014.

(30) Foreign Application Priority Data

Feb. 14, 2013 (JP) .................................. 2013-027135
Mar. 7, 2013 (JP) .................................. 2013-046006

(51) Int. Cl.
*G06K 7/10* (2006.01)
*G02B 5/20* (2006.01)
*G02B 1/04* (2006.01)
*G02B 1/00* (2006.01)
*H01L 31/0232* (2014.01)
*H01L 31/0216* (2014.01)
*H04N 5/225* (2006.01)
*C09D 5/32* (2006.01)
*G02B 5/22* (2006.01)
*H04N 9/04* (2006.01)
*H01L 27/146* (2006.01)
*C09B 47/04* (2006.01)
*C09B 67/02* (2006.01)

(52) U.S. Cl.
CPC ............ *G02B 5/208* (2013.01); *C09B 47/045* (2013.01); *C09B 67/0097* (2013.01); *C09D 5/32* (2013.01); *G02B 1/002* (2013.01); *G02B 1/04* (2013.01); *G02B 5/22* (2013.01); *H01L 27/14618* (2013.01); *H01L 27/14625* (2013.01); *H01L 31/02162* (2013.01); *H01L 31/02325* (2013.01); *H04N 5/2254* (2013.01); *H04N 5/2257* (2013.01); *H04N 9/045* (2013.01); *H01L 2924/0002* (2013.01)

(58) Field of Classification Search
USPC ........................................ 359/356, 350, 359
See application file for complete search history.

(56) References Cited

U.S. PATENT DOCUMENTS

| 2002/0050587 | A1* | 5/2002 | Hayashi | C07F 9/4006 |
| | | | | 252/582 |
| 2009/0015548 | A1* | 1/2009 | Tazaki | G06F 3/0308 |
| | | | | 345/156 |
| 2012/0019906 | A1 | 1/2012 | Van Nuffel et al. | |
| 2012/0243077 | A1* | 9/2012 | Osawa | G02B 3/0056 |
| | | | | 359/356 |

FOREIGN PATENT DOCUMENTS

| JP | 2001-174626 A | 6/2001 |
| JP | 2002-71941 A | 3/2002 |
| JP | 2010-079145 A | 4/2010 |
| JP | 2011-133532 A | 7/2011 |
| JP | 2011-212849 A | 10/2011 |
| JP | 2012-020448 A | 2/2012 |
| JP | 2012-021066 A | 2/2012 |
| JP | 2012-028620 A | 2/2012 |
| JP | 2012-517359 A | 8/2012 |
| JP | 2012-185385 A | 9/2012 |
| JP | 2013-241563 A | 12/2013 |
| TW | 200813493 A | 3/2008 |
| WO | 2011/071052 A1 | 6/2011 |

OTHER PUBLICATIONS

International Preliminary Report on Patentability and Written Opinion, dated Aug. 27, 2015, issued in corresponding International Application No. PCT/JP2014/053449, 10 pages in English.
Communication dated Dec. 28, 2016 from the Korean Intellectual Property Office in counterpart Application No. 10-2015-7021550.
Communication dated Nov. 24, 2015 from the Japanese Patent Office issued in corresponding Application No. 2014-026815.
Communication dated May 8, 2017 from the Taiwanese Intellectual Property Office in counterpart application No. 103104910.
International Search Report for PCT/JP2014/053449 dated May 20, 2014.
Communication dated May 30, 2016, issued by the Korean Intellectual Property Office in corresponding Korean Application No. 10-2015-7021550.

(Continued)

*Primary Examiner* — Monique R Peets

(74) *Attorney, Agent, or Firm* — Sughrue Mion, PLLC

(57) ABSTRACT

An infrared ray absorbing composition kit comprises: a composition containing a copper compound or pigment having a maximum absorption wavelength in the wavelength range of 700 nm to 1000 nm; and a composition containing a metal oxide having a maximum absorption wavelength in the wavelength range of 800 nm to 2000 nm.

10 Claims, 2 Drawing Sheets

(56) References Cited

OTHER PUBLICATIONS

Office Action dated Nov. 28, 2017 from the Taiwanese Intellectual Property Office in counterpart Taiwanese Application No. 103104910.

* cited by examiner

INFRARED RAY ABSORBING COMPOSITION OR INFRARED RAY ABSORBING COMPOSITION KIT, INFRARED RAY CUT FILTER USING THE SAME, METHOD FOR PRODUCING THE INFRARED RAY CUT FILTER, CAMERA MODULE, AND METHOD FOR PRODUCING THE CAMERA MODULE

CROSS-REFERENCE TO RELATED APPLICATIONS

This application is a Continuation of PCT International Application No. PCT/JP2014/053449 filed on Feb. 14, 2014, which claims priority under 35 U.S.C. § 119(a) to Japanese Patent Application No. 2013-027135 filed on Feb. 14, 2013 and Japanese Patent Application No. 2013-046006 filed on Mar. 7, 2013. Each of the above application(s) is hereby expressly incorporated by reference, in its entirety, into the present application.

BACKGROUND OF THE INVENTION

The present invention relates to an infrared ray absorbing composition or an infrared ray absorbing composition kit, an infrared ray cut filter using the infrared ray absorbing composition or the infrared ray absorbing composition kit, a method for producing the infrared ray cut filter, a camera module, and a method for producing the camera module.

In video cameras, digital still cameras, cellular phones with a camera function, and the like, a charge-coupled device (CCD) or a complementary metal oxide semiconductor (CMOS) image sensors which are solid state imaging elements for capturing color images are employed. Since in these solid state imaging elements, a silicon photodiodes having sensitivity to near infrared rays is used in the light receiving portion thereof, it is required to perform visibility correction, and thus, an infrared ray cut filter is used (see, for example, JP 2012-28620 A).

As such an infrared ray cut filter, an infrared ray cut filter of a type using a dielectric multilayer film and an infrared ray cut filter of a type using an infrared ray absorber have been known.

As the infrared ray cut filter of the type using a dielectric multilayer film, for example, an infrared ray cut filter using a glass substrate as a base material and an infrared ray cut filter using a resin film as a base material have been known.

In addition, as the infrared ray cut filter of the type using an infrared ray absorber, an infrared ray cut filter which is composed mostly of glass have been mainly known.

For example, JP 2012-185385 A and the like disclose a near infrared ray absorbing filter using a specific copper complex. In addition, JP 2012-517359 A and the like disclose an infrared ray absorber such as cesium tungsten oxide.

SUMMARY OF THE INVENTION

It is required for an infrared ray cut filter to satisfy various performances such as heat resistance and moisture resistance, and in particular, it is required for an infrared ray cut filter to sufficiently shield near infrared rays at wavelengths around 700 nm and also sufficiently shield infrared rays.

The present invention has been made in consideration of such a situation, and an object thereof is to accomplish the followings.

That is, the object of the present invention to provide an infrared ray absorbing composition or an infrared ray absorbing composition kit which is capable of producing an infrared ray cut filter excellent in near infrared ray shielding property and infrared ray shielding property, and also excellent in heat resistance and moisture resistance; an infrared ray cut filter using the infrared ray absorbing composition or the infrared ray absorbing composition kit; a method for producing the infrared ray cut filter; a camera module; and a method for producing the camera module.

The constitution of the present invention is as follows, and the above object of the present invention can be achieved by the constitution.

[1] An infrared ray absorbing composition kit comprising a composition containing a copper compound or pigment having a maximum absorption wavelength in the wavelength range of 700 nm to 1000 nm, and a composition containing a metal oxide having a maximum absorption wavelength in the wavelength range of 800 nm to 2000 nm.

[2] The infrared ray absorbing composition kit described in [1], in which the content of the metal oxide in the composition containing the metal oxide is from 1% by mass to 50% by mass with respect to the mass of the total solid content of the composition.

[3] The infrared ray absorbing composition kit described in [1] or [2], in which the content of the copper compound in the composition containing the copper compound or pigment is from 50% by mass to 80% by mass with respect to the mass of the total solid content of the composition.

[4] The infrared ray absorbing composition kit described in [1] or [2], in which the content of the pigment in the composition containing the copper compound or pigment is from 1% by mass to 20% by mass with respect to the mass of the total solid content of the composition.

[5] The infrared ray absorbing composition kit described in [1], in which the pigment is a cyanine pigment, a phthalocyanine pigment, a quaterrylene pigment, an aminium pigment, an iminium pigment, an azo pigment, an anthraquinone pigment, a diimonium pigment, a squalirium pigment, or a porphyrin pigment.

[6] An infrared ray absorbing composition comprising a copper compound having a maximum absorption wavelength in the wavelength range of 700 nm to 1000 nm, and a metal oxide having a maximum absorption wavelength in the wavelength range of 800 nm to 2000 nm.

[7] The infrared ray absorbing composition described in [6], in which the content of the metal oxide is from 0.001% by mass to 5% by mass with respect to the mass of the total solid content of the composition.

[8] The infrared ray absorbing composition described in [6] or [7], in which the content of the copper compound is from 50% by mass to 80% by mass with respect to the mass of the total solid content of the composition.

[9] The infrared ray absorbing composition or the infrared ray absorbing composition kit described in any one of [1] to [8], in which the metal oxide is cesium tungsten oxide.

[10] The infrared ray absorbing composition or the infrared ray absorbing composition kit described in any one of [1] to [9], in which the copper compound is a copper complex represented by the following General formula (1):

$$Cu(L)_{n1} \cdot (X)_{n2} \qquad \text{General Formula (1)}$$

(in General Formula (1), L represents a ligand coordinated to copper, X is not present or represents a halogen atom, $H_2O$, $NO_3$, $ClO_4$, $SO_4$, CN, SCN, $BF_4$, $PF_6$, $BPh_4$ (Ph represents a phenyl group) or an alcohol, and each of n1 and n2 independently represents an integer of 1 to 4).

[11] The infrared ray absorbing composition or the infrared ray absorbing composition kit described in [10], in which the ligand L in General Formula (1) is a sulfonic acid, a carboxylic acid, a phosphoric acid, a phosphoric acid ester, a phosphonic acid, phosphonic acid ester, or a phosphinic acid.

[12] The infrared ray absorbing composition or the infrared ray absorbing composition kit described in any one of [1] to [11], in which the mass ratio of the metal oxide to the copper compound is from 0.0001 to 0.5.

[13] An infrared ray cut filter comprising a copper compound- or pigment-containing film which contains a copper compound or pigment having a maximum absorption wavelength in the wavelength range of 700 nm to 1000 nm, and a metal oxide-containing film which contains a metal oxide having a maximum absorption wavelength in the wavelength range of 800 nm to 2000 nm.

[14] The infrared ray cut filter described in [13], in which the copper compound- or pigment-containing film is a copper compound-containing film, the film thickness of the copper compound-containing film is from 10 μm to 300 μm, and the film thickness of the metal oxide-containing film is 10 μm or less.

[15] The infrared ray cut filter described in [14], in which the film thickness of the copper compound-containing film is from 10 μm to 100 μm.

[16] The infrared ray cut filter described in [13], in which the copper compound- or pigment-containing film is a pigment-containing film, the film thickness of the pigment-containing film is from 0.05 μm to 100 μm, and the film thickness of the metal oxide-containing film is 10 μm or less.

[17] The infrared ray cut filter described in any one of [14] to [16], in which the film thickness of the metal oxide-containing film is 5 μm or less.

[18] An infrared ray cut filter formed by using the infrared ray absorbing composition or the infrared ray absorbing composition kit described in any one of [1] to [12].

[19] A method for producing an infrared ray cut filter comprising a step of coating a composition containing a copper compound or pigment having a maximum absorption wavelength in the wavelength range of 700 nm to 1000 nm to form a copper compound- or pigment-containing film, and a step of coating a composition containing a metal oxide having a maximum absorption wavelength in the wavelength range of 800 nm to 2000 nm to form a metal oxide-containing film.

[20] A method for producing an infrared ray cut filter comprising a step of coating the infrared ray absorbing composition or the infrared ray absorbing composition kit described in any one of [1] to [12] to form a film.

[21] The method for producing an infrared ray cut filter described in [19] or [20], in which the coating is a coating using an applicator.

[22] A camera module comprising a solid state imaging element substrate, and an infrared ray cut filter disposed on the light-receiving side of the solid state imaging element substrate, in which the infrared ray cut filter is the infrared ray cut filter described in any one of [13] to [18].

[23] A method for producing a camera module composed of a solid state imaging element substrate and an infrared ray cut filter disposed on the light-receiving side of the solid state imaging element substrate, comprising a step of coating a composition containing a copper compound or pigment having a maximum absorption wavelength in the wavelength range of 700 nm to 1000 nm at the light-receiving side of the solid state imaging element substrate to form a copper compound- or pigment-containing film, and a step of coating a composition containing a metal oxide having a maximum absorption wavelength in the wavelength range of 800 nm to 2000 nm to form a metal oxide-containing film.

[24] A method for producing a camera module composed of a solid state imaging element substrate and an infrared ray cut filter disposed on the light-receiving side of the solid state imaging element substrate, comprising a step of coating the infrared ray absorbing composition or the infrared ray absorbing composition kit described in any one of [1] to [12] at the light-receiving side of the solid imaging element substrate to form a film.

[25] A solid state imaging element comprising a solid state imaging element substrate, a microlens disposed on the light-receiving side of the solid state imaging element substrate, and a near infrared ray absorbing layer which contains a metal oxide having a maximum absorption wavelength in the wavelength range of 800 nm to 2000 nm, and which is provided at a position within 2 mm from the surface of the microlens.

[26] The solid state imaging element described in [25], in which the metal oxide is cesium tungsten oxide.

[27] A near infrared ray absorbing composition which is coated at a position within 2 mm from a surface of a microlens of a solid state imaging element comprising a solid state imaging element substrate and the microlens disposed on the light-receiving side of the solid state imaging element substrate, wherein the near infrared ray absorbing composition contains a metal oxide having a maximum absorption wavelength in the wavelength range of 800 nm to 2000 nm.

Furthermore, the present invention preferably has the following constitution.

[28] The infrared ray absorbing composition or the infrared ray absorbing composition kit described in any one of [1] to [12], in which the metal oxide is represented by the following General formula (I):

$$M_xW_yO_z \hspace{2cm} \text{General Formula (I)}$$

(in General Formula (I), M represents a metal, W represents tungsten, O represents oxygen, and x, y, and z satisfies $0.001 \leq x/y \leq 1.1$ and $2.2 \leq z/y \leq 3.0$).

[29] The infrared ray absorbing composition or the infrared ray absorbing composition kit described in [28], in which the above M is an alkali metal.

The present invention relates to the above-described [1] to [29], and items other than these will also be described below.

<1> An infrared ray absorbing composition kit comprising a composition containing a copper compound or pigment having a maximum absorption wavelength in the wavelength range of 700 nm to 1000 nm, and a composition containing a metal oxide having a maximum absorption wavelength in the wavelength range of 800 nm to 2000 nm.

<2> The infrared ray absorbing composition kit described in <1>, in which the content of the metal oxide in the composition containing the metal oxide is from 1% by mass to 50% by mass with respect to the mass of the total solid content of the composition.

<3> The infrared ray absorbing composition kit described in <1> or <2>, in which the content of the copper compound in the composition containing the copper compound or pigment is from 50% by mass to 80% by mass with respect to the mass of the total solid content of the composition.

<4> The infrared ray absorbing composition kit described in <1> or <2>, in which the content of the pigment in the composition containing the copper compound or pigment is from 1% by mass to 20% by mass with respect to the mass of the total solid content of the composition.

<5> An infrared ray absorbing composition comprising a copper compound or pigment having a maximum absorption wavelength in the wavelength range of 700 nm to 1000 nm, and a metal oxide having a maximum absorption wavelength in the wavelength range of 800 nm to 2000 nm.

<6> The infrared ray absorbing composition described in <5>, in which when the infrared ray absorbing composition contains the copper compound, the content of the metal oxide is from 0.001% by mass to 5% by mass with respect to the mass of the total solid content of the composition.

<7> The infrared ray absorbing composition described in <5>, in which when the infrared ray absorbing composition contains the pigment, the content of the metal oxide is from 30% by mass to 80% by mass with respect to the mass of the total solid content of the composition.

<8> The infrared ray absorbing composition described in <5> or <6>, in which the content of the copper compound is from 50% by mass to 80% by mass with respect to the mass of the total solid content of the composition.

<9> The infrared ray absorbing composition described in <5> or <7>, in which the content of the pigment is from 1% by mass to 20% by mass with respect to the mass of the total solid content of the composition.

<10> The infrared ray absorbing composition described in any one of <5>, <7> and <9>, in which the mass ratio of the metal oxide to the pigment is from 5 to 50.

<11> The infrared ray absorbing composition or the infrared ray absorbing composition kit described in any one of <1> to <5>, <7>, <9> and <10>, in which the pigment is a cyanine pigment, a phthalocyanine pigment, a quaterrylene pigment, an aminium pigment, an iminium pigment, an azo pigment, an anthraquinone pigment, a diimonium pigment, a squalirium pigment, or a porphyrin pigment.

<12> The infrared ray absorbing composition or the infrared ray absorbing composition kit described in any one of <1> to <11>, in which the metal oxide is cesium tungsten oxide.

<13> The infrared ray absorbing composition or the infrared ray absorbing composition kit described in any one of <1> to <12>, in which the copper compound is a copper complex represented by the following General formula (1):

$$Cu(L)_{n1}\cdot(X)_{n2}$$  General Formula (1)

(in General Formula (1), L represents a ligand coordinated to copper, X is not present or represents a halogen atom, $H_2O$, $NO_3$, $ClO_4$, $SO_4$, CN, SCN, $BF_4$, $PF_6$, $BPh_4$ (Ph represents a phenyl group) or an alcohol, and each of n1 and n2 independently represents an integer of 1 to 4).

<14> The infrared ray absorbing composition or the infrared ray absorbing composition kit described in <13>, in which the ligand L in General Formula (1) is a sulfonic acid, a carboxylic acid, a phosphoric acid, a phosphoric acid ester, a phosphonic acid, phosphonic acid ester, or a phosphinic acid.

<15> The infrared ray absorbing composition or the infrared ray absorbing composition kit described in any one of <1> to <14>, in which the mass ratio of the metal oxide to the copper compound is from 0.0001 to 0.5.

<16> An infrared ray cut filter comprising a copper compound- or pigment-containing film which contains a copper compound or pigment having a maximum absorption wavelength in the wavelength range of 700 nm to 1000 nm, and a metal oxide-containing film which contains a metal oxide having a maximum absorption wavelength in the wavelength range of 800 nm to 2000 nm.

<17> The infrared ray cut filter described in <16>, in which the copper compound- or pigment-containing film is a copper compound-containing film, the film thickness of the copper compound-containing film is from 10 μm to 300 μm, and the film thickness of the metal oxide-containing film is 10 μm or less.

<18> The infrared ray cut filter described in <17>, in which the film thickness of the copper compound-containing film is from 10 μm to 100 μm.

<19> The infrared ray cut filter described in <16>, in which the copper compound- or pigment-containing film is a pigment-containing film, the film thickness of the pigment-containing film is from 0.05 μm to 100 μm, and the film thickness of the metal oxide-containing film is 10 μm or less.

<20> The infrared ray cut filter described in any one of <17> to <19>, in which the film thickness of the metal oxide-containing film is 5 μm or less.

<21> An infrared ray cut filter formed by using the infrared ray absorbing composition or the infrared ray absorbing composition kit described in any one of <1> to <15>.

<22> A method for producing an infrared ray cut filter comprising a step of coating a composition containing a copper compound or pigment having a maximum absorption wavelength in the wavelength range of 700 nm to 1000 nm to form a copper compound- or pigment-containing film, and a step of coating a composition containing a metal oxide having a maximum absorption wavelength in the wavelength range of 800 nm to 2000 nm to form a metal oxide-containing film.

<23> A method for producing an infrared ray cut filter comprising a step of coating the infrared ray absorbing composition or the infrared ray absorbing composition kit described in any one of <1> to <15> to form a film.

<24> The method for producing an infrared ray cut filter described in <22> or <23>, in which the coating is a coating using an applicator.

<25> A camera module comprising a solid state imaging element substrate, and an infrared ray cut filter disposed on the light-receiving side of the solid state imaging element substrate, in which the infrared ray cut filter is the infrared ray cut filter described in any one of <16> to <21>.

<26> A method for producing a camera module composed of a solid state imaging element substrate and an infrared ray cut filter disposed on the light-receiving side of the solid state imaging element substrate, comprising a step of coating a composition containing a copper compound or pigment having a maximum absorption wavelength in the wavelength range of 700 nm to 1000 nm at the light-receiving side of the solid state imaging element substrate to form a copper compound- or pigment-containing film, and a step of coating a composition containing a metal oxide having a maximum absorption wavelength in the wavelength range of 800 nm to 2000 nm to form a metal oxide-containing film.

<27> A method for producing a camera module composed of a solid state imaging element substrate and an infrared ray cut filter disposed on the light-receiving side of the solid state imaging element substrate, comprising a step of coating the infrared ray absorbing composition or the infrared ray absorbing composition kit described in any one of <1> to <15> at the light-receiving side of the solid imaging element substrate to form a film.

According to the present invention, it is possible to provide an infrared ray absorbing composition or an infrared ray absorbing composition kit which is capable of producing an infrared ray cut filter excellent in near infrared ray shielding property and infrared ray shielding property, and also excellent in heat resistance and moisture resistance; an infrared ray cut filter using the infrared ray absorbing composition or the infrared ray absorbing composition kit; a method for producing the infrared ray cut filter, a camera module; and a method for producing the camera module.

DETAILED DESCRIPTION OF THE INVENTION

With regard to the denotations of groups (atomic groups) in the present specification, denotations having no description concerning substitution or unsubstitution include both a case where a substituent is not present and a case where a substituent is present. For example, the "alkyl group" includes an alkyl group having no substituent (unsubstituted alkyl group) as well as an alkyl group having a substituent (substituted alkyl group). Further, in the present specification, the viscosity value refers to a value at 25° C.

An infrared ray absorbing composition kit of the present invention (hereinafter also simply referred to as a "first aspect") comprises a composition containing a copper compound or pigment having a maximum absorption wavelength in the wavelength range of 700 nm to 1000 nm, and a composition containing a metal oxide having a maximum absorption wavelength in the wavelength range of 800 nm to 2000 nm.

Figure 1:
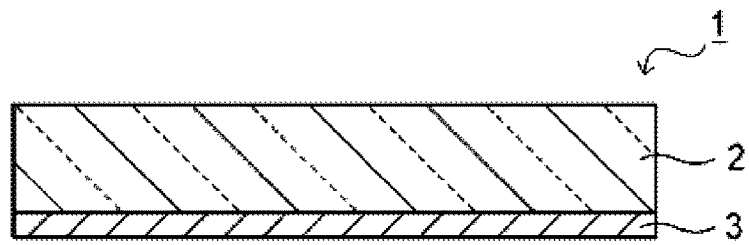
FIG. 1 is a schematic cross-sectional view of an infrared ray cut filter of the present invention.

FIG. 1 is a schematic cross-sectional view of an infrared ray cut filter of the present invention.

By using the infrared ray absorbing composition kit of the present invention (in particular, an infrared ray absorbing composition kit for forming an infrared ray cut filter is preferred), an infrared ray cut filter 1 having a copper compound- or pigment-containing film 2 which contains a copper compound or pigment having a maximum absorption wavelength in the wavelength range of 700 nm to 1000 nm, and a metal oxide-containing film 3 which contains a metal oxide having a maximum absorption wavelength in the wavelength range of 800 nm to 2000 nm, as shown in FIG. 1, can be obtained.

According to the infrared ray absorbing composition kit of the present invention, the copper compound- or pigment-containing film 2 having near infrared ray shielding property can be formed from the composition containing the copper compound or pigment, and the metal oxide-containing film 3 having infrared ray shielding property can be formed from the composition containing the metal oxide. Thus, the infrared ray cut filter 1 having both of near infrared ray shielding property and infrared ray shielding property can be obtained.

It is preferable for the thickness of the copper compound- or pigment-containing film to be decreased so as to apply the film to a solid state imaging device, but in order to obtain near infrared ray shielding property, use of only the copper compound- or pigment-containing film results in increase of the thickness of the film.

In contrast, according to the infrared ray absorbing composition kit of the present invention, the metal oxide-containing film 3 can partially supplement the near infrared ray shielding property, and thus, the thickness of the copper compound- or pigment-containing film 2 can be decreased.

In a second aspect of the infrared ray absorbing composition of the present invention, the composition may be an infrared ray absorbing composition containing a copper compound or pigment having a maximum absorption wavelength in the wavelength range of 700 nm to 1000 nm, and a metal oxide having a maximum absorption wavelength in the wavelength range of 800 nm to 2000 nm (in particular, an infrared ray absorbing composition for forming an infrared ray cut filter is preferred).

Each of the maximum absorption wavelengths in the copper compound or pigment and the metal oxide is equivalent to a value obtained from a film having a thickness of 1 µm, which has been obtained by coating a solution prepared such that the solid content of the copper compound or pigment or the metal oxide is 20% by mass with respect to the total amount of the solution, using a spectrophotometer.

Herein, the solid content does not contain a solvent, and the solid content means a film forming material.

In the infrared ray absorbing composition of the present invention, it is considered that in either of the first aspect and the second aspect, by using the copper compound or pigment having a maximum absorption wavelength in the wavelength range of 700 nm to 1000 nm and the metal oxide having a maximum absorption wavelength in the wavelength range of 800 nm to 2000 nm, an infrared ray cut filter having high shielding property with respect to infrared rays including near infrared rays at wavelengths around 700 nm can be formed. Further, it is considered that since the metal oxide is used as a compound having a maximum absorption wavelength in the wavelength range of 800 nm to 2000 nm, an infrared ray cut filter which has good transmissivity with respect to visible light and is excellent in heat resistance and moisture resistance can be formed, although the reason therefor is not clear.

Hereinafter, the configurations of the composition will be described.

The description of the constituents as described below may be based on the representative embodiments of the present invention in some cases, but the present invention is not limited to such embodiments. Further, in the present specification, a range of numerical values that is indicated using "to" means a range in which numerical values before and after "to" are included therein as a lower limit and an upper limit.

In addition, in the present specification, the "(meth)acrylate" indicates acrylate and methacrylate, the "(meth)acryl" indicates acryl and methacryl, and the "(meth)acryloyl" indicates acryloyl and methacryloyl. Further, in the present specification, the "monomeric substance" has the same meaning as "monomer". The monomeric substance in the present invention is distinguished from an oligomer and a polymer, and indicates a compound having a mass average molecular weight of 2,000 or less. In the present specification, the polymerizable compound indicates a compound having a polymerizable group and may be either a monomeric substance or a polymer. The polymerizable group indicates a group involved in a polymerization reaction.

[1] Copper Compound or Pigment Having Maximum Absorption Wavelength in Wavelength Range of 700 nm to 1000 nm In the present invention, a copper compound or pigment having a maximum absorption wavelength in the wavelength range of 700 nm to 1000 nm is used, but a copper compound having a maximum absorption wavelength in the wavelength range of 700 nm to 1000 nm is preferred.

The copper compound used in the present invention is not particularly limited as long as it is a copper compound having a maximum absorption wavelength in the wavelength range of 700 nm to 1000 nm (near infrared ray region), but the copper compound is preferably a copper complex.

The copper complex used in the present invention is preferably represented by the following General formula (1), and it is more preferably a phosphorous-containing copper complex or a sulfonic acid copper complex.

$$Cu(L)_{n1} \cdot (X)_{n2} \qquad \text{General Formula (1)}$$

(in General Formula (1), L represents a ligand coordinated to copper, X is not present or represents a halogen atom, $H_2O$, $NO_3$, $ClO_4$, $SO_4$, CN, SCN, $BF_4$, $PF_6$, $BPh_4$ (Ph represents a phenyl group) or an alcohol, and each of n1 and n2 independently represents an integer of 1 to 4).

The ligand L coordinated to copper is not particularly limited as long as it can form a coordinate bond with a copper ion, but it preferably has a substituent containing C, N, O, and/or S as an atom capable of being coordinated to copper, and more preferably has a group having a lone electron pair such as N, O, or S.

Examples of the compound which forms the ligand L include compounds having sulfonic acids, phosphoric acids, phosphoric acid esters, phosphonic acids, phosphonic acid esters, phosphinic acids, carboxylic acids, carbonyls (esters and ketones), amines, amides, sulfonamides, urethanes, ureas, alcohols, thiols, and the like. Among these, sulfonic acids, phosphoric acids, phosphoric acid esters, phosphonic acids, phosphonic acid esters, and phosphinic acids are preferred.

The group capable of being coordinated to copper is not limited to one kind, and two or more kinds of groups may be included in a molecule. Further, the group capable of being coordinated to copper may be dissociative or non-dissociative, and in the latter case, X is not present.

The copper complex as an infrared ray absorbing material has a form of copper complex (copper compound) in which a ligand is coordinated to cooper as a central metal. The copper in the copper complex of the present invention is a divalent copper, and the copper complex can be produced by, for example, a reaction of a copper component with a ligand. Accordingly, it is predicted that in an "infrared ray absorbing composition containing copper and a ligand", a copper complex is formed in the composition.

Examples of the compound or a salt thereof which becomes a ligand L are shown above, but suitable examples thereof include organic acid compounds (for example, sulfonic acid compounds, carboxylic acid compounds, and phosphoric acid compounds) or salts thereof.

The compound or a salt thereof which becomes the above ligand is preferably a compound having an acid group or a salt thereof, and is preferably a compound represented by the following General formula (ii).

$$R^1 \text{\textendash} (X^1)_{n3} \qquad \text{General Formula (ii)}$$

(in General Formula (ii), $R^1$ represents an n-valent (1- to 6-valent) organic group, $X^1$ represents an acid group, and n3 represents an integer of 1 to 6).

In General Formula (ii), the n-valent organic group is preferably a hydrocarbon group or an oxyalkylene group, and more preferably an aliphatic hydrocarbon group or an aromatic hydrocarbon group. The hydrocarbon group may have a substituent, and examples of the substituent include an alkyl group, a halogen atom (preferably a fluorine atom), a polymerizable group (for example, a vinyl group, a (meth) acryloyl group, an epoxy group, and an oxethane group), a sulfonic acid group, a carboxylic acid group, an acid group containing a phosphorous atom, a carboxylic acid ester group (for example, —$CO_2CH_3$), a hydroxyl group, an alkoxy group (for example, a methoxy group), an amino group, a carbamoyl group, a carbamoyloxy group, a halogenated alkyl group (for example, a fluoroalkyl group and a chloroalkyl group), and the like. In the case where the hydrocarbon group has a substituent, it may further have a substituent, and examples of the substituent include an alkyl group, the above polymerizable group, a halogen atom, and the like.

In the case where the hydrocarbon group is monovalent, an alkyl group, an alkenyl group, or an aryl group is preferred, and an aryl group is more preferred. In the case where the hydrocarbon group is divalent, an alkylene group, an allylene group, or an oxyalkylene group is preferred, and an allylene group is more preferred. In the case where the hydrocarbon group is a tri-valent or higher-valent, it is preferably a hydrocarbon group corresponding to the above monovalent hydrocarbon group or the above divalent hydrocarbon group.

The alkyl group and the alkylene group may be any one of linear, branched, and cyclic groups. The linear alkyl group and alkylene group preferably have 1 to 20 carbon atoms, more preferably have 1 to 12 carbon atoms, and still more preferably have 1 to 8 carbon atoms. The branched alkyl group and alkylene group preferably have 3 to 20 carbon atoms, more preferably have 3 to 12 carbon atoms, and still more preferably have 3 to 8 carbon atoms. The cyclic alkyl group and alkylene group may be any one of monocyclic and polycyclic groups. The cyclic alkyl group and alkylene group preferably have 3 to 20 carbon atoms, more preferably have 4 to 10 carbon atoms, and still more preferably have 6 to 10 carbon atoms.

The alkenyl group and alkenylene group preferably have 2 to 10 carbon atoms, more preferably have 2 to 8 carbon atoms, and still more preferably have 2 to 4 carbon atoms.

The aryl group and allylene group preferably have 6 to 18 carbon atoms, more preferably have 6 to 12 carbon atoms, and still more preferably have 6 to 10 carbon atoms.

In General Formula (ii), $X^1$ is preferably at least one selected from a sulfonic acid group, a carboxylic acid group, and an acid group containing a phosphorous atom. $X^1$ may be formed of one kind of group or two or more kinds of groups, and it is preferably formed of two or more kinds of groups.

In General Formula (ii), n3 is preferably 1 to 3, more preferably 2 or 3, and still more preferably 3.

The molecular weight of a compound or a salt thereof (a compound containing an acid group or a salt thereof) which becomes the above ligand is preferably 1000 or less, more preferably 80 to 1000, and more preferably 80 to 500.

As one of suitable embodiments of the compound which forms the ligand L used in the present invention, a sulfonic acid compound is preferred. That is, the above copper complex is preferably a sulfonic acid copper complex. The sulfonic acid copper complex used in the present invention has copper as a central metal and a sulfonic acid compound as a ligand.

The above sulfonic acid compound is more preferably a compound represented by the following General formula (iii).

General Formula (iii)

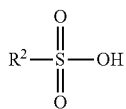

(in General Formula (iii), R² represents a monovalent organic group).

The sulfonic acid and a salt thereof represented by General Formula (iii) act as a ligand coordinated to copper.

Specific examples of the monovalent organic group of R² in General Formula (iii) include hydrocarbon groups, and specifically include linear, branched, or cyclic alkyl groups, alkenyl groups, and aryl groups. These groups may be groups interrupted by a divalent linking group (for example, a linear or branched alkylene group, a cyclic alkylene group, an allylene group, —O—, —S—, —CO—, —COO—, —OCO—, —SO₂—, and —NR— (in which R is a hydrogen atom or an alkyl group)).

The number of carbon atoms of the linear alkyl group, the branched alkyl group, the cyclic alkyl group, the alkenyl group, and the aryl group has the same definition in R¹ in General Formula (ii) described above, and a preferred range thereof is also the same.

The monovalent organic group may have a substituent, and examples of the substituent include substituents which may be contained in R¹ in General Formula (ii) as described above. Examples of the substituent which may be contained in the linear alkyl group and the branched alkyl group include at least one of a halogen atom, a polymerizable group, and a carboxylic acid group. Examples of the substituent which may be contained in the aryl group include at least one of an alkyl group, an alkoxy group, a halogenated alkyl group, a halogen atom, a polymerizable group, a sulfonic acid group, a carboxylic acid group, and a methyl carboxylate group, and preferably at least one of a sulfonic acid group and a carboxylic acid group.

Examples of the linear or branched alkylene group, the cyclic alkylene group, and the allylene group, which are the divalent linking groups, include divalent linking groups derived from the aforementioned linear, branched, or cyclic alkyl groups and the aryl groups by removing one hydrogen atom therefrom.

The molecular weight of the compound represented by General Formula (iii) is preferably from 80 to 750, more preferably from 80 to 600, and still more preferably from 80 to 450.

Moreover, the sulfonic acid copper complex of the present invention contains a structure represented by the following General formula (iv).

General Formula (iv)

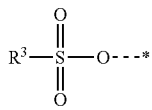

(in General Formula (iv), R³ represents a monovalent organic group, and "*" represents a site which forms a coordinate bond with copper).

In General Formula (iv), R³ has the same definition as R² in General Formula (iii), and a preferred range thereof is also the same.

Specific examples of the sulfonic acid compound represented by General Formula (iii) are shown below, but are not limited to these.

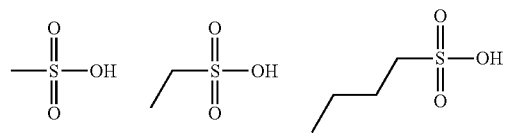

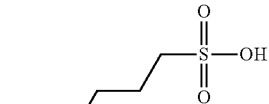

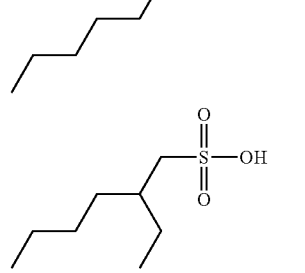

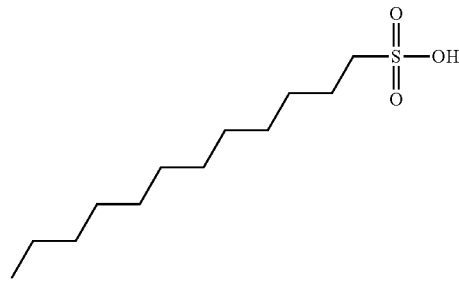

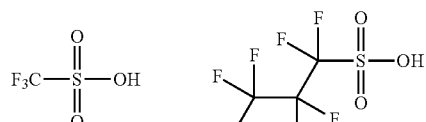

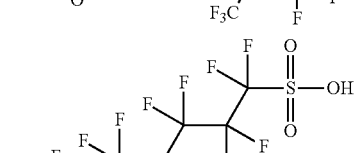

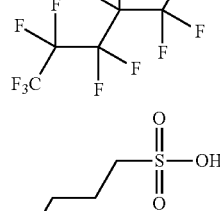

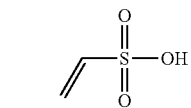

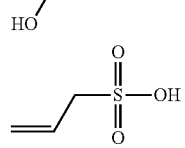

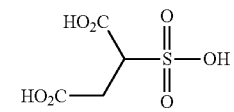

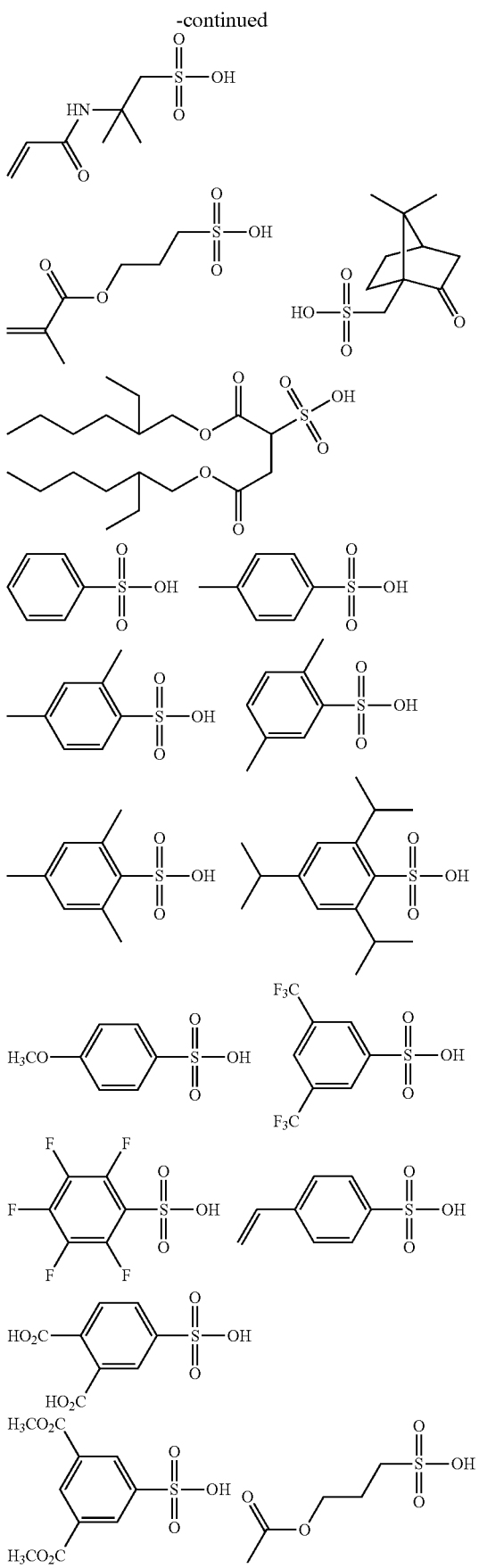

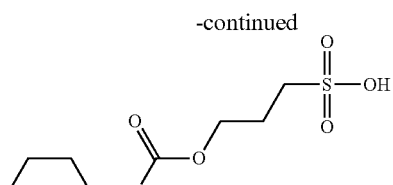

The sulfonic acid copper complex used in the present invention can be obtained by reacting a copper component with a sulfonic acid compound or a salt thereof which becomes a ligand.

As the copper component, copper or a compound containing copper can be used. As the compound containing copper, for example, copper oxide or a copper salt can be used. As the copper salt, a monovalent or divalent copper is preferred, and a divalent copper is more preferred. As the copper salt, copper acetate, copper chloride, copper formate, copper stearate, copper benzoate, copper ethylacetoacetate, copper pyrophosphate, copper naphthenate, copper citrate, copper nitrate, copper sulfate, copper carbonate, copper chlorate, copper (meth)acrylate, and copper perchlorate are preferred, and copper acetate, copper chloride, copper sulfate, copper benzoate, and copper (meth)acrylate are more preferred.

As the sulfonic acid compound used in the present invention, a commerically available sulfonic acid can be used, or the sulfonic acid compound used in the present invention can be synthesized with reference to a known method. As the salt of the sulfonic acid compound, for example, a metal salt is preferred, and specific examples thereof include a sodium salt, a potassium salt, and the like.

When the copper component is reacted with the aforementioned sulfonic acid compound or a salt thereof, the reaction ratio of the copper component to the sulfonic acid compound or a salt thereof is preferably from 1:1.5 to 1:4 in terms of a molar ratio. At this time, the sulfonic acid compound or a salt thereof may be used alone, or may be used in combination of two or more kinds thereof.

In addition, as the reaction conditions for the reaction of the copper component with the aforementioned sulfonic acid compound or a salt thereof, for example, a reaction temperature from 20° C. to 50° C. and a reaction time of 0.5 hours or longer are preferable.

The maximum absorption wavelength and the gram absorbance of the sulfonic acid copper complex of the present invention have the same definitions as the aforementioned phosphorous-containing copper complex, and preferred ranges thereof are also the same.

As the copper complex used in the present invention, a copper complex having a carboxylic acid as a ligand may be used, in addition to those described above. However, the present invention is not limited thereto. As the carboxylic acid used in the copper complex having a carboxylic acid as a ligand, for example, a compound represented by the following General formula (v) is preferred.

General Formula (v)

$$R^4 \underset{\underset{O}{\|}}{C} OH$$

(in General Formula (v), R⁴ represents a monovalent organic group).

In General Formula (v), R⁴ represents a monovalent organic group. The monovalent organic group is not particularly limited, and has the same definition as the monovalent organic group R² in General Formula (iii) described above, and a preferred range thereof is also the same.

As one of suitable embodiments of the compound which forms a ligand L used in the present invention, a phosphorous compound (phosphorous-containing compound) is preferred, and a compound represented by the following general formula (2) is more preferred.

$$(HO)_n-P(=O)-(R)_{3-n}$$
General Formula (2)

In General Formula (2), R represents an alkyl group having 1 to 18 carbon atoms, an aryl group having 6 to 18 carbon atoms, an aralkyl group having 1 to 18 carbon atoms, an alkenyl group having 1 to 18 carbon atoms, a polyoxyalkyl group having 4 to 100 carbon atoms, a (meth)acryloyloxyalkyl group having 4 to 100 carbon atoms, a (meth)acryloylpolyoxyalkyl group having 4 to 100 carbon atoms, or a substituent (—OR') in which the above substituent (R) is bonded to a P atom via an oxygen atom, and n represents 1 or 2. The number of carbon atoms in the polyoxyalkyl group, the (meth)acryloyloxyalkyl group, or the (meth)acryloylpolyoxyalkyl group is preferably from 4 to 20, and more preferably from 4 to 10.

When n is 1, R's may be the same as or different from each other.

In the above substituent (R), at least one hydrogen atom may be substituted with a halogen atom, an oxyalkyl group, a polyoxyalkyl group, an oxyaryl group, an acyl group, a carboxyl group, a (meth)acryloyl group, a (meth)acryloyloxyalkyl group, an alkanoyloxy group, an alkoxycarbonyl group, or a group formed by combination of these.

In the present invention, it is preferable that when n is 1, one of R's is a substituent (—OR') linked to a P atom via an oxygen atom, and the substituent (R') bonded to the oxygen atom is an alkyl group having 1 to 18 carbon atoms, an aryl group having 6 to 18 carbon atoms, an aralkyl group having 1 to 18 carbon atoms, an alkenyl group having 1 to 18 carbon atoms, a (meth)acryloyloxyalkyl group having 4 to 100 carbon atoms, or a (meth)acryloylpolyoxyalkyl group having 4 to 100 carbon atoms.

The molecular weight of a phosphoric acid ester compound used in the present invention is preferably from 300 to 1500, and more preferably from 320 to 900.

A phosphoric acid ester-copper complex as an infrared ray absorbing material has a form of copper complex (copper compound) in which a phosphoric acid ester is coordinated to copper as a central metal. The copper in the phosphoric acid ester-copper complex is a divalent copper, and the phosphoric acid ester-copper complex can be produced by, for example, a reaction of a copper salt with a phosphoric acid ester. Accordingly, it is predicted that in an "infrared ray absorbing composition containing copper and a phosphoric acid ester compound", a phosphoric acid ester-copper complex is formed in the composition.

Specific examples of the compound which forms the ligand include the exemplary compounds (A-1) to (A-122) shown in the following Tables 1 to 7.

TABLE 1

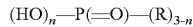

| | R¹ | R² |
|---|---|---|
| A-1 | H | 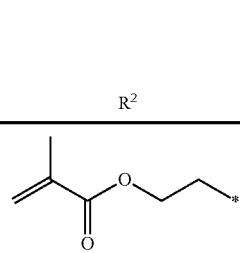 |
| A-2 | 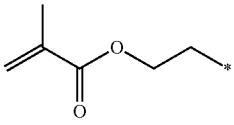 | 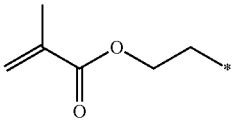 |
| A-3 | H | 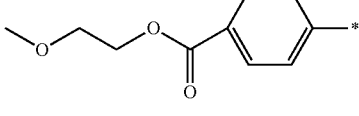 |
| A-4 | 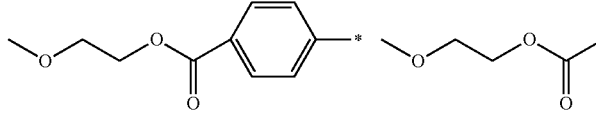 | 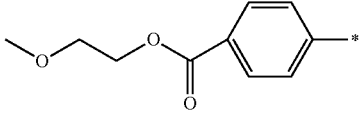 |
| A-5 | 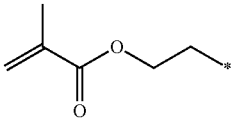 | 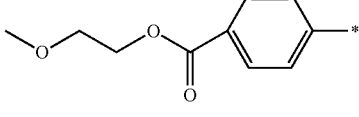 |

TABLE 1-continued $$\begin{array}{c} R^1O \\ R^2O \end{array} P \begin{array}{c} O \\ OH \end{array}$$

| | R$^1$ | R$^2$ |
|---|---|---|
| A-6 | H | —CH$_3$ |
| A-7 | —CH$_3$ | —CH$_3$ |
| A-8 | H | —CH$_2$CH$_3$ |
| A-9 | —CH$_2$CH$_3$ | —CH$_2$CH$_3$ |
| A-10 | H | —CH(CH$_3$)$_2$ |
| A-11 | —CH(CH$_3$)$_2$ | —CH(CH$_3$)$_2$ |
| A-12 | H | —CH$_2$(CH$_2$)$_2$CH$_3$ |
| A-13 | —CH$_2$(CH$_2$)$_2$CH$_3$ | —CH$_2$(CH$_2$)$_2$CH$_3$ |
| A-14 | H | —CH$_2$CH$_2$OCH$_2$(CH$_2$)$_2$CH$_3$ |
| A-15 | —CH$_2$CH$_2$OCH$_2$(CH$_2$)$_2$CH$_3$ | —CH$_2$CH$_2$OCH$_2$(CH$_2$)$_2$CH$_3$ |
| A-16 | H | 2-ethylhexyl group* |
| A-17 | 2-ethylhexyl group* | 2-ethylhexyl group* |
| A-18 | H | —CH$_2$(CH$_2$)$_8$CH$_3$ |
| A-19 | —CH$_2$(CH$_2$)$_8$CH$_3$ | —CH$_2$(CH$_2$)$_8$CH$_3$ |
| A-20 | H | —CH$_2$(CH$_2$)$_6$CH(CH$_3$)$_2$ |

"*" in the Table represents a binding site to an oxygen molecule.

TABLE 2

$$\begin{array}{c} R^1O \\ R^2O \end{array} P \begin{array}{c} O \\ OH \end{array}$$

| | R$^1$ | R$^2$ |
|---|---|---|
| A-21 | —CH$_2$(CH$_2$)$_6$CH(CH$_3$)$_2$ | —CH$_2$(CH$_2$)$_6$CH(CH$_3$)$_2$ |
| A-22 | H | oleyl group* |
| A-23 | oleyl group* | oleyl group* |
| A-24 | H | —CH$_2$(CH$_2$)$_{14}$CH(CH$_3$)$_2$ |
| A-25 | —CH$_2$(CH$_2$)$_{14}$CH(CH$_3$)$_2$ | —CH$_2$(CH$_2$)$_{14}$CH(CH$_3$)$_2$ |
| A-26 | H | —C$_6$H$_5$ |
| A-27 | —C$_6$H$_5$ | —C$_6$H$_5$ |
| A-28 | H | —CH$_2$CH$_2$OCH$_3$ |
| A-29 | —CH$_2$CH$_2$CH$_3$ | —CH$_2$CH$_2$OCH$_3$ |
| A-30 | H | —CH$_2$CH$_2$OCH$_2$CH$_3$ |
| A-31 | —CH$_2$CH$_2$OCH$_2$CH$_3$ | —CH$_2$CH$_2$OCH$_2$CH$_3$ |
| A-32 | H | —(C$_2$H$_4$O)$_2$C$_2$H$_5$ |
| A-33 | —(C$_2$H$_4$O)$_2$C$_2$H$_5$ | —(C$_2$H$_4$O)$_2$C$_2$H$_5$ |
| A-34 | H | —(C$_2$H$_4$O)$_2$C$_4$H$_9$ |
| A-35 | —(C$_2$H$_4$O)$_2$C$_4$H$_9$ | —(C$_2$H$_4$O)$_2$C$_4$H$_9$ |
| A-36 | H | —C$_2$H$_4$OCH$_2$CHCH$_3$)$_2$ |
| A-37 | —C$_2$H$_4$OCH$_2$CHCH$_3$)$_2$ | —C$_2$H$_4$OCH$_2$CHCH$_3$)$_2$ |
| A-38 | H | —(C$_2$H$_4$O)$_2$CH$_2$CHCH$_3$)$_2$ |
| A-39 | —(C$_2$H$_4$O)$_2$CH$_2$CHCH$_3$)$_2$ | —(C$_2$H$_4$O)$_2$CH$_2$CHCH$_3$)$_2$ |
| A-40 | H | —CH(CH$_3$)CH$_2$OCH$_3$ |

"*" in the Table represents a binding site to an oxygen molecule.

TABLE 3

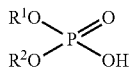

| | R¹ | R² |
|---|---|---|
| A-41 | H | —CH(CH₃)CH₂CH₃ |
| A-42 | —CH(CH₃)CH₂CH₃ | —CH(CH₃)CH₂CH₃ |
| A-43 | H | —(CH(CH₃)CH₂O)₂CH₃ |
| A-44 | —(CH(CH₃)CH₂O)₂CH₃ | —(CH(CH₃)CH₂O)₂CH₃ |
| A-45 | H | —(CH(CH₃)CH₂O)₃CH₃ |
| A-46 | —(CH(CH₃)CH₂O)₃CH₃ | —(CH(CH₃)CH₂O)₃CH₃ |
| A-47 | H | —CH₂CH(CH₃)OCH₃ |
| A-48 | —CH₂CH(CH₃)OCH₃ | —CH₂CH(CH₃)OCH₃ |
| A-49 | H | —(CH₂CH(CH₃)O)₂CH₃ |
| A-50 | —(CH₂CH(CH₃)O)₂CH₃ | —(CH₂CH(CH₃)O)₂CH₃ |

TABLE 3-continued

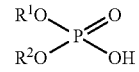

| | R¹ | R² |
|---|---|---|
| A-51 | H | —(CH₂CH(CH₃)O)₃CH₃ |
| A-52 | —(CH₂CH(CH₃)O)₃CH₃ | —(CH₂CH(CH₃)O)₃CH₃ |
| A-53 | H | —CH(CH₃)CH₂OC(=O)CH₃ |
| A-54 | —CH(CH₃)CH₂OC(=O)CH₃ | —CH(CH₃)CH₂OC(=O)CH₃ |
| A-55 | H | —CH₂CH(CH₃)OC(=O)CH₃ |
| A-56 | —CH₂CH(CH₃)OC(=O)CH₃ | —CH₂CH(CH₃)OC(=O)CH₃ |
| A-57 | —CH₂CH(CH₃)OC(=O)CH₃ | —CH(CH₃)CH₂OC(=O)CH₃ |
| A-58 | H | —CH(CH₃)CH₂OC(=O)CH₂CH₃ |
| A-59 | —CH(CH₃)CH₂OC(=O)CH₂CH₃ | —CH(CH₃)CH₂OC(=O)CH₂CH₃ |
| A-60 | H | —CH(CH₃)CH₂OC(=O)CH₂CH₃ |

TABLE 4

$$\begin{array}{c} R^1O \\ R^2O \end{array} P \begin{array}{c} O \\ OH \end{array}$$

| | R¹ | R² |
|---|---|---|
| A-61 | —CH₂CH(CH₃)OC((=O))CH₂CH₃ | —CH₂CH(CH₃)OC((=O))CH₂CH₃ |
| A-62 | —CH₂CH(CH₃)OC((=O))CH₂CH₃ | —CH(CH₃)CH₂OC(=O)CH₂CH₃ |
| A-63 | H | —CH(CH₂CH₃)CH₂OC(=O)CH₃ |
| A-64 | —CH(CH₂CH₃)CH₂OC(=O)CH₃ | —CH(CH₂CH₃)CH₂OC(=O)CH₃ |
| A-65 | H | —CH₂CH(CH₂CH₃)OC(=O)CH₃ |
| A-66 | —CH₂CH(CH₂CH₃)OC(=O)CH₃ | —CH₂CH(CH₂CH₃)OC(=O)CH₃ |
| A-67 | —CH(CH₂CH₃)CH₂OC(=O)CH₃ | —CH₂CH(CH₂CH₃)OC(=O)CH₃ |
| A-68 | H | —CH(CH₂CH₃)CH₂OC(=O)CH₂CH₃ |
| A-69 | —CH(CH₂CH₃)CH₂OC(=O)CH₂CH₃ | —CH(CH₂CH₃)CH₂OC(=O)CH₂CH₃ |
| A-70 | H | —CH₂CH(CH₂CH₃)OC(=O)CH₂CH₃ |
| A-71 | —CH₂CH(CH₂CH₃)OC(=O)CH₂CH₃ | —CH₂CH(CH₂CH₃)OC(=O)CH₂CH₃ |
| A-72 | —CH(CH₂CH₃)CH₂OC(=O)CH₂CH₃ | —CH₂CH(CH₂CH₃)OC(=O)CH₂CH₃ |
| A-73 | H | —CH(CH₃)CH₂OC(=O)CH(CH₃)₂ |
| A-74 | —CH(CH₃)CH₂OC(=O)CH(CH₃)₂ | —CH(CH₃)CH₂OC(=O)CH(CH₃)₂ |
| A-75 | H | —CH₂CH(CH₃)OC(=O)CH(CH₃)₂ |
| A-76 | —CH₂CH(CH₃)OC(=O)CH(CH₃)₂ | —CH₂CH(CH₃)OC(=O)CH(CH₃)₂ |
| A-77 | —CH₂CH(CH₃)OC(=O)CH(CH₃)₂ | —CH(CH₃)CH₂OC(=O)CH(CH₃)₂ |
| A-78 | H | —CH(CH₂CH₃)CH₂OC(=O)CH(CH₃)₂ |
| A-79 | —CH(CH₂CH₃)CH₂OC(=O)CH(CH₃)₂ | —CH(CH₂CH₃)CH₂OC(=O)CH(CH₃)₂ |
| A-80 | H | —CH₂CH(CH₂CH₃)OC(=O)CH(CH₃)₂ |

TABLE 5

$$\begin{array}{c} R^1O \\ R^2O \end{array} P \begin{array}{c} O \\ OH \end{array}$$

| | R¹ | R² |
|---|---|---|
| A-81 | —CH₂CH(CH₂CH₃)OC(=O)CH(CH₃)₂ | —CH₂CH(CH₂CH₃)OC(=O)CH(CH₃)₂ |
| A-82 | —CH₂CH(CH₂CH₃)OC(=O)CH(CH₃)₂ | —CH(CH₂CH₃)CH₂OC(=O)CH(CH₃)₂ |
| A-83 | —(CH(CH₂CH₃)CH₂O)₂C(=O)CH₃ | H |
| A-84 | —(CH(CH₂CH₃)CH₂O)₂C(=O)CH₃ | —(CH(CH₂CH₃)CH₂O)₂C(=O)CH₃ |
| A-85 | H | —CH(CH₃)CH₂C(=O)OCH₃ |
| A-86 | —CH(CH₃)CH₂C(=O)OCH₃ | —CH(CH₃)CH₂C(=O)OCH₃ |
| A-87 | H | —CH(CH₃)CH₂C(=O)OCH₂CH₃ |
| A-88 | —CH(CH₃)CH₂C(=O)OCH₂CH₃ | —CH(CH₃)CH₂C(=O)OCH₂CH₃ |
| A-89 | H | —CH₂CH(CH₃)C(=O)OCH₃ |
| A-90 | —CH₂CH(CH₃)C(=O)OCH₃ | —CH₂CH(CH₃)C(=O)OCH₃ |
| A-91 | H | —CH₂C(CH₃)₂C(=O)OCH₃ |
| A-92 | —CH₂C(CH₃)₂C(=O)OCH₃ | —CH₂C(CH₃)₂C(=O)OCH₃ |
| A-93 | —CH₂CH(C₂H₅)CH₂CH₂CH₂CH₃ | —CH₂CH(C₂H₅)CH₂CH₂CH₂CH₃ |
| A-94 | H | —CH(CH₃)CH₂OC₆H₅ |
| A-95 | H | —CH₂CH(CH₃)OC₆H₅ |
| A-96 | —CH₂CH(CH₃)OC₆H₅ | —CH₂CH(CH₃)OC₆H₅ |

TABLE 5-continued $$R^1O-\underset{\underset{OH}{R^2O}}{\overset{O}{P}}=O$$

| | R¹ | R² |
|---|---|---|
| A-97 | —CH(CH₃)CH₂OC₆H₅ | —CH₂CH(CH₃)OC₆H₅ |
| A-98 | —CH(CH₃)CH₂OC₆H₅ | —CH(CH₃)CH₂OC₆H₅ |
| A-99 | H | —CH(CH₂OCH₃)CH₂OC₆H₅ |
| A-100 | —CH(CH₂OCH₃)CH₂OC₆H₅ | —CH(CH₂OCH₃)CH₂OC₆H₅ |

TABLE 6

$$R^1O-\underset{\underset{OH}{R^2O}}{\overset{O}{P}}=O$$

| | R¹ | R² |
|---|---|---|
| A-101 | H | —CH₂CH₂CH(CH₃)OCH₃ |
| A-102 | —CH₂CH₂CH(CH₃)OCH₃ | —CH₂CH₂CH(CH₃)OCH₃ |
| A-103 | H | ![structure] |
| A-103 | H | ![structure] |
| A-104 | ![structure] | ![structure] |
| A-105 | ![structure] | ![structure] |
| A-106 | ![structure] | ![structure] |
| A-107 | Phenyl group | Phenyl group |

TABLE 7

$$R^1-\underset{\underset{O}{\|}}{C}-OH$$

| | R¹ | R² |
|---|---|---|
| A-113 | —CH₃ | — |
| A-114 | —C₆H₅ | — |
| A-115 | 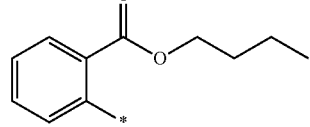 | — |
| A-116 | 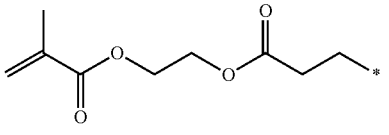 [SMILES: *CCC(=O)OCCOC(=O)C(=C)C] | — |
| A-117 | CH₂=CH(Me)— | — |
| A-118 | H | — |
| A-119 | -n-C₁₇H₃₅ | — |

TABLE 7-continued

| | R¹ | R² |
|---|---|---|
| A-120 | (cyclopentane with two methyl groups)—CH(CH₂)ₙ* | — |
| A-121 | ethyl acetoacetate enol form (*O-C=CH-C(=O)-) | — |
| A-122 | HOOC-C(CH₂*)(COOH)-CH₂-... (citric acid-like) | — |

"*" in the Table represents a binding site to a COOH group.

Furthermore, with respect to the phosphorous-containing compound which forms the ligand, specifically the compounds described in line 27 on p. 5 to line 20 on p. 7 of WO 2005/030898, and the compounds described in paragraphs 0027 to 0056 of JP 2002-69305 A can be referenced, and the contents of the documents are incorporated in the specification of the present application.

The compounds which form the ligand can be synthesized with reference to known methods. For example, for the following phosphoric acid ester, triethylamine is added to a solution of 2,4-dimethylpentanol in tetrahydrofuran (THF), followed by stirring at 0° C. for 5 minutes, and then phosphorous oxychloride is added dropwise thereto, followed by stirring at room temperature for 6 hours, thereby completing the reaction. After the completion of the reaction, the reaction liquid is decanted with water such that the temperature does not rise to 30° C. or higher, liquid separation is carried out with chloroform/water, and a solvent of an organic layer is distilled away from the organic layer to obtain the following phosphoric acid ester.

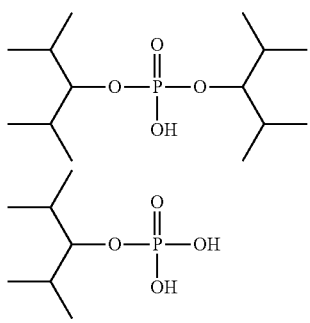

In the synthesis of the phosphoric acid ester-copper compound, a commercially available phosphonic acid, for example, such as Phosmer M, Phosmer PE, and Phosmer PP (all manufactured by Uni-Chemical Co., Ltd.) may also be used.

As the copper salt used herein, divalent or trivalent copper is preferred, and divalent copper is more preferred. As the copper salt, copper acetate, copper chloride, copper formate, copper stearate, copper benzoate, copper ethyl acetoacetate, copper pyrophosphate, copper naphthenate, copper citrate, copper nitrate, copper sulfate, copper carbonate, copper chlorate, and copper (meth)acrylate are more preferred, and copper benzoate and copper (meth)acrylate are still more preferred. These copper salts can also be used as a copper compound of a near infrared ray absorbing material.

As specific examples of a copper complex used in the present invention, copper complexes in which copper is divalent copper and any two of the aforementioned A-1 to A-122 are coordinated as a ligand are preferably used. Needless to say, the present invention is not limited thereto.

The composition of the present invention may contain a pigment having a maximum absorption wavelength in the wavelength range of 700 nm to 1000 nm.

The pigment is not particularly limited as long as it has a maximum absorption wavelength ($\lambda_{max}$) in the wavelength range of 700 nm to 1000 nm, and suitable examples thereof include a cyanine pigment, a phthalocyanine pigment, a quaterrylene pigment, an aminium pigment, an iminium pigment, an azo pigment, an anthraquinone pigment, a diimonium pigment, a squalirium pigment, and a porphyrin pigment. Among these, preferable examples thereof include a cyanine pigment, a phthalocyanine pigment, and a quaterrylene pigment, and more preferable examples thereof include a phthalocyanine pigment.

If the maximum absorption wavelength is less than 700 nm or the maximum absorption wavelength is more than 1000 nm, the shielding property with respect to the near infrared rays at wavelengths around 700 nm is low, and thus satisfactory results cannot be obtained.

Specific examples of the cyanine-based dye and the quaterrylene-based pigment include the compounds described in paragraph 0160 of JP 2012-215806 A, paragraph 0021 of JP 2008-009206 A, and the like, the contents of which are incorporated in the specification of the present application.

Specific examples of the phthalocyanine compound include the compounds described in JP 2000-26748 A, JP 2000-63691 A, claims and paragraph 0111 of JP 2001-106689 A, claims and paragraphs 0063 to 0071 of JP 2004-18561 A, claims and paragraphs 0045 to 0062 of JP 2005-220060 A, and claims of JP 2007-169343 A, and the phthalocyanine compounds described in these publications can be synthesized by the methods described therein.

Specific examples of the azo pigment, the anthraquinone pigment (anthraquinone compound), and the squalirium-based pigment (squalirium compound) include the compounds described in paragraphs 0114 to 0117, 0128, 0129, 0177, and the like of JP 2012-215806 A.

The above pigments can be available as commercially available products, and for instance, examples of the cyanine pigment include Daito Chemix 1371F (manufactured by Daito Chemix Corporation), examples of the quaterrylene pigment include Lumogen IR 765 (manufactured by BASF Japan, Ltd.), and examples of the phthalocyanine pigment include Excolor series, Excolor TX-EX 720, and Excolor TX-EX 708K (all manufactured by NIPPON SHOKUBAI Co., Ltd.). Other examples of the pigment include Lumogen IR 788 (manufactured by BASF Japan, Ltd.); ABS643, ABS654, ABS667, ABS670T, IRA693N, and IRA735 (all manufactured by Exciton Inc.); SDA3598, SDA6075, SDA8030, SDA8303, SDA8470, SDA3039, SDA3040, SDA3922, and SDA7257 (all manufactured by H. W.

SANDS); and TAP-15 and IR-706 (both manufactured by YAMADA Chemical Co., Ltd.), but the commercially available pigments are not limited to these.

The pigment is preferably in a state of fine particles. The average particle diameter of the fine particles of the pigment is preferably 800 nm or less, more preferably 400 nm or less, and still more preferably 200 nm or less. By setting the average particle diameter to such a range, it becomes difficult for the pigment particles to shield the visible light due to light scattering, and therefore, the light transmissivity in the visible light region can be more ensured. From the viewpoint of avoiding light scattering, a smaller average particle diameter is more preferred, but for the reasons of easiness of handling during the production and the like, the average particle diameter of the pigment is usually 1 nm or more.

In the first aspect of the present invention, the content of the copper compound is preferably from 20% by mass to 90% by mass, more preferably from 30% by mass to 90% by mass, still more preferably from 35% by mass to 80% by mass, particularly preferably from 40% by mass to 80% by mass, and most preferably from 50% by mass to 80% by mass, with respect to the mass of the total solid content of the composition containing the copper compound in the first aspect.

In the first aspect of the present invention, the content of the pigment is preferably from 1% by mass to 20% by mass, more preferably from 3% by mass to 20% by mass, and still more preferably from 3% by mass to 10% by mass, with respect to the mass of the total solid content of the composition containing the pigment in the first aspect.

In the composition of the second aspect which contains both of the copper compound and the metal oxide, the content of the copper compound is preferably from 20% by mass to 90% by mass, more preferably from 30% by mass to 90% by mass, still more preferably from 35% by mass to 80% by mass, particularly preferably from 40% by mass to 80% by mass, and most preferably from 50% by mass to 80% by mass, with respect to the mass of the total solid content of the composition.

On the other hand, in the composition of the second aspect which contains both of the pigment and the metal oxide, the content of pigment is preferably from 1% by mass to 20% by mass, more preferably from 3% by mass to 20% by mass, and still more preferably from 3% by mass to 10% by mass, with respect to the total mass of the solid content of the composition.

In particular, in the case of using the copper compound, the copper compound can be contained at a high content, and thus, the use of the copper compound is advantageous in that a copper compound-containing film can be made thinner.

The copper compound or the pigment may be used alone or in combination of two or more kinds thereof, and in the case where two or more kinds of the copper compounds or the pigments are used, the total amount thereof falls within the above ranges.

Herein, the above solid content does not contain a solvent, and the solid content means a film forming material.

[2] Metal Oxide Having Maximum Absorption Wavelength in Wavelength Range of 800 nm to 2000 nm The metal oxide used in the infrared ray absorbing composition of the present invention is not particularly limited as long as it has a maximum absorption wavelength in the wavelength range of 800 nm to 2000 nm ($\lambda_{max}$), and suitable examples thereof include a tungsten oxide-based compound (tungsten-containing oxide).

The tungsten oxide-based compound is an infrared ray shielding material, which has high absorbability with respect to infrared rays (in particular, light at a wavelength of about 800 nm to 1200 nm), that is, has high shielding property with respect to infrared rays, and has low absorbability with respect to visible light. Therefore, by containing the tungsten oxide-based compound in the composition of the present invention, it is possible to produce an infrared ray cut filter having high shielding property in an infrared region (infrared ray shielding property) and high light transmissivity in a visible light region (visible light transmissivity).

As the tungsten oxide-based compound, a tungsten oxide-based compound represented by the following General formula (compositional formula) (I) is more preferred.

$$M_xW_yO_z \qquad \text{General formula (I)}$$

(in General formula (I), M represents a metal, W represents tungsten, O represents oxygen, and x, y, and z satisfies $0.001 \leq x/y \leq 1.1$ and $2.2 \leq z/y \leq 3.0$).

Examples of the metal of M include alkali metals, alkaline earth metals, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi. The metal of M may be one kind or a combination of two or more kinds thereof.

M is preferably an alkali metal, more preferably Rb or Cs, and still more preferably Cs.

That is, the metal oxide is still more preferably cesium tungsten oxide.

By setting x/y to 0.001 or more, it is possible to sufficiently shield infrared rays, whereas by setting x/y to 1.1 or less, it is possible to more reliably prevent an impurity phase from being produced in the tungsten oxide-based compound.

By setting z/y to 2.2 or more, it is possible to further improve the chemical stability for the material, whereas by setting z/y to 3.0 or less, it is possible to sufficiently shield infrared rays.

Specific examples of the tungsten oxide-based compound represented by General Formula (I) include $Cs_{0.33}WO_3$, $Rb_{0.33}WO_3$, $K_{0.33}WO_3$, $Ba_{0.33}WO_3$, and the like. Among these, $Cs_{0.33}WO_3$ and $Rb_{0.33}WO_3$ are preferable, and $Cs_{0.33}WO_3$ is more preferable.

The metal oxide is preferably in a state of fine particles. The average particle diameter of the fine particles of the metal oxide is preferably 800 nm or less, more preferably 400 nm or less, and still more preferably 200 nm or less. By setting the average particle diameter to such a range, it becomes difficult for the metal oxide particles to shield visible light due to light scattering, and therefore, the light transmissivity in the visible light region can be more ensured. From the viewpoint of avoiding light scattering, a smaller average particle diameter is more preferred, but for the reasons of easiness of handling during production and the like, the average particle diameter of the metal oxide is usually 1 nm or more.

The content of the metal oxide is preferably from 1% by mass to 50% by mass, more preferably from 3% by mass to 40% by mass, and still more preferably from 5% by mass to 30% by mass, with respect to the mass of the total solid content of the composition containing the metal oxide in the first aspect.

In the composition of the second aspect which contains both of the copper compound and the metal oxide, the content of the metal oxide is preferably from 0.001% by mass to 5% by mass, more preferably from 0.01% by mass to 3% by mass, and still more preferably from 0.1% by mass to 3% by mass, with respect to the mass of the total solid content of the composition.

On the other hand, in the composition of the second aspect which contains both of the pigment and the metal oxide, the content of the metal oxide is preferably from 20% by mass to 85% by mass, more preferably from 30% by mass to 80% by mass, and still more preferably from 40% by mass to 75% by mass, with respect to the mass of the total solid content of the composition.

Two or more kinds of metal oxides such as tungsten oxide-based compounds can be used.

The metal oxide is available as a commercially available product, but, for example, in the case where the metal oxide is a tungsten oxide-based compound, the tungsten oxide-based compound can be obtained by a method in which a tungsten compound is subjected to a heat treatment in an inert gas atmosphere or in a reductive gas atmosphere (see JP 4096205 B).

In addition, the tungsten oxide-based compound is also available as a dispersion of fine particles of tungsten such as YMF-02 manufactured by Sumitomo Metal Mining Co., Ltd, for example.

From the viewpoint of more reliably expressing the effects of the present invention, the mass ratio of the metal oxide to the copper compound ([the content of the metal oxide]/[the content of the copper compound]) is preferably from 0.0001 to 0.5, more preferably from 0.001 to 0.5, and still more preferably from 0.001 to 0.1.

In the composition of the second aspect which contains both of the pigment and the metal oxide, the mass ratio of the metal oxide to the pigment ([the content of the metal oxide]/[the content of the pigment]) is preferably from 5 to 50, and more preferably from 10 to 40, from the viewpoint of more reliably expressing the effects of the present invention.

[3] Polymerizable Compound

The infrared ray absorbing composition or the infrared ray absorbing composition kit of the present invention (the composition containing a copper compound or pigment in the first aspect, the composition containing a metal oxide in the first aspect, or the composition containing both of a copper compound or pigment, and a metal oxide in the second aspect; the same shall apply hereinafter) can be suitably configured by containing at least one of polymerizable compounds.

It is preferable to use a "compound having two or more epoxy groups or oxetanyl groups in a molecule" as the polymerizable compound.

—Compound Having Two or More Epoxy Groups (Oxiranyl Groups) or Oxetanyl Groups in a Molecule—

Specific examples of the compound having two or more epoxy groups in a molecule as the polymerizable compound include a bisphenol A type epoxy resin, a bisphenol F type epoxy resin, a phenol novolak type epoxy resin, a cresol novolak type epoxy resin, an aliphatic epoxy resin, and the like.

These compounds are available as a commercially available product. Examples of the bisphenol A type epoxy resin include JER-827, JER-828, JER-834, JER-1001, JER-1002, JER-1003, JER-1055, JER-1007, JER-1009, and JER-1010 (all manufactured by Mitsubishi Chemical Corporation); EPICLON 860, EPICLON 1050, EPICLON 1051, and EPICLON 1055 (all manufactured by DIC Corporation); and the like. Examples of the bisphenol F type epoxy resin include JER-806, JER-807, JER-4004, JER-4005, JER-4007, and JER-4010 (all manufactured by Mitsubishi Chemical Corporation); EPICLON 830 and EPICLON 835 (both manufactured by DIC Corporation); LCE-21 and RE-602S (both manufactured by Nippon Kayaku Co., Ltd.); and the like.

Examples of the phenol novolak type epoxy resin include JER-152, JER-154, JER-157S70, and JER-157S65 (all manufactured by Mitsubishi Chemical Corporation); EPICLON N-740, EPICLON N-770, and EPICLON N-775 (all manufactured by DIC Corporation); and the like. Examples of the cresol novolak type epoxy resin include EPICLON N-660, EPICLON N-665, EPICLON N-670, EPICLON N-673, EPICLON N-680, EPICLON N-690, and EPICLON N-695 (all manufactured by DIC Corporation); EOCN-1020 (manufactured by Nippon Kayaku Co., Ltd.); and the like. Examples of the aliphatic epoxy resin include ADEKA RESIN EP-4080S, ADEKA RESIN EP-4085S, and ADEKA RESIN EP-40885 (all manufactured by Adeka Corporation); CELLOXIDE 2021P, CELLOXIDE 2081, CELLOXIDE 2083, CELLOXIDE 2085, EHPE-3150, EPOLEAD PB 3600, and EPOLEAD PB 4700 (all manufactured by Daicel Corporation); DENACOL EX-211L, EX-212L, EX-214L, EX-216L, EX-321L, and EX-850L (all manufactured by Nagase ChemteX Corporation); and the like. Other examples include ADEKA RESIN EP-40005, ADEKA RESIN EP-40035, ADEKA RESIN EP-40105, and ADEKA RESIN EP-40115 (all manufactured by Adeka Corporation); NC-2000, NC-3000, NC-7300, XD-1000, EPPN-501, and EPPN-502 (all manufactured by Adeka Corporation); JER-10315 (manufactured by Mitsubishi Chemical Corporation); and the like.

These may be used alone or in combination of two or more kinds thereof.

As specific examples of the compound having two or more oxetanyl groups in a molecule, ARON OXETANE OXT-121, OXT-221, OX-SQ, and PNOX (all manufactured by Toagosei Co., Ltd.) can be used.

Incidentally, it is preferable for the oxetanyl group-containing compounds to be used alone or as a mixture with an epoxy group-containing compound.

Specifically, the above polymerizable compound is selected from compounds having at least one terminal ethylenically unsaturated bond, and preferably at least two terminal ethylenically unsaturated bonds. The polymerizable compound in the present invention may be used alone or in combination of two or more kinds thereof. In particular, either of the aforementioned compound having two or more epoxy groups or oxetanyl groups in a molecule and the aforementioned compound having at least one terminal ethylenically unsaturated bond, and preferably at least two terminal ethylenically unsaturated bonds may be used alone, or the compound having two or more epoxy groups or oxetanyl groups in a molecule and the compound having at least one terminal ethylenically unsaturated bond, and preferably at least two terminal ethylenically unsaturated bonds may be used at the same time.

With respect to the compound having at least one terminal ethylenically unsaturated bond, and preferably at least two terminal ethylenically unsaturated bonds, specific examples of the monomer and prepolymer thereof include unsaturated carboxylic acids (for example, acrylic acid, methacrylic acid, itaconic acid, crotonic acid, isocrotonic acid, and maleic acid), esters and amides thereof, and multimers thereof, and an ester of an unsaturated carboxylic acid and an aliphatic polyhydric alcohol compound, an amide of an unsaturated carboxylic acid and an aliphatic polyvalent amine compound, and multimers thereof are preferred.

Moreover, addition reaction products of unsaturated carboxylic acid esters or amides having a nucleophilic substituent such as a hydroxyl group, an amino group, and a mercapto group, with monofunctional or polyfunctional isocyanates or epoxies, dehydration condensation reaction products thereof with monofunctional or polyfunctional carboxylic acids, and the like are also suitably used. Further, addition reaction products of unsaturated carboxylic acid esters or amides having an electrophilic substituent such as an isocyanate group and an epoxy group, with monofunctional or polyfunctional alcohols, amines, or thiols, and substitution reaction products of unsaturated carboxylic acid esters or amides having a releasable substituent such as a halogen atom and a tosyloxy group, with monofunctional or polyfunctional alcohols, amines, or thiols are also suitable. In addition, as other examples, it is also possible to use a group of compounds such as unsaturated phosphonic acids, vinylbenzene derivatives such as styrene, vinyl ethers, aryl ethers, and the like, instead of the above unsaturated carboxylic acids.

As to specific examples of these compounds, the compounds described in paragraphs 0095 to 0108 of JP 2009-288705 A can also be suitably used in the present invention.

Moreover, as the polymerizable compound, a compound having an ethylenically unsaturated group, which has at least one addition-polymerizable ethylene group as a polymerizable monomer and has a boiling point of 100° C. or higher under normal pressure, is also preferred. Examples thereof include monofunctional acrylates or methacrylates such as polyethylene glycol mono(meth)acrylate, polypropylene glycol mono(meth)acrylate, and phenoxyethyl (meth)acrylate; polyfunctional acrylates or methacrylates such as polyethylene glycol di(meth)acrylate, trimethylolethane tri (meth)acrylate, neopentyl glycol di(meth)acrylate, pentaerythritol tri(meth)acrylate, pentaerythritol tetra(meth) acrylate, dipentaerythritol penta(meth)acrylate, dipentaerythritol hexa(meth)acrylate, hexanediol (meth)acrylate, trimethylolpropane tri(acryloyloxypropyl)ether, tri(acyloyloxyethyl)isocyanurate, a compound obtained by adding ethylene oxide or propylene oxide to a polyfunctional alcohol such as glycerin and trimethylolethane, followed by (meth)acrylation, polyester acrylates described in JP 48-64183 A, columns 8 and 9 of JP 49-43191 B, columns 5 to 8 of JP 52-30490 B, and the like, and epoxy acrylates which are reaction products of epoxy resins and (meth) acrylic acids; and a mixture of these.

Other examples thereof include a polyfunctional (meth) acrylate obtained by reacting a polyfunctional carboxylic acid with a compound having a cyclic ether group and an ethylenically unsaturated group such as glycidyl (meth) acrylate.

In addition, as other preferred polymerizable compounds, compounds and cardo resins having a fluorene ring and two or more ethylenically polymerizable groups described in paragraphs 0043 to 0048 of JP 2010-160418 A, paragraph 0041 of JP 2010-129825 A, JP 4364216 B, and the like, can also be used.

Furthermore, as the compound having a boiling point of 100° C. or higher under normal pressure and having at least one addition-polymerizable ethylenically unsaturated group, the compounds described in Paragraphs 0254 to 0257 of JP 2008-292970 A are also suitable.

In addition, the radical polymerizable monomers represented by General Formulae (MO-1) to (MO-5) described in paragraphs 0297 to 0300 of JP 2012-215806 A can also be suitably used.

As the specific examples of the radical polymerizable monomers represented by General Formulae (MO-1) to (MO-5) described above, the compounds described in Paragraphs 0248 to 0251 of JP 2007-269779 A can also be suitably used in the present invention.

Moreover, the compounds, which are obtained by adding ethylene oxide or propylene oxide to polyfunctional alcohol, and then (meth)acrylating the resulting adduct, described as General Formulae (1) and (2) together with their specific examples in JP 10-62986 A, can also be used as the polymerizable compound.

Among them, the polymerizable compound is preferably MX-RD-F8 (manufactured by Nippon Shokubai Co., Ltd.), pentaerythritol tetraacrylate (manufactured by Shin Nakamura Chemical Co., Ltd., A-TMMT), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritolhexa(meth)acrylate (KAYARAD DPHA as a commercially available product; manufactured by Nippon Kayaku Co., Ltd.), or a structure in which the (meth)acryloyl group of the above compounds is connected through an ethylene glycol or propylene glycol residue. Oligomer types of these compounds can also be used.

The polymerizable compound may be a polyfunctional monomer having an acid group such as a carboxyl group, a sulfonic acid group, and a phosphoric acid group. Accordingly, as in the case of the mixture as above, if an ethylenic compound has an unreacted carboxyl group, the ethylenic compound may be used as it is. If necessary, an acid group may be introduced by causing a non-aromatic carboxylic anhydride to react with a hydroxyl group of the ethylenic compound. In this case, specific examples of the non-aromatic carboxylic anhydride to be used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, the monomer having an acid group is an ester of an aliphatic polyhydroxy compound and an unsaturated carboxylic acid, preferably a polyfunctional monomer which is obtained by reacting a non-aromatic carboxylic anhydride with an unreacted hydroxyl group of the aliphatic polyhydroxy compound to introduce an acid group, and particularly preferably the above-described polyfunctional monomer in which the aliphatic polyhydroxy compound is pentaerythritol and/or dipentaerythritol. Examples of a commercially available product thereof include M-305, M-510, and M-520 of ARONICS series which are polybasic acid-modified acryl oligomers (all manufactured by Toagosei Co., Ltd.).

The monomers may be used alone, but since it is difficult to use a single compound in view of production, two or more monomers may be used as a mixture. Further, if necessary, a combination of a polyfunctional monomer having no acid group and a polyfunctional monomer having an acid group may be used as the monomer. The acid value of the polyfunctional monomer having an acid group is preferably from 0.1 mg-KOH/g to 40 mg-KOH/g, and particularly preferably from 5 mg-KOH/g to 30 mg-KOH/g. In the case where two or more polyfunctional monomers having different acid groups are used in combination, or in the case where one or more polyfunctional monomers having no acid group are used together with one or more polyfunctional monomers having an acid group, it is preferable to adjust the monomers such that an overall acid value falls within the range described above.

Furthermore, as the polymerizable monomer, the polyfunctional monomer having a caprolactone structure described in paragraphs 0306 to 0313 of JP 2012-215806 A can also be used.

Such polyfunctional monomers having a caprolactone structure are commercially available from, for example, Nippon Kayaku Co., Ltd. as KAYARAD DPCA Series, and examples thereof include DPCA-20, DPCA-30, DPCA-60, and DPCA-120.

In the present invention, the polyfunctional monomers having a caprolactone structure may be used alone or may be used as a mixture of two or more kinds thereof.

Furthermore, as the polymerizable compound in the present invention, the compound represented by General Formula (Z-4) or (Z-5) described in paragraphs 0314 to 0324 of JP 2012-215806 A can also be used.

Examples of a commercial product of the polymerizable compound represented by General Formula (Z-4) or (Z-5) include SR-494 which is a tetrafunctional acrylate having four ethyleneoxy chains (manufactured by Sartomer Corp.), and DPCA-60 which is a hexafunctional acrylate having six pentyleneoxy chains and TPA-330 which is a trifunctional acrylate having three isobutyleneoxy chains (both manufactured by Nippon Kayaku Co., Ltd).

In addition, the urethane acrylates which are described in JP 48-41708 B, the respective Examples described in columns 13 to 25 of JP 50-6034 B, Examples described on pp. 6 to 10 of JP 51-37193 A, Example 1 described on pp. 6 and 7 of JP 2-32293 B, and columns 5 and 6 of JP 2-16765 B, and the urethane compounds having an ethylene oxide skeleton which are described in JP 58-49860 B, JP 56-17654 B, JP 62-39417 B, Examples described on pp. 8 to 11 of JP 62-39418 B, and the like are also suitable as the polymerizable compound. Further, by using the addition-polymerizable compounds having an amino structure or a sulfide structure in a molecule, which are described in Table 1 on pp. 8 and 9 of JP 63-277653 A, Table 1 on p. 10 of JP 63-260909 A, and Table 1 on p. 10 of JP 1-105238 A, as the polymerizable compound, it is possible to obtain a curable composition extremely excellent in sensitization speed.

Examples of a commercially available product of the polymerizable compound include urethane oligomers UAS-10 and UAB-140 (both manufactured by Sanyo Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (all manufactured by Kyoeisha Chemical Co., Ltd.).

As the polymerizable compound, the polyfunctional thiol compound having two or more mercapto (SH) groups in the same molecule, which is described in paragraphs 0216 to 0220 of JP 2012-150468 A, can also be used.

With respect to the polymerizable compound, details of the usage thereof such as the structure thereof, the individual use or combined use, the addition amount thereof, or the like can be appropriately determined in accordance with the final performance design of the infrared ray absorbing composition. For example, from the viewpoint of sensitivity, a structure having a high unsaturated group content per molecule is preferred, and in many cases, a bifunctional or higher functional structure is preferred. From the viewpoint of increasing the strength of the infrared ray cut filter, a trifunctional or higher functional compound is preferred, and further, usage of compounds having different numbers of functional groups and different polymerizable groups in combination (for example, an acrylic acid ester, a methacrylic acid ester, a styrene-based compound and a vinyl ether-based compound) so as to adjust both the sensitivity and the strength is also effective. In addition, the selection and usage of the polymerizable compound is also an important factor with respect to the compatibility and dispersibility with other components contained in the infrared ray absorbing composition (for example, a metal oxide, a pigment, a polymerization initiator, and a binder), and for example, the compatibility can be improved by using a compound of low purity or two or more kinds of compounds, in some cases. Further, a compound having a specific structure can be selected from the viewpoint of improving the adhesion to a hard surface such as a support, in some cases.

The content of the polymerizable compound in the composition containing a copper compound or pigment in the first aspect, the composition containing a metal oxide in the first aspect, or the composition containing both of a copper compound or pigment, and a metal oxide in the second aspect is preferably from 0.1% by mass to 90% by mass, more preferably from 1.0% by mass to 80% by mass, and particularly preferably from 2.0% by mass to 70% by mass, with respect to the mass of solid content of the composition containing a copper compound or pigment in the first aspect, the composition containing a metal oxide in the first aspect, or the composition containing both of a copper compound or pigment, and a metal oxide in the second aspect.

[4] Polymerization Initiator

The infrared ray absorbing composition or the infrared ray absorbing composition kit of the present invention may contain a polymerization initiator. The polymerization initiator is not particularly limited as long as it has an ability of initiating the polymerization of the polymerizable compound by either or both of light and heat. Although the polymerization initiator may be appropriately selected according to the purpose, it is preferably a photopolymerization initiator. In the case of initiating the polymerization by light, it is preferable for the initiator to have photosensitivity to light in the ultraviolet ray region to visible light.

In the case of initiating the polymerization by heat, it is preferable for the initiator to be decomposed at 150° C. to 250° C.

The polymerization initiator which can be used in the present invention is preferably a compound having at least an aromatic group, and examples thereof include an acylphosphine compound, an acetophenone-based compound, an α-aminoketone compound, a benzophenone-based compound, a benzoin ether-based compound, a ketal derivative compound, a thioxanthone compound, an oxime compound, a hexaarylbiimidazole compound, a trihalomethyl compound, an azo compound, an organic peroxide, a diazonium compound, an iodonium compound, a sulfonium compound, an azinium compound, a benzoin ether-based compound, an onium salt compound such as metallocene compound, an organic boron salt compound, a disulfone compound, and the like.

From the viewpoint of the sensitivity, an oxime compound, an acetophenone-based compound, an α-aminoketone compound, a trihalomethyl compound, a hexaarylbiimidazole compound, and a thiol compound are preferred.

Examples of the polymerization initiator suitable for the present invention are described below, but the present invention is not limited thereto.

Specific examples of the acetophenone-based compound include 2,2-diethoxyacetophenone, p-dimethylaminoacetophenone, 2-hydroxy-2-methyl-1-phenyl-propan-1-one, p-dimethylaminoacetophenone, 4'-isopropyl-2-hydroxy-2-methyl-propiophenone, 1-hydroxy-cyclohexyl-phenylketone, 2-benzyl-2-dimethylamino-1-(4-morpholinophenyl)-butanone-1,2-tolyl-2-dimethylamino-1-(4-morpholinophenyl)-butanone-1,2-methyl-1-[4-(methylthio)phenyl]-2-morpholinopropanone-1,2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, 2-methyl-1-(4-methylthiophenyl)-2-morpholinopropan-1-one, and the like.

Furthermore, the aminoacetophenone-based initiator described in paragraph 0004 of JP 10-291969 A and the acylphosphinoxide-based initiator described in paragraphs 0004 to 0026 of JP 4225898 B can also be used.

As the acetophenone-based initiator, IRGACURE-907, IRGACURE-369, and IRGACURE-379 (trade names: all manufactured by BASF Japan, Ltd.) which are commercially available products can be used.

In addition, as the acylphosphine-based initiator, IRGACURE-819 and DAROCUR-TPO (trade names: both manufactured by BASF Japan, Ltd.) which are commercially available products can be used.

The trihalomethyl compound is more suitably an s-triazine derivative in which at least one mono-, di-, or trihalogen-substituted methyl group is bonded to an s-triazine ring, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-nathoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like.

Examples of the hexaarylbiimidazole compound include various compounds described in the respective specifications of JP 6-29285 B, U.S. Pat. No. 3,479,185 B, U.S. Pat. No. 4,311,783 B, and U.S. Pat. No. 4,622,286 B, and specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole), 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and the like.

As the oxime compound, commercially available products such as TRONLY TR-PBG-304, TRONLY TR-PBG-309, and TRONLY TR-PBG-305 (all manufactured by Changzhou Tronly New Electronic Materials Co., Ltd.) can be used. Further, reference to the descriptions of polymerization initiator described in paragraphs 0092 to 0096 of JP 2012-113104 A can be made, and the contents of the descriptions are incorporated in the specification of the present application. By using such an oxime compound, a resin composition having high curing sensitivity and good developability can be provided. The above oxime compound is the compound described in paragraph 0030 and later paragraphs of JP 2012-113104 A. As for the general formula, the compound is represented by General Formula (I) described in claim 1 of JP 2012-113104 A and preferably represented by General Formula (I-A) described in claim 3 thereof. Reference to these descriptions can be made, and the contents of these descriptions are incorporated in the specification of the present application.

Furthermore, examples of the oxime compound include the compounds described in J. C. S. Perkin II (1979) 1653-1660, J. C. S. Perkin II (1979) 156-162, Journal of Photopolymer Science and Technology (1995) 202-232 and JP 2000-66385 A; the compounds described in paragraphs 0218 to 0281 of JP 2000-80068 A; the compounds described in paragraphs 0242 to 0251 of JP 2004-534797 A; IRGACURE OXE 01 (1,2-octanedione, 1-[4-(phenylthio)-2-(O-benzoyloxime)]) and IRGACURE OXE 02 (ethanone, 1-[9-ethyl-6-(2-methylbenzoyl)-9H-carbazol-3-yl]-1-(0-acetyloxime)) (both manufactured by BASF Japan, Ltd.); and 2-(acetyloxyimionomethyl)thioxanthen-9-one, and the contents of these are incorporated in the specification of the present application.

Other examples of the oxime compound include the cyclic oxime compounds described in paragraph 0031 of JP 2007-231000 A and paragraph 0039 of JP 2007-322744 A; the oxime compounds having a specific substituent described in paragraphs 0060 to 0062 of JP 2007-269779 A; the oxime compounds having a thioaryl group described in paragraphs 0090 to 0106 of JP 2009-191061 A; and the compounds described in paragraphs 0375 to 0409 of JP 2001-233842 A, and the contents of these descriptions are incorporated in the specification of the present application.

The polymerization initiator may be used alone or in combination of two or more kinds thereof.

In the present invention, the polymerization initiator may or may not be contained in the composition. In the case where it is contained, the composition containing a copper compound or pigment in the first aspect, the composition containing a metal oxide in the first aspect, or the composition containing both of a copper compound or pigment, and a metal oxide in the second aspect preferably has a content of the polymerization initiator of 0.01% by mass to 30% by mass, more preferably 0.1% by mass to 20% by mass, still more preferably 0.1% by mass to 15% by mass, even still more preferably 1% by mass to 10% by mass, and particularly preferably 1% by mass to 5% by mass, with respect to the mass of the total solid content of the composition.

[5] Binder

The infrared ray absorbing composition or the infrared ray absorbing composition kit of the present invention preferably contains a binder.

The binder is not particularly limited, but is preferably an alkali soluble resin.

The alkali soluble resin can be appropriately selected from alkali soluble resins which are a linear organic high molecular weight polymer and contain at least one group capable of promoting the alkali solubility in a molecule (preferably a molecule having an acryl-based copolymer or a styrene-based copolymer as the main chain). From the viewpoint of heat resistance, a polyhydroxystyrene-based resin, a polysiloxane-based resin, an acryl-based resin, an acrylamide-based resin, and an acryl/acrylamide copolymer resin are preferred, and from the viewpoint of control of developability, an acryl-based resin, an acrylamide-based resin, and an acryl/acrylamide copolymer resin are preferred.

Specific examples and preferable examples of the group (acid group) which promotes the alkali solubility in the alkali soluble resin and the monomer capable of providing an acid group after polymerization used in a method for producing the alkali soluble resin include the specific examples and preferable examples described in paragraphs 0558 and 0559 of JP 2012-208494 A, and specific examples of the method for producing the alkali soluble resin include the specific examples described in paragraph 0560 of the same document, and the contents of these descriptions are incorporated in the specification of the present application.

The linear organic high molecular weight polymer used as the alkali soluble resin is preferably a polymer having a carboxylic acid in the side chain, and examples thereof include a methacrylic acid copolymer, an acrylic acid copolymer, an itaconic acid copolymer, a crotonic acid copolymer, a maleic acid copolymer, a partially esterified maleic acid copolymer, an alkali soluble phenol resin such as a novolak resin, an acidic cellulose derivative having a carboxylic acid in the side chain, and the resultant obtained by adding an acid anhydride to a polymer having a hydroxyl group. In particular, a copolymer of a (meth)acrylic acid and another monomer copolymerizable therewith is suitable as the alkali soluble resin. Examples of the monomer copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, and the like. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, the N-substituted maleimide monomers described in JP 10-300922 A such as N-phenylmaleimide and N-cyclohexylmaleimide, and the like. The monomers copolymerizable with the (meth)acrylic acid may be used alone or in combination of two or more kinds thereof.

Examples of the alkali soluble phenol resin include a novolak resin and a vinyl polymer.

Specific examples of the novolak resin include meta-cresol, para-cresol, and condensation products of a mixture of these with formalin.

The molecular weight distribution of the novolak resin may be adjusted using a means such as fraction. Further, a low molecular weight component having a phenol-based hydroxyl group, such as bisphenol C and bisphenol A, may be mixed with the novolak resin.

Furthermore, an alkali soluble resin having a polymerizable group may be used in order to enhance the crosslinking efficiency of the infrared ray cut filter obtained from the infrared ray absorbing composition or the infrared ray absorbing composition kit of the present invention. As the alkali soluble resin having a polymerizable group, an alkali soluble resin containing an allyl group, a (meth)acryl group, an allyloxyalkyl group, or the like in the side chain are useful. Examples of the polymer containing a polymerizable group include DIANAL NR Series (manufactured by Mitsubishi Rayon Co., Ltd.), Photomer 6173 (COOH-containing polyurethane acrylic oligomer, manufactured by Diamond Shamrock Co., Ltd.), Viscoat R-264 and KS Resist-106 (both manufactured by Osaka Organic Chemical Industry Ltd.), CYCLOMER P Series such as CYCLOMER P ACA230AA and PLACCEL CF200 Series (both manufactured by Daicel Corporation), Ebecryl 3800 (manufactured by Daicel-UCB Company Ltd.), and the like. Preferred examples of the alkali soluble resin having a polymerizable group include a urethane-modified polymerizable double bond-containing acrylic resin obtained by reacting an isocyanate group with an OH group in advance while leaving one unreacted isocyanate group, and reacting a (meth) acryloyl group-containing compound with a carboxyl group-containing acrylic resin; an unsaturated group-containing acrylic resin obtained by reacting a carboxyl group-containing acrylic resin with a compound having both an epoxy group and a polymerizable double bond in a molecule; an acid pendant-type epoxy acrylate resin; a polymerizable double bond-containing acrylic resin obtained by reacting an OH group-containing acrylic resin and a dibasic acid anhydride having a polymerizable double bond; a resin obtained by reacting an OH group-containing acrylic resin with a compound having an isocyanate and a polymerizable group; the resin which is described in JP 2002-229207 A and JP 2003-335814 A, and obtained by applying a basic treatment to a resin having an ester group which is bonded to the side chain and has a leaving group such as halogen atom and a sulfonate group at the α- or β-position; and the like.

As the alkali soluble resin, in particular, a benzyl (meth) acrylate/(meth)acrylic acid copolymer and a multi-component copolymer composed of benzyl (meth)acrylate/(meth) acrylic acid/another monomer are suitable. Other examples of the alkali soluble resin include copolymers of 2-hydroxyethyl methacrylate; a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer and a 2-hydroxyethyl methacrylate/polystyrene macromonomer/benzyl methacrylate/methacrylic acid copolymer, which are described in JP 7-140654 A; and the like. Examples of a commercially available alkali soluble resin include ACRYLBASE FF-187 and FF-426 (both manufactured by Fujikura Kasei Co., Ltd.).

The acid value of the alkali soluble resin is preferably from 30 mgKOH/g to 200 mgKOH/g, more preferably from 50 mgKOH/g to 150 mgKOH/g, and most preferably from 70 mgKOH/g to 120 mgKOH/g.

The weight average molecular weight (Mw) of the alkali soluble resin is preferably from 2,000 to 50,000, more preferably from 5,000 to 40,000, and most preferably from 7,000 to 35,000.

The content of the binder in the composition containing a copper compound or pigment in the first aspect, the composition containing a metal oxide in the first aspect, or the composition containing both of a copper compound or pigment, and a metal oxide in the second aspect is preferably from 1% by mass to 20% by mass, more preferably from 2% by mass to 15% by mass, and particularly preferably from 3% by mass to 12% by mass, with respect to the mass of the total solid content of the composition.

[6] Dispersant

In the infrared ray absorbing composition or the infrared ray absorbing composition kit of the present invention, a known dispersant may be used for the purpose of improving the dispersibility and the dispersion stability of the metal oxide or the copper compound or pigment.

Examples of the dispersant which can be used in the present invention include a polymer dispersant [for example, a polyamidoamine and a salt thereof, a polycarboxylic acid and a salt thereof, a high molecular weight unsaturated acid ester, a modified polyurethane, a modified polyester, a modified poly(meth)acrylate, a (meth)acryl-based copolymer, and a naphthalenesulfonic acid-formalin condensate], and a surfactant such as polyoxyethylene alkyl phosphoric acid ester, a polyoxyethylene alkylamine, and an alkanolamine.

The polymer dispersant can be classified into a linear polymer, a terminal-modified polymer, a graft polymer, and a block polymer, on the basis of the structure thereof.

Examples of the terminal-modified polymer having an anchor moiety to a surface include the polymers having a phosphoric acid group at the terminal described in JP 3-112992 A, JP 2003-533455 A and the like, the polymers having a sulfonic acid group at the terminal described in JP 2002-273191 A and the like, the polymers having a partial skeleton of an organic dye or a heterocyclic ring described in JP 9-77994 A and the like, and the polymers manufactured by modifying an oligomer or polymer having a hydroxyl group or an amino group at one terminal, with an acid anhydride described in JP 2008-29901 A and the like. The polymers described in JP 2007-277514 A, in which two or more anchor moieties (an acid group, a basic group, a partial skeleton of an organic pigment, a heterocyclic ring, or the like) to the surface of an infrared ray shielding material are introduced into the polymer terminal, are excellent in dispersion stability, and thus they are preferable.

Examples of the graft polymer having an anchor moiety to a surface include the reaction products of a poly(lower alkyleneimine) and a polyester described in JP 54-37082 A, JP 8-507960 A, JP 2009-258668 A and the like, the reaction products of a polyallylamine and a polyester described in JP 9-169821 A and the like, the amphoteric dispersant resins having a basic group and an acidic group described in JP 2009-203462 A, the copolymers of a macromonomer and a nitrogen atom-containing monomer described in JP 10-339949 A, JP 2004-37986 A and the like, the graft polymers having a partial skeleton of an organic dye or a heterocyclic ring described in JP 2003-238837 A, JP 2008-9426 A, JP 2008-81732 A and the like, and the copolymers of a macromonomer and an acid group-containing monomer described in JP 2010-106268 A and the like.

As the macromonomer used in the production of the graft polymer having an anchor moiety to a surface by radical polymerization, a known macromonomer may be used, and examples thereof include MACROMONOMER AA-6 (a polymethyl methacrylate having a methacryloyl group as the terminal group), AS-6 (a polystyrene having a methacryloyl group as the terminal group), AN-6S (a copolymer of a styrene and an acrylonitrile having a methacryloyl group as the terminal group), and AB-6 (a polybutyl acrylate having a methacryloyl group as the terminal group) (all manufactured by Toagosei Ltd.); PLACCEL FM5 (a 5 molar equivalent adduct of 2-hydroxyethyl methacrylate with ε-caprolactone) and FA10L (a 10 molar equivalent adduct of 2-hydroxyethyl acrylate with ε-caprolactone) (both manufactured by Daicel Corporation); the polyester-based macromonomers described in JP 2-272009 A; and the like. Among these, the polyester-based macromonomers excellent in flexibility and affinity for a solvent are particularly preferred from the viewpoint of dispersibility and dispersion stability of the infrared ray shielding material in the composition, and polyester-based macromonomers represented by the polyester-based macromonomers described in JP 2-272009 A is most preferred.

As for the block polymer having an anchor moiety to a surface, the block polymers described in, for example, JP 2003-49110 A and JP 2009-52010 A are preferred.

The dispersant used in the present invention may be appropriately selected from, for example, known dispersants and surfactants.

Specific examples thereof include "Disperbyk-101 (polyamidoamine phosphate), 107 (carboxylic acid ester), 110 (copolymer containing acid group), 130 (polyamide), 161, 162, 163, 164, 165, 166, and 170 (high molecular weight copolymer)", and "BYK-P104 and P105 (high molecular weight unsaturated polycarboxylic acid)" (all manufactured by BYK Chemie); "EFKA 4047, 4050 to 4010 to 4165 (polyurethane-based), EFKA 4330 to 4340 (block copolymer), 4400 to 4402 (modified polyacrylate), 5010 (polyester amide), 5765 (high molecular weight polycarboxylate), 6220 (fatty acid polyester), and 6745 (phthalocyanine derivative)" (all manufactured by EFKA); "Ajispur PB821, PB822, PB880, and PB881" (all manufactured by Ajinomoto Fine Techno Co., Inc.); "Flowlen TG-710 (urethane oligomer)" and "Polyflow No. 50E, and No. 300 (acryl-based copolymer)" (all manufactured by Kyoeisha Chemical Co., Ltd.); "Disperon KS-860, 873SN, 874, #2150 (aliphatic polyvalent carboxylic acid), #7004 (polyetherester), DA-703-50, DA-705, and DA-725" (all manufactured by Kusumoto Chemicals Ltd.); "Demol RN, N (naphthalenesulfonic acid-formalin polycondensate), MS, C, and SN-B (aromatic sulfonic acid-formalin polycondensate)", "Homogenol L-18 (high molecular weight polycarboxylic acid)", "Emulgen 920, 930, 935, and 985 (polyoxyethylene nonylphenyl ether)", and "Acetamine 86 (stearylamine acetate)" (all manufactured by Kao Corporation); "Solsperse 5000 (phthalocyanine derivative), 13240 (polyester amine), 3000, 17000, 27000 (polymer having a functional moiety in the end part), 24000, 28000, 32000, and 38500 (graft polymer)" (all manufactured by Lubrizol Japan Ltd.); "Nikkol T106 (polyoxyethylene sorbitan monooleate), and MYS-IEX (polyoxyethylene monostearate)" (both manufactured by Nikko Chemicals Co., Ltd.); "Hinoact T-8000E" (manufactured by Kawaken Fine Chemicals Co., Ltd.); "Organosiloxane Polymer KP341" (manufactured by Shin-Etsu Chemical Co., Ltd.); "W001, cationic surfactant", "a nonionic surfactant such as polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate, and sorbitan fatty acid esters", and "an anionic surfactant such as W004, W005, and W017" (all manufactured by Yusho Co., Ltd.); "EFKA-46, EFKA-47, EFKA-47EA, EFKA Polymer 100, EFKA Polymer 400, EFKA Polymer 401, and EFKA Polymer 450" (all manufactured by Morishita & Co., Ltd.); "Disperse Aid 6, Disperse Aid 8, Disperse Aid 15, and Disperse Aid 9100 (polymer dispersant)" (all manufactured by San Nopco Ltd.); "Adeka Pluronic L31, F38, L42, L44, L61, L64, F68, L72, P95, F77, P84, F87, P94, L101, P103, F108, L121, and P-123" (all manufactured by ADEKA Corporation); "IONET (trade name) S-20" (manufactured by Sanyo Chemical Industries, Co., Ltd); and the like.

These dispersants may be used alone or in combination of two or more kinds thereof. Further, as for the dispersant used in the present invention, a terminal-modified polymer, a graft polymer, or a block polymer, which has an anchor moiety to the surface of the infrared ray shielding material, may also be used in combination with an alkali soluble resin. Examples of the alkali soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in the side chain, and a resin obtained by modifying a polymer having hydroxyl group with an acid anhydride, and among these, a (meth)acrylic acid copolymer is particularly preferred. Further, the N-substituted maleimide monomer copolymers described in JP 10-300922 A, the ether dimer copolymers described in JP 2004-300204 A, and the polymerizable group-containing alkali soluble resins described in JP 7-319161 A are also preferred.

From the viewpoint of dispersibility and settleability, the resins described in JP 2010-106268 A, as shown below, are preferred. In particular, from the viewpoint of dispersibility, a polymer dispersant having a polyester chain in the side chain is preferred, and a resin having an acid group and a polyester chain is also suitable. As the acid group in the dispersant, from the viewpoint of adsorptivity, an acid group having a pKa of 6 or less is preferred, and a carboxylic acid, a sulfonic acid, and a phosphoric acid are particularly preferred.

Specific examples of the above resin include those described in paragraphs 0078 to 0111 of JP 2010-106268 A.

In the case where the infrared ray absorbing composition or the infrared ray absorbing composition kit of the present invention contains the polymerizable compound and the dispersant, it is preferable that at first, a dispersion composition is prepared by using the metal oxide, the copper compound or pigment, and the dispersant with an appropriate solvent, and then, the polymerizable compound is mixed with the dispersion composition, from the viewpoint of enhancing the dispersibility.

The infrared ray absorbing composition or the infrared ray absorbing composition kit may or may not contain the dispersant. In the case where it contains the dispersant, the content of the dispersant in the composition is preferably from 1% by mass to 90% by mass, and more preferably from 3% by mass to 70% by mass, based on the sum of the mass of the metal oxide and the mass of the copper compound or pigment in the compound.

[7] Sensitizer

The infrared ray absorbing composition or the infrared ray absorbing composition kit of the present invention may contain a sensitizer for the purpose of enhancing the radical generation efficiency of the polymerization initiator and making the photosensitive wavelength longer. The sensitizer which can be used in the present invention is preferably a compound capable of sensitizing the photopolymerization initiator described above by an electron transfer mechanism or an energy transfer mechanism. The sensitizer which can be used in the present invention includes compounds belonging to the compound groups enumerated below and having an absorption wavelength in the wavelength region of 300 nm to 450 nm.

The sensitizer which can be used in the present invention is described in detail in, for example, paragraphs 0230 to 0253 of JP 2010-106268 A (corresponding to [0253] to [0273] of the specification of US 2011/0124824 A1), the content of which is incorporated in the specification of the present application.

In the case where the infrared ray absorbing composition or the infrared ray absorbing composition kit of the present invention contains a sensitizer, the content of the sensitizer is preferably from 0.01% by mass to 10% by mass, and more preferably from 0.1% by mass to 2% by mass, with respect to the mass of the total solid content of the composition containing a copper compound or pigment in the first aspect, the composition containing a metal oxide in the first aspect, or the composition containing both a copper compound or pigment, and a metal oxide in the second aspect.

[8] Crosslinking Agent

The infrared ray absorbing composition or the infrared ray absorbing composition kit of the present invention may further contain a crosslinking agent for the purpose of increasing the strength of the infrared ray cut filter.

As for the crosslinking agent, a compound having a crosslinking group is preferred, and a compound having two or more crosslinking groups is more preferred. Specific suitable examples of the crosslinking group include an oxetane group and a cyanate group, and among these, an epoxy group, an oxetane group, and a cyanate group are preferred. That is, the crosslinking agent is particularly preferably an epoxy compound, an oxetane compound, or a cyanate compound.

Examples of the epoxy compound which can be suitably used as a crosslinking agent in the present invention include an epoxy compound having at least two oxirane groups in a molecule, an epoxy compound having an alkyl group at the β-position and containing at least two epoxy groups per in a molecule, and the like.

Examples of the epoxy compound having at least two oxirane groups in a molecule include, but are not limited to, a bixylenol- or biphenol-type epoxy compound (such as "YX4000; manufactured by Japan Epoxy Resins Co., Ltd.") or a mixture thereof, a heterocyclic epoxy compound having an isocyanurate structure or the like (such as "TEPIC; manufactured by Nissan Chemical Industries, Ltd." and "Araldite PT810; manufactured by BASF Japan, Ltd."), a bisphenol A-type epoxy compound, a novolak-type epoxy compound, a bisphenol F-type epoxy compound, a hydrogenated bisphenol A-type epoxy compound, a bisphenol S-type epoxy compound, a phenol novolak-type epoxy compound, a cresol novolak-type epoxy compound, a halogenated epoxy compound (such as a low-brominated epoxy compound, a high-halogenated epoxy compound, and a brominated phenol novolak-type epoxy compound), an allyl group-containing bisphenol A-type epoxy compound, a trisphenolmethane-type epoxy compound, a diphenyldimethanol-type epoxy compound, a phenol-biphenylene-type epoxy compound, a dicyclopentadiene-type epoxy compound (such as "HP-7200 and HP-7200H; both manufactured by Dainippon Ink and Chemicals, Inc."), a glycidylamine-type epoxy compound (such as a diaminodiphenylmethane-type epoxy compound, diglycidylaniline, and triglycidylaminophenol), a glycidylester-type epoxy compound (such as diglycidyl phthalate esters, diglycidyl adipate esters, diglycidyl hexahydrophthalate esters, and diglycidyl dimerate esters), a hydantoin-type epoxy compound, an alicyclic epoxy compound (such as 3,4-epoxycyclohexylmethyl-3',4'-epoxycyclohexane carboxylate, bis(3,4-epoxycyclohexylmethyl)adipate, dicyclopentadiene diepoxide, and "GT-300, GT-400, and EHPE3150; all manufactured by Daicel Chemical Industries, Ltd."), an imide-type alicyclic epoxy compound, a trihydroxyphenylmethane-type epoxy compound, a bisphenol A novolak-type epoxy compound, a tetraphenylolethane-type epoxy compound, a glycidyl phthalate compound, a tetraglycidyl xylenoylethane compound, a naphthalene group-containing epoxy compound (such as a naphthol aralkyl-type epoxy compound, a naphthol novolak-type epoxy compound, and a tetrafunctional naphthalene-type epoxy compound, and as commercially available products, "ESN-190 and ESN-360;

both manufactured by Nippon Steel Chemical Co., Ltd.", and "HP-4032, EXA-4750, and EXA-4700; all manufactured by Dainippon Ink and Chemicals, Inc."), a reaction product of epichlorohydrin and a polyphenol compound which is obtained by addition reaction between a phenol compound and a diolefin compound such as divinylbenzene and dicyclopentadiene, a reaction product obtained by subjecting 4-vinylcyclohexene-1-oxide compound to ring-opening polymerization and then subjecting the resultant to epoxidization with peracetic acid or the like, an epoxy compound having a linear phosphorus-containing structure, an epoxy compound having a cyclic phosphorus-containing structure, an α-methylstilbene-type liquid crystal epoxy compound, a dibenzoyloxybenzene-type liquid crystal epoxy compound, an azophenyl-type liquid crystal epoxy compound, an azomethine phenyl-type liquid crystal epoxy compound, a binaphthyl-type liquid crystal epoxy compound, an azine-type epoxy compound, a glycidyl methacrylate copolymer-based epoxy compound (such as "CP-50S and CP-50M; manufactured by NOF Corporation"), a copolymerized epoxy compound of cyclohexylmaleimide and glycidyl methacrylate, a bis(glycidyloxyphenyl)fluorine-type epoxy compound, and a bis(glycidyloxyphenyl)adamantane-type epoxy compound. These epoxy resins may be used alone or in combination of two or more kinds thereof.

In addition to the epoxy compound having at least two oxirane groups in a molecule, an epoxy compound having an alkyl group at the β-position and containing at least two epoxy groups in a molecule may be used, and a compound containing an epoxy group substituted with an alkyl group at the β-position (more specifically, a β-alkyl-substituted glycidyl group or the like) is particularly preferred.

In the epoxy compound having an alkyl group at the β-position and containing at least two epoxy groups, all of two or more epoxy groups contained in a molecule may be a β-alkyl-substituted glycidyl group, or at least one epoxy group may be a β-alkyl-substituted glycidyl group.

Examples of the oxetane compound include an oxetane resin having at least two oxetanyl groups in a molecule.

Specific examples thereof include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and oligomers or copolymers of these; and ether compounds of a compound having an oxetane group and a hydroxyl group-containing compound such as a novolak resin, poly(p-hydroxystyrene), cardo-type bisphenols, calixarenes, calixresorcinarenes, and silsesquioxane. Other examples thereof include a copolymer of an oxetane ring-containing unsaturated monomer and an alkyl (meth)acrylate, and the like.

Examples of the cyanate compound include a bis A-type cyanate compound, a bis F-type cyanate compound, a cresol novolak-type cyanate compound, a phenol novolak-type cyanate compound, and the like.

Furthermore, as the crosslinking agent, melamine or a melamine derivative can be used.

Examples of the melamine derivative include methylol melamine or an alkylated methylolmelamine (a compound having a methylol group etherified with methyl, ethyl, butyl, or the like).

The crosslinking agent may be used alone or in combination of two or more kinds thereof. The crosslinking agent is preferably melamine or an alkylated methylol melamine, and is particularly preferably hexamethylated methylol melamine, from the viewpoint of good storage stability and effectiveness in enhancing the surface hardness or the film strength itself of the cured film (a film after a crosslinking reaction by a crosslinking agent caused by energy such as light and heat).

In the case where the infrared ray absorbing composition or the infrared ray absorbing composition kit of the present invention contains a crosslinking agent, the content of the crosslinking agent is preferably from 1% by mass to 40% by mass, and more preferably from 3% by mass to 20% by mass, with respect to the mass of the total solid content of the composition containing a copper compound or pigment in the first aspect, the composition containing a metal oxide in the first aspect, or the composition containing both of a copper compound or pigment, and a metal oxide in the second aspect.

[9] Curing Accelerator

The infrared ray absorbing composition or the infrared ray absorbing composition kit of the present invention may further contain a curing accelerator for the purpose of accelerating the heat curing of the crosslinking agent such as an epoxy compound and an oxetane compound.

Examples of the curing accelerator which can be used in the present invention include amine compounds (for example, dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine), quaternary ammonium salt compounds (for example, triethylbenzylammonium chloride), block isocyanate compounds (for example, dimethylamine), imidazole derivative-containing bicyclic amidine compounds or salts thereof (for example, imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole), phosphorus compounds (for example, triphenylphosphine), guanamine compounds (for example, melamine, guanamine, acetoguanamine, and benzoguanamine), and S-triazine derivatives (for example, 2,4-diamino-6-methacryloyloxyethyl-S-triazine, 2-vinyl-2,4-diamino-S-triazine, 2-vinyl-4,6-diamino-S-triazine-isocyanuric acid adduct, and 2,4-diamino-6-methacryloyloxyethyl-S-triazine-isocyanuric acid adduct). The curing accelerator is preferably melamine or dicyandiamide.

The curing accelerator may be used alone or in combination of two or more kinds thereof.

The composition containing a copper compound or pigment in the first aspect, the composition containing a metal oxide in the first aspect, or the composition containing both of a copper compound or pigment, and a metal oxide in the second aspect may or may not contain the curing accelerator, and in the case of containing the curing accelerator, the content of the curing accelerator is usually 0.01% by mass to 15% by mass, with respect to the mass of the total solid content of the composition.

[10] Filler

The infrared ray absorbing composition or the infrared ray absorbing composition kit of the present invention may further contain a filler. Examples of the filler which can be used in the present invention include spherical silica surface-treated with a silane coupling agent.

The infrared ray absorbing composition or the infrared ray absorbing composition kit of the present invention preferably contains a filler, from the viewpoint that an infrared ray cut filter having high durability can be obtained.

The "spherical shape" in the spherical filler would be sufficient if the particle shape of the filler is not in a needle, column, or amorphous shape but is rounded, and the particle shape do not necessarily need to be a "perfectly spherical shape", though a typical "spherical shape" is a "perfectly spherical shape".

Whether the filler is spherical can be confirmed by the observation through a scanning electron microscope (SEM).

Although the volume average particle diameter of the primary particles of the filler is not particularly limited and may be appropriately selected according to the purpose, it is preferably from 0.05 μm to 3 μm, and more preferably from 0.1 μm to 1 μm. When the volume average particle diameter of the primary particles of the filler is in the above range, reduction in the processability is suppressed by expression of thixotropy, and the maximum particle diameter is kept from increasing, which is advantageous in that generation of defects in the obtained infrared ray cut filter which is caused due to adhesion of a foreign substance or due to non-uniformity of the coating film is inhibited.

The volume average particle diameter of the primary particles of the filler can be measured by a dynamic light scattering particle diameter distribution measuring apparatus.

The filler can be dispersed by using the above-described dispersant and binder. As described above, from the viewpoint of curability, an alkali soluble binder polymer having a crosslinking group in the side chain is particularly preferred.

—Surface Treatment—

Although the surface treatment of the filler is not particularly limited and may be appropriately selected according to the purpose, the silane coupling agent, the amount of silane coupling agent used, and the silica coating treatment with the silane coupling agent described in paragraphs 0232 to 0239 of JP 2012-003225 A can be preferably applied to the present invention, and the contents of these descriptions are incorporated in the specification of the present application.

Examples of the spherical silica surface-treated with a silane coupling agent, which can be used in the present invention, include FB and SFP Series (both manufactured by Denki Kagaku Kogyo Kabushiki Kaisha); 1-FX (manufactured by Tatsumori Ltd.); HSP Series (manufactured by Toagosei Co., Ltd.); SP Series (manufactured by Fuso Chemical Co., Ltd.); and the like.

The composition containing a copper compound or pigment in the first aspect, the composition containing a metal oxide in the first aspect, or the composition containing both of a copper compound or pigment, and a metal oxide in the second aspect may or may not contain a filler. In the case where the composition contains the filler, the content of the filler is not particularly limited and may be appropriately selected according to the purpose. However, the content of the filler is preferably from 1% by mass to 60% by mass with respect to the mass of the total solid content of the composition containing a copper compound or pigment in the first aspect, the composition containing a metal oxide in the first aspect, or the composition containing both of a copper compound or pigment, and a metal oxide in the second aspect. When the addition amount is in the above range, a sufficient reduction in the linear expansion coefficient is achieved and the infrared ray cut filter formed is inhibited from embrittlement. Thus, its function as an infrared ray cut filter is sufficiently exerted.

[11] Elastomer

The infrared ray absorbing composition or the infrared ray absorbing composition kit of the present invention may further contain an elastomer.

By containing the elastomer, adhesiveness between a base material and the infrared ray cut filter can be more improved, and at the same time, the heat resistance, the heat shock resistance, the flexibility, and the toughness of the infrared ray cut filter can be further improved.

The elastomer which can be used in the present invention is not particularly limited and may be appropriately selected according to the purpose, and examples thereof include a styrene-based elastomer, an olefin-based elastomer, a urethane-based elastomer, a polyester-based elastomer, a polyamide-based elastomer, an acryl-based elastomer, a silicone-based elastomer, and the like. These elastomers are composed of a hard segment component and a soft segment component, and in general, the former contributes to heat resistance and strength and the latter contributes to flexibility and toughness. Among these, a polyester-based elastomer is advantageous from the viewpoint of compatibility with other materials.

Specific examples of the styrene-based elastomer include Tufprene, Solprene T, Asaprene T, and Tuftec (all manufactured by Asahi Chemical Industry Co., Ltd.), Elastomer AR (manufactured by Aronkasei Co., Ltd.), Kraton G and Kaliflex (both manufactured by Shell Chemicals Japan Ltd.), JSR-TR, TSR-SIS, and DYNARON (all manufactured by Japan Synthetic Rubber Co., Ltd.), Denka STR (manufactured by Denki Kagaku Kogyo Kabushiki Kaisha), Quintac (manufactured by ZEON Corp.), TPE-SB Series (manufactured by Sumitomo Chemical Co., Ltd.), RABALON (manufactured by Mitsubishi Chemical Corp.), SEPTON and HYBRAR (both manufactured by Kuraray Co., Ltd.), Sumiflex (manufactured by Sumitomo Bakelite Co., Ltd.), LEOSTOMER and ACTYMER (both manufactured by Riken Vinyl Industry Co., Ltd.), and the like.

Specific examples of the olefin-based elastomer include MILASTOMER (manufactured by Mitsui Petrochemical Industries, Ltd.), EXACT (manufactured by Exxon Chemical Corp.), ENGAGE (manufactured by Dow Chemical Co.), hydrogenated styrene-butadiene rubber "DYNABON HSBR" (manufactured by Japan Synthetic Rubber Co., Ltd.), butadiene-acrylonitrile copolymers "NBR Series" (manufactured by Japan Synthetic Rubber Co., Ltd.), crosslinking point-containing butadiene-acrylonitrile copolymers modified with carboxyl groups at both terminals "XER Series" (manufactured by Japan Synthetic Rubber Co., Ltd.), epoxidized polybutadiene with polybutadiene being partially epoxidized "BF-1000" (manufactured by Nippon Soda Co., Ltd.), and the like.

Specific examples of the urethane-based elastomer include PANDEX T-2185 and T-2983N (both manufactured by Dainippon Ink and Chemicals, Inc.), Silactone E790, and the like.

Specific examples of the polyester-based elastomer include Hytrel (manufactured by Du Pont-Toray Co., Ltd.), Pelprene (manufactured by Toyobo Co., Ltd.), Espel (manufactured by Hitachi Chemical Co., Ltd.), and the like.

Specific examples of the polyamide-based elastomer include UBE Polyamide Elastomer (manufactured by Ube Industries, Ltd.), DAIAMID (manufactured by Daicel-Huels Ltd.), PEBAX (manufactured by Toray Industries, Inc.), Grilon ELY (manufactured by EMS-CHEMIE Japan Ltd.), Novamid (manufactured by Mitsubishi Chemical Corp.), Grilax (manufactured by Dainippon Ink and Chemicals, Inc.) and the like.

The acryl-based elastomer is obtained by copolymerizing an acrylic acid ester such as ethyl acrylate, butyl acrylate, methoxyethyl acrylate and ethoxyethyl acrylate, and an epoxy group-containing monomer such as glycidyl methacrylate and allyl glycidyl ether and/or a vinyl-based monomer such as acrylonitrile and ethylene. Examples of the acryl-based elastomer include an acrylonitrile-butyl acrylate copolymer, an acrylonitrile-butyl acrylate-ethyl acrylate copolymer, and an acrylonitrile-butyl acrylate-glycidyl methacrylate copolymer.

Specific examples of the silicone-based elastomer include KE Series (manufactured by Shin-Etsu Chemical Co., Ltd.), SE Series, CY Series, and SH Series (all manufactured by Dow Corning Toray Co., Ltd.), and the like.

In addition, other than the above elastomers, a rubber-modified epoxy resin can be used. The rubber-modified epoxy resin can be obtained by modifying a part or all of epoxy groups of, for example, the above-described bisphenol F-type epoxy resin, bisphenol A-type epoxy resin, salicylaldehyde-type epoxy resin, phenol novolak-type epoxy resin, or cresol novolak-type epoxy resin, with both-terminal carboxyl group-modified butadiene-acrylonitrile rubber, terminal amino-modified silicone rubber, or the like.

Among the elastomers, from the viewpoint of shear adhesiveness and heat shock resistance, a both-terminal carboxyl group-modified butadiene-acrylonitrile copolymer, Espel which is a hydroxyl group-containing polyester-based elastomer (Espel 1612 and 1620, both manufactured by Hitachi Chemical Co., Ltd.), and an epoxidized polybutadiene are preferred.

In the case where the infrared ray absorbing composition or the infrared ray absorbing composition kit of the present invention contains an elastomer, the content of the elastomer with respect to the mass of the total solid content of the composition containing a copper compound or pigment in the first aspect, the composition containing a metal oxide in the first aspect, or the composition containing both of a copper compound or pigment, and a metal oxide in the second aspect is not particularly limited and may be appropriately selected according to the purpose. However, the content of the elastomer is preferably from 0.5% by mass to 30% by mass, more preferably from 1% by mass to 10% by mass, and particularly preferably from 3% by mass to 8% by mass, based on the solid content in the composition. If the content is in the above preferred range, it is advantageous in that it becomes possible to further improve the shear adhesiveness and the heat shock resistance.

[12] Surfactant

In the infrared ray absorbing composition or the infrared ray absorbing composition kit of the present invention, various surfactants may be added from the viewpoint of more improving the coating property. As the surfactant, various surfactants such as a fluorine-based surfactant, a nonionic surfactant, a cationic surfactant, an anionic surfactant, and a silicone-based surfactant can be used.

In particular, by adding a fluorine-based surfactant to the infrared ray absorbing composition or the infrared ray absorbing composition kit of the present invention, the liquid characteristics (in particular, fluidity) when the composition is prepared as a coating solution can be further enhanced, and thus the uniformity of the coating film thickness and the liquid saving property can be further improved.

That is, when a film is formed using a coating solution to which the infrared ray absorbing composition or the infrared ray absorbing composition kit containing a fluorine-based surfactant is applied, the interfacial tension between the coated surface and the coating solution is reduced, whereby the wettability of the coated surface is improved and the coating property of the coating solution with respect to the coated surface is enhanced. Therefore, even when a thin film of about several μm is formed using a smaller amount of coating solution, it is possible to reduce the unevenness of the film thickness and to suitably form the film having a uniform thickness, and accordingly, the use of the fluorine-based surfactant is effective.

The fluorine content in the fluorine-based surfactant is preferably from 3% by mass to 40% by mass, more preferably from 5% by mass to 30% by mass, and still more preferably from 7% by mass to 25% by mass. A fluorine-based surfactant having a fluorine content in the above range is effective from the viewpoint of uniformity of the coating film thickness or liquid saving property, and the solubility thereof in the infrared ray absorbing composition is also satisfactory.

Examples of the fluorine-based surfactant include the surfactants described in paragraph 0352 of JP 2012-083727 A, and the like, the contents of which are incorporated in the specification of the present application. Other examples of the fluorine-based surfactant include MEGAFAC F-171, MEGAFAC F-172, MEGAFAC F-173, MEGAFAC F-176, MEGAFAC F-177, MEGAFAC F-141, MEGAFAC F-142, MEGAFAC F-143, MEGAFAC F-144, MEGAFAC R-30, MEGAFAC F-437, MEGAFAC F-475, MEGAFAC F-479, MEGAFAC F-482, MEGAFAC F-554, MEGAFAC F-780, and MEGAFAC F-781 (all manufactured by DIC Corporation), FLUORAD FC430, FLUORAD FC431, and FLUORAD FC171 (all manufactured by Sumitomo 3M Ltd.), SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (all manufactured by Asahi Glass Co., Ltd.), and the like.

Specific examples of the nonionic surfactant include nonionic surfactants described in paragraph 0553 of JP 2012-208494 A, and the like (corresponding to [0679] in the specification of US 2012/235099 A1, and the like), the contents of which are incorporated in the specification of the present application.

Specific examples of the cationic surfactant include cationic surfactants described in paragraph 0554 of JP 2012-208494 A, and the like (corresponding to [0680] in the specification of US 2012/235099 A1, and the like), the contents of which are incorporated in the specification of the present application.

Specific examples of the anionic surfactant include W004, W005, and W017 (all manufactured by Yusho Co Ltd.), and the like.

Examples of the silicone-based surfactant include the silicone-based surfactants described in paragraph 0210 of JP 2012-173327 A, and the like, the contents of which are incorporated in the specification of the present application. Other examples thereof include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400" (all manufactured by Dow Corning Toray Co., Ltd.); "TSF-4440", "TSF-4300", "TSF-4445", "TSF-4460", and "TSF-4452" (all manufactured by Momentive Performance Materials Inc.); "KP341", "KF6001", and "KF6002" (all manufactured by Shin-Etsu Silicone); "BYK-323" and "BYK-330" (both manufactured by Byk-Chemie GmbH); and the like.

The surfactant may be used alone or in combination of two or more kinds thereof.

In the case where the infrared ray absorbing composition or the infrared ray absorbing composition kit of the present invention contain a surfactant, the content of the surfactant is preferably from 0.001% by mass to 1% by mass, and more preferably from 0.01% by mass to 0.1% by mass, with respect to the mass of the total solid content of the composition containing a copper compound or pigment in the first aspect, the composition containing a metal oxide in the first aspect, or the composition containing both of a copper compound or pigment, and a metal oxide in the second aspect.

[13] Other Components

In the infrared ray absorbing composition or the infrared ray absorbing composition kit of the present invention, in addition to the above-described essential components or preferred additives, other components may be appropriately selected and used according to the purpose as long as the effects of the present invention are not impaired.

Examples of other components which can be used together with above-described essential components or preferred additives include a heat curing accelerator, a thermal polymerization inhibitor, and a plasticizer, and also, an adherence accelerator to a base material surface, and other auxiliary agents (for example, an electrically conductive particle, a filler, a defoaming agent, a flame retardant, a leveling agent, a release accelerator, an antioxidant, a perfume, a surface tension adjustor, and a chain transfer agent) may be used in combination therewith.

By appropriately containing these components, the desired properties such as stability and film physical properties of the infrared ray cut filter can be adjusted.

Details of the thermal polymerization inhibitor are described in, for example, paragraphs 0259 to 0281 of JP 2010-106268 A (corresponding to [0281] to [0298] in the specification of US 2011/0124824 A1).

Details of the plasticizer are described in, for example, paragraphs 0103 and 0104 of JP 2008-250074 A.

Details of the adherence accelerator are described in, for example, paragraphs 0293 to 0296 of JP 2010-106268 A (corresponding to [0324] to [0328] in the specification of US 2011/0124824 A1).

All of the additives described in these publications can be used in the infrared ray absorbing composition of the present invention.

[14] Solvent

The infrared ray absorbing composition or the infrared ray absorbing composition kit of the present invention preferably contains a solvent.

The solvent is not particularly limited, and a solvent capable of uniformly dissolving or dispersing the respective components of the infrared ray absorbing composition of the present invention may be appropriately selected according to the purpose. Examples thereof include water; alcohols such as methanol, ethanol, normal-propanol, isopropanol, normal-butanol, secondary-butanol, and normal-hexanol; ketones such as acetone, methyl ethyl ketone, methyl isobutyl ketone, cyclohexanone, diisobutyl ketone, cyclohexanone, and cyclopentanone; esters such as ethyl acetate, butyl acetate, normal-amyl acetate, methyl sulfate, ethyl propionate, dimethyl phthalate, ethyl benzoate, propylene glycol monomethyl ether acetate, and methoxypropyl acetate; aromatic hydrocarbons such as toluene, xylene, benzene, and ethylbenzene; halogenated hydrocarbons such as carbon tetrachloride, trichloroethylene, chloroform, 1,1,1-trichloroethane, methylene chloride, and monochlorobenzene; ethers such as tetrahydrofuran, diethyl ether, ethylene glycol monomethyl ether, ethylene glycol monoethyl ether, 1-methoxy-2-propanol, and propylene glycol monomethyl ether; dimethylformamide; dimethylacetoamide; dimethylsulfoxide; sulfolane; and the like. Among these, water or a hydrophilic solvent is preferred. These may be used alone or in combination of two or more kinds thereof. Further, a known surfactant may be added thereto.

The solid content concentration of the infrared ray absorbing composition or the infrared ray absorbing composition kit of the present invention thus obtained is preferably from 5% by mass to 90% by mass, more preferably from 7% by mass to 80% by mass, and most preferably from 10% by mass to 60% by mass.

If a solvent is contained in the composition of the present invention as described above, for example, by a step in which the composition is spin-coated to form a film, an infrared ray cut filter can be produced without requiring a complicated step, and therefore, the insufficient productivity in the aforementioned conventional infrared ray cut filters can be improved.

The infrared ray absorbing composition or the infrared ray absorbing composition kit of the present invention can be applied for use in an infrared-ray cut filter on the light-receiving side of a solid state imaging element substrate (for example, an infrared-ray cut filter for a wafer level lens), and for use in an infrared ray cut filter on the back side (the side opposite to the light-receiving side) of a solid state imaging element substrate, and it is preferably used in a light shielding film on the light-receiving side of a solid state imaging element substrate.

In the case where the infrared ray absorbing composition or the infrared ray absorbing composition kit of the present invention is used in an infrared ray cut filter on the light-receiving side of a solid state imaging element substrate, the viscosity thereof is preferably in the range of 10 mPa·s to 1000 Pa·s from the viewpoints of thick film-forming property and uniform film-coating property. When the coating method is spin coating or slit coating, the viscosity is more preferably in the range of 10 mPa·s to 500 mPa·s, and most preferably in the range of 20 mPa·s to 100 mPa·s. When the coating method is screen printing, the viscosity is more preferably in the range of 1 Pa·s to 1000 Pa·s, and most preferably in the range of 5 Pa·s to 200 mPa·s.

The present invention also relates to a method for producing an infrared ray cut filter, which includes a step of coating the infrared ray absorbing composition or the infrared ray absorbing composition kit of the present invention on the light-receiving side of a solid state imaging element substrate to form a film.

The method for producing the infrared ray cut filter of the present invention preferably comprises:

a step of coating a composition containing a copper compound or pigment having a maximum absorption wavelength in the wavelength range of 700 nm to 1000 nm to form a copper compound- or pigment-containing film; and a step of coating a composition containing a metal oxide having a maximum absorption wavelength in the wavelength range of 800 nm to 2000 nm to form a metal oxide-containing film.

Examples of the method for forming a film include a method in which the composition containing a copper compound or pigment, the composition containing a metal oxide, or the composition containing both of a copper compound or pigment, and a metal oxide (a coating solution in which the solid content of the composition is dissolved, emulsified or dispersed in the above solvent) is directly coated onto a support and dried to form a film.

A support may be any of a solid state imaging element substrate, another substrate provided on the light-receiving side of the solid state imaging element substrate (for example, a glass substrate 30 described later), and a layer such as a planarization layer provided on the light-receiving side of the solid state imaging element substrate.

The method for coating the infrared ray absorbing composition (coating solution) on the support can be carried out using an applicator, a spin coater, a slit spin coater, a slit coater, screen printing, or the like, and coating using an applicator is preferred.

In addition, the drying conditions for the coating film vary depending on the respective components of the coating solution, the kind of the solvent used, the using rate, and the like, but the drying is usually carried out at a temperature of 60° C. to 150° C. for approximately 30 seconds to 15 minutes.

The method for forming an infrared ray cut filter using the infrared ray absorbing composition or the infrared ray absorbing composition kit of the present invention may include other steps.

Such other steps are not particularly limited and can be appropriately selected according to the purposes, and examples thereof include a support surface treatment step, a pre-heating step (pre-baking step), a curing treatment step, a post-heating step (post-baking step), and the like.

<Pre-Heating Step and Post-Heating Step>

The heating temperature in the pre-heating step and the post-heating step is usually from 80° C. to 200° C., and preferably from 90° C. to 150° C.

The heating time in the pre-heating step and the post-heating step is usually from 30 seconds to 240 seconds, and preferably from 60 seconds to 180 seconds.

<Curing Treatment Step>

The curing treatment step is a step of subjecting the film having been formed to a curing treatment as necessary, and by carrying out this treatment, the mechanical strength of the infrared ray cut filter is improved.

The curing treatment step is not particularly limited and may be appropriately selected according to the purpose. As the curing treatment, whole surface exposure treatment and whole surface heating treatment are suitably exemplified. Here, the "exposure" in the present invention is intended to encompass irradiation of light of various wavelengths as well as irradiation of radioactive rays such as electron rays and X rays.

Exposure is preferably carried out by irradiating radioactive rays, and in particular, electron beams, KrF, ArF, or ultraviolet to visible light such as g-line, h-line, and i-line is preferably used as the radioactive rays in the exposure. In particular, KrF, g-line, h-line, and i-line are preferred.

As the exposure system, stepper exposure, exposure by a high-pressure mercury lamp, and the like are exemplified.

The amount of exposure is preferably from 5 mJ/cm² to 3000 mJ/cm², more preferably from 10 mJ/cm² to 2000 mJ/cm², and most preferably from 50 mJ/cm² to 1000 mJ/cm².

As the method of whole surface exposure treatment, a method in which the overall surface of the formed film is exposed is exemplified. In the case where the infrared ray absorbing composition or the infrared ray absorbing composition kit contains a polymerizable compound, curing of the polymerization components in the film to be formed from the above composition is accelerated by the whole surface exposure, and the curing of the film further proceeds, whereby the mechanical strength and the durability of the film are improved.

The apparatus for carrying out the whole surface exposure is not particularly limited and may be appropriately selected according to the purpose. As the apparatus for carrying out the whole surface exposure, for example, a UV exposure machine such as an ultrahigh-pressure mercury lamp is exemplified.

As the method of whole surface heating treatment, a method in which the overall surface of the film having been formed is heated is exemplified. By the whole surface heating, the film strength of the pattern is enhanced.

The heating temperature for the whole surface heating is preferably from 120° C. to 250° C., and more preferably from 120° C. to 250° C. If the heating temperature is 120° C. or higher, the film strength is improved by the heat treatment, and if the heating temperature is 250° C. or lower, it is possible to prevent that the film quality becomes weak and brittle due to the occurrence of the decomposition of the components contained in the film.

The heating time in the whole surface heating is preferably from 3 minutes to 180 minutes, and more preferably from 5 minutes to 120 minutes.

The apparatus for carrying out the whole surface heating is not particularly limited and may be appropriately selected from among the conventional apparatuses according to the purpose. As the apparatus for carrying out the whole surface heating, for example, a dry oven, a hot plate, and an IR heater are exemplified.

The present invention also relates to an infrared ray cut filter obtained by using the aforementioned infrared ray absorbing composition or infrared ray absorbing composition kit of the present invention.

According to the aforementioned preferred aspect of the method for producing the infrared ray cut filter of the present invention, the infrared ray cut filter 1, as shown in FIG. 1, having the copper compound- or pigment-containing film 2 which contains a copper compound or pigment having a maximum absorption wavelength in the wavelength range of 700 nm to 1000 nm, and the metal oxide-containing film 3 which contains a metal oxide having a maximum absorption wavelength in the wavelength range of 800 nm to 2000 nm can be obtained.

In the infrared ray cut filter 1 of the present invention, when the copper compound- or pigment-containing film 2 is a copper compound-containing film, it is preferable that the film thickness of the copper compound-containing film is from 10 µm to 300 µm, and the film thickness of the metal oxide-containing film 3 is 10 µm or less, from the viewpoint of the application thereof to a solid state imaging element. It is more preferable for the film thickness of the copper compound-containing film to be from 10 µm to 100 µm, and it is also more preferable for the film thickness of the metal oxide-containing film 3 to be 5 µm or less.

On the other hand, in the infrared ray cut filter 1 of the present invention, when the copper compound- or pigment-containing film 2 is a pigment-containing film, the film thickness of the pigment-containing film is preferably from 0.05 µm to 100 µm, and more preferably from 0.1 µm to 50 µm. The preferred range of the film thickness of the metal oxide-containing film 3 is the same as the above.

In addition, in the case where a film containing both of the copper compound and the metal oxide is formed, the film thickness thereof is preferably 20 µm or more, more preferably from 20 µm to 200 µm, still more preferably from 30

µm to 150 µm, and particularly preferably from 40 µm to 120 µm, from the viewpoint of the application thereof to a solid state imaging element.

In the case where a film containing both of the pigment and the metal oxide, the film thickness thereof is preferably from 1.0 µm to 100 µm, more preferably from 1.0 µm to 50 µm, and particularly preferably from 1.0 µm to 4.0 µm, from the viewpoint of the application thereof to a solid state imaging element.

The infrared ray cut filter of the present invention is formed from the infrared ray absorbing composition or the infrared ray absorbing composition kit of the present invention, and therefore, it has high near infrared ray shielding property and high infrared ray shielding property, and it is excellent in heat resistance and moisture resistance.

The present invention also relates to a camera module comprising a solid state imaging element substrate and an infrared ray cut filter disposed on the light-receiving side of the solid state imaging element substrate, in which the infrared ray cut filter is the infrared ray cut filter of the present invention.

Hereinafter, the camera module according to an embodiment of the present invention will be described with reference to FIGS. 2 and 3, but the present invention is not limited to the following specific examples.

Figure 2:
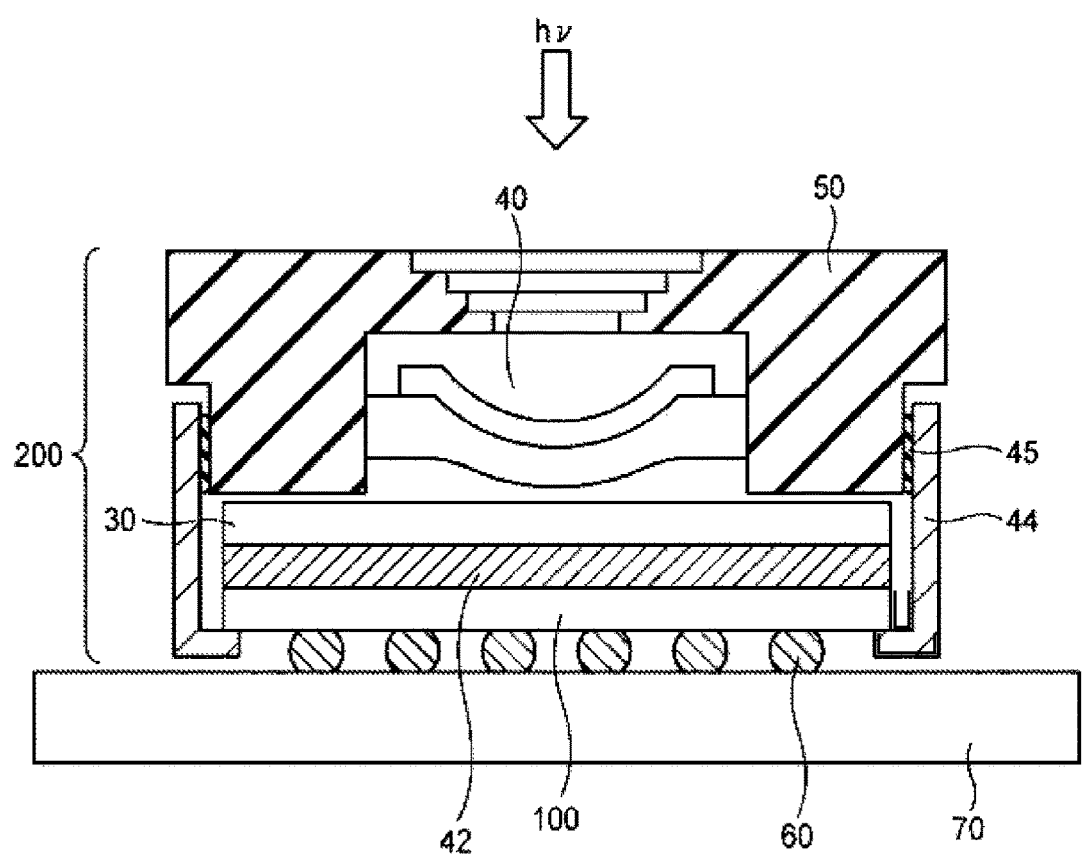
FIG. 2 is a schematic cross-sectional view showing the configuration of a camera module equipped with a solid state imaging element according to an embodiment of the present invention.
Figure 3:
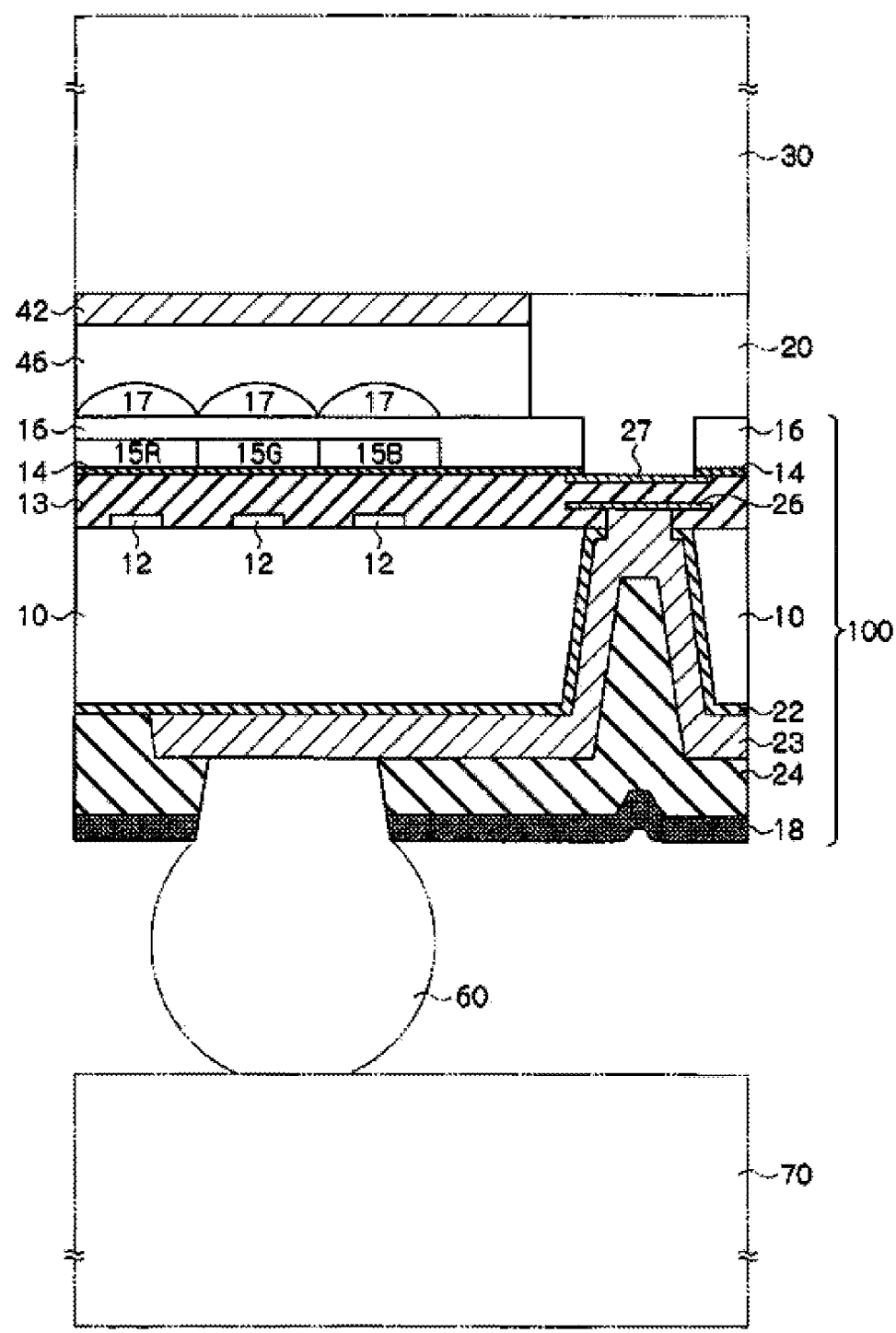
FIG. 3 is a schematic cross-sectional view of a solid state imaging element substrate according to an embodiment of the present invention.

Incidentally, the portions common between FIG. 2 and FIG. 3 are indicated by common reference signs.

Further, in the following description, the "on" and "above" indicate a side farther from the silicon substrate 10, and "lower side" indicates a side closer to the silicon substrate 10.

FIG. 2 is a schematic cross-sectional view showing a configuration of a camera module equipped with a solid state imaging element.

A camera module 200 shown in FIG. 2 is connected to a circuit board 70 as a mounting substrate through a solder ball 60 as a connection member.

Specifically, the camera module 200 is configured to include a solid state imaging element substrate 100 having an imaging element portion on a first major surface of a silicon substrate, a planarization layer 46 (not shown in FIG. 2) disposed on the first major surface side (light-receiving side) of the solid state imaging element substrate 100, an infrared ray cut filter 42 disposed on the planarization layer 46, a glass substrate 30 (light-transmitting substrate) disposed above the infrared ray cut filter 42, a lens holder 50 which is disposed above the glass substrate 30 and has an imaging lens 40 in an internal space, and a light-shielding electromagnetic shield 44 disposed so as to surround the periphery of the solid state imaging element substrate 100 and the glass substrate 30. The respective members are fixed by adhesives 20 (not shown in FIG. 2) and 45.

The present invention also relates to a method for producing a camera module composed of a solid state imaging element substrate, and an infrared ray cut filter disposed on the light-receiving side of the solid state imaging element substrate.

The method for producing a camera module of the present invention preferably includes a step of coating the infrared ray absorbing composition or the infrared ray absorbing composition kit of the present invention at the light-receiving side of the solid state imaging element substrate to form a film.

More specifically, in the camera module according to the present embodiment, for example, the infrared ray absorbing composition or the infrared ray absorbing composition kit of the present invention is coated on the planarization layer 46 to form a film and to form the infrared ray cut filter 42. The method for forming a film by coating to produce an infrared ray cut filter is as described above.

A more preferred aspect of the method for producing a camera module of the present invention comprises a step of coating a composition containing a copper compound or pigment having a maximum absorption wavelength in the wavelength range of 700 nm to 1000 nm on the light-receiving side of a solid state imaging element substrate to form a copper compound- or pigment-containing film, and a step of coating a composition containing a metal oxide having a maximum absorption wavelength in the wavelength range of 800 nm to 2000 nm to form a metal oxide-containing film.

Thus, for example, the infrared ray cut filter 42 comprising the copper compound- or pigment-containing film and the metal oxide-containing film can be formed on the planarization layer 46.

In the camera module 200, incident light hυ from the outside sequentially passes through the imaging lens 40, the glass substrate 30, the infrared ray cut filter 42, and the planarization layer 46, and reaches the imaging element portion of the solid state imaging element substrate 100.

In addition, the camera module 200 is connected to the circuit board 70 through the solder ball 60 (connection material) on the second major surface side of the solid state imaging element substrate 100.

FIG. 3 is an enlarged cross-sectional view of the solid state imaging element substrate 100 shown in FIG. 2.

The solid state imaging element substrate 100 is configured to include a silicon substrate 10 as a base body, an imaging element 12, an interlayer insulating film 13, a base layer 14, a red color filter 15R, a green color filter 15G, a blue color filter 15B, an overcoat 16, a microlens 17, a light-shielding film 18, an insulating film 22, a metal electrode 23, a solder resist layer 24, an internal electrode 26, and an element surface electrode 27.

However, the solder resist layer 24 may be omitted.

First, the configuration on the first major surface side of the solid state imaging element substrate 100 will be mainly described below.

As shown in FIG. 3, the imaging element portion in which a plurality of imaging elements 12 such as CCD and CMOS are two-dimensionally arrayed is provided on the first major surface side of the silicon substrate 10 which is the base body of the solid state imaging element substrate 100.

The interlayer insulating film 13 is formed on the imaging elements 12 in the imaging element portion, and the base layer 14 is formed on the interlayer insulating film 13. Further, the red color filter 15R, the green color filter 15G, and the blue color filter 15B (hereinafter, these are sometimes collectively referred to as a "color filter 15") are respectively disposed on the base layer 14 so as to correspond to the imaging elements 12.

A light-shielding film not shown in the drawing may be provided in the boundaries of the red color filter 15R, the green color filter 15G, and the blue color filter 15B and in the periphery of the imaging element portion. This light-shielding film can be prepared, for example, using a known black color resist.

The overcoat 16 is formed on the color filter 15, and the microlenses 17 are formed on the overcoat 16 so as to correspond to the imaging elements 12 (color filter 15).

In addition, the planarization layer 46 is provided on the microlenses 17.

In the periphery of the imaging element portion on the first major surface side, a peripheral circuit (not shown in the drawing) and the internal electrode 26 are provided, and the internal electrode 26 is electrically connected to the imaging elements 12 through the peripheral circuit.

Furthermore, the element surface electrode 27 is formed on the internal electrode 26 through the interlayer insulating film 13. A contact plug (not shown in the drawing) for electrically connecting the internal electrode 26 and the element surface electrode 27 is formed in the interlayer insulating film 13 between these electrodes. The element surface electrode 27 is used for voltage application, signal reading, or the like through the contact plug and the internal electrode 26.

The base layer 14 is formed on the element surface electrode 27, and the overcoat 16 is formed on the base layer 14. The base layer 14 and the overcoat 16 formed on the element surface electrode 27 are removed to form a pad opening, whereby the element surface electrode 27 is partially exposed.

The configuration on the first major surface side of the solid state imaging element substrate 100 is as described above. In the above configuration, the infrared ray cut filter 42 may be provided between the base layer 14 and the color filter 15 or between the color filter 15 and the overcoat 16, instead of being provided on the planarization layer 46. In particular, the infrared ray cut filter 42 is preferably provided at a position within 2 mm (more preferably within 1 mm) from the surface of the microlens 17. By providing the infrared ray cut filter 42 in this position, the step of forming a near infrared ray cut filter can be simplified, and unnecessary near infrared rays to the microlens can be sufficiently cut, whereby the near infrared ray shielding property can be further improved.

In the first major surface side of the solid state imaging element substrate 100, the adhesive 20 is provided in the periphery of the imaging element portion, and the solid state imaging element substrate 100 is caused to adhere to the glass substrate 30 through the adhesive 20.

Moreover, the silicon substrate 10 has a through-hole penetrating the silicon substrate 10, and a through electrode defining a part of the metal electrode 23 is provided in the through-hole. The imaging element portion and the circuit board 70 are electrically connected by the through electrode.

Next, a configuration on the second major surface side of the solid state imaging element substrate 100 will be mainly described.

In the second major surface side, the insulating film 22 is formed such that it extends from the second major surface to the inner wall of the through-hole.

On the insulating film 22, the metal electrode 23 is provided, and the metal electrode 23 is patterned such that it extends from a region on the second major surface of the silicon substrate 10 to the inside of the through-hole. The metal electrode 23 is an electrode for connecting the imaging element portion in the solid state imaging element substrate 100 and the circuit board 70.

The through electrode is a portion of the metal electrode 23, which is formed inside the through-hole. The through electrode penetrates the silicon substrate 10 and a part of the interlayer insulating film and reaches the lower side of the internal electrode 26 to be electrically connected to the internal electrode 26.

Further, in the second major surface side, the solder resist layer 24 (protective insulating film) covering the second major surface on which the metal electrode 23 is formed and having an opening to expose a part of the metal electrode 23 is provided.

Moreover, in the second major surface side, the light-shielding film 18 covering the second major surface on which the solder resist layer 24 is formed and having an opening to expose a part of the metal electrode 23 is provided.

In FIG. 3, the light-shielding film 18 is patterned so as to cover a part of the metal electrode 23 and expose the remaining portion thereof, but it may be patterned so as to expose the entirety of the metal electrode 23 (which shall apply to the patterning of the solder resist layer 24).

In addition, the solder resist layer 24 may be omitted, and the light-shielding film 18 may be formed directly on the second major surface on which the metal electrode 23 is formed.

The solder ball 60 as a connection member is provided on the exposed metal electrode 23, and the metal electrode 23 of the solid state imaging element substrate 100 and a connection electrode (not shown in the drawing) of the circuit board 70 are electrically connected through the solder ball 60.

The configuration of the solid state imaging element substrate 100 is as described above. The solid imaging element substrate 100 can be formed by a known method such as the method described in paragraphs 0033 to 0068 of JP 2009-158863 A and the method described in paragraphs 0036 to 0065 of JP 2009-99591 A.

One embodiment of the camera module is described above with reference to FIGS. 2 and 3, but the one embodiment is not limited to the specific configuration shown in FIGS. 2 and 3.

EXAMPLES

Hereinafter, examples of the present invention will be described, but the present invention is not limited to these examples at all. Herein, unless otherwise specified, the "parts" and "%" are on the mass basis.

(Copper Compound A and Method for Preparing the Same)

5 g of anhydrous copper benzoate (manufactured by Kanto Chemical Co., Inc.) and 7 g of methacryloyloxyethyl phosphate (manufactured by Johoku Chemical Co., Ltd.) (Specific Example A-1 of the ligand in Table 1) were dissolved in 25 ml of acetone, followed by stirring at room temperature (20° C.) for 4 hours, to allow the reaction to proceed. The obtained reaction product was added dropwise to a hexane solvent and the resulting precipitate was extracted by filtration and dried to obtain a copper compound A. The obtained copper compound A is represented by $Cu(L1)_{n1}$, in which L1 represents A-1 and n1 represents 2.

In addition, the maximum absorption wavelength ($\lambda_{max}$) of the copper compound A was 818 nm (film).

(Copper Compound B and Method for Preparing the Same)

A copper compound B as a target compound was obtained in the same manner as in the above method for preparing the copper compound A, except that 8.24 g of diphenyl phosphate was used instead of methacryloyloxyethyl phosphate. The obtained copper compound B is represented by $Cu(L2)_{n2}$, in which L2 represents diphenyl phosphate and n2 represents 2.

In addition, the maximum absorption wavelength ($\lambda_{max}$) of the copper compound B was 826 nm (film).

<Preparation of Infrared Ray Absorbing Compositions>

Each of the following infrared ray absorbing compositions was prepared by mixing the components constituting the composition using a stirrer.

(Composition a for Copper Compound-Containing Film)

| | |
|---|---|
| The above copper compound A | 149.0 parts by mass |
| The following JER-157S65 (manufactured by Mitsubishi Chemical Corporation) (polymerizable compound) | 24.5 parts by mass |
| Pentaerythritol tetraacrylate (A-TMMT manufactured by Shin-Nakamura Chemical Co., Ltd.) (polymerizable compound) | 24.5 parts by mass |
| MEGAFAC F-781F (manufactured by DIC Corporation) (surfactant) | 2.0 parts by mass |
| Propylene glycol monomethyl ether acetate (PGMEA) | 200.0 parts by mass |

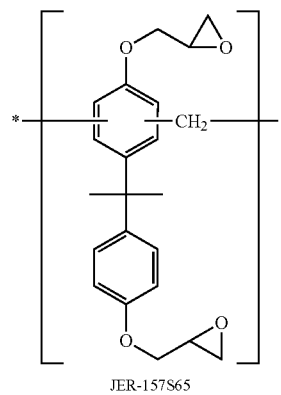

JER-157S65

(Composition B for Copper Compound-Containing Film)

| | |
|---|---|
| The above copper compound B | 100.0 parts by mass |
| MX-RD-F8 (manufactured by Nippon Shokubai Co., Ltd.) (polymerizable compound) | 50.0 parts by mass |
| Pentaerythritol tetraacrylate (A-TMMT manufactured by Shin-Nakamura Chemical Co., Ltd.) (polymerizable compound) | 50.0 parts by mass |
| Cyclohexanone | 200.0 parts by mass |

(Composition C for Copper Compound-Containing Film)

| | |
|---|---|
| The above copper compound A | 400.0 parts by mass |
| EHPE-3150 (manufactured by Daicel Corporation; an adduct of 2,2-bis(hydroxymethyl)-1-butanol with 1,2-epoxy-4-(2-oxiranyl)cyclohexane) (polymerizable compound) | 24.5 parts by mass |
| KAYARAD DPHA (manufactured by Nippon Kayaku Co., Ltd.) (polymerizable compound) | 24.5 parts by mass |
| MEGAFAC F-781F (manufactured by DIC Corporation) (surfactant) | 2.0 parts by mass |
| PGMEA | 200.0 parts by mass |

(Composition D for Copper Compound-Containing Film)

| | |
|---|---|
| The above copper compound A | 20.0 parts by mass |
| EHPE-3150 (manufactured by Daicel Corporation; an adduct of 2,2-bis(hydroxymethyl)-1-butanol with 1,2-epoxy-4-(2-oxiranyl)cyclohexane) (polymerizable compound) | 24.5 parts by mass |
| KAYARAD DPHA (manufactured by Nippon Kayaku Co., Ltd.) (polymerizable compound) | 24.5 parts by mass |
| MEGAFAC F-781F (manufactured by DIC Corporation) (surfactant) | 2.0 parts by mass |
| PGMEA | 200.0 parts by mass |

(Composition E for Copper Compound- and Metal Oxide-Containing Film)

| | |
|---|---|
| The above copper compound A | 100.0 parts by mass |
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 2.0 parts by mass |
| The above JER-157S65 (manufactured by Mitsubishi Chemical Corporation) (polymerizable compound) | 24.5 parts by mass |
| Pentaerythritol tetraacrylate (A-TMMT manufactured by Shin-Nakamura Chemical Co., Ltd.) (polymerizable compound) | 50.0 parts by mass |
| PGMEA | 200.0 parts by mass |

(Composition G for Copper Compound- and Metal Oxide-Containing Film)

| | |
|---|---|
| The above copper compound A | 180.0 parts by mass |
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 4.0 parts by mass |
| MX-RD-F8 (manufactured by Nippon Shokubai Co., Ltd.) (polymerizable compound) | 24.5 parts by mass |
| Pentaerythritol tetraacrylate (A-TMMT manufactured by Shin-Nakamura Chemical Co., Ltd.) (polymerizable compound) | 50.0 parts by mass |
| PGMEA | 200.0 parts by mass |

(Composition H for Copper Compound- and Metal Oxide-Containing Film)

| | |
|---|---|
| The above copper compound A | 90.0 parts by mass |
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 15.0 parts by mass |
| The above JER-157S65 (manufactured by Mitsubishi Chemical Corporation) (polymerizable compound) | 24.5 parts by mass |
| Pentaerythritol tetraacrylate (A-TMMT manufactured by Shin-Nakamura Chemical Co., Ltd.) (polymerizable compound) | 50.0 parts by mass |
| PGMEA | 200.0 parts by mass |

(Composition K for Copper Compound- and Metal Oxide-Containing Film)

| | |
|---|---|
| The copper compound A | 30.0 parts by mass |
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 15.0 parts by mass |

-continued

| | |
|---|---|
| The above JER-157S65 (manufactured by Mitsubishi Chemical Corporation) (polymerizable compound) | 24.5 parts by mass |
| Pentaerythritol tetraacrylate (A-TMMT manufactured by Shin-Nakamura Chemical Co., Ltd.) (polymerizable compound) | 50.0 parts by mass |
| PGMEA | 200.0 parts by mass |

(Composition L for Copper Compound- and Metal Oxide-Containing Film)

| | |
|---|---|
| The above copper compound A | 400.0 parts by mass |
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 15.0 parts by mass |
| The above JER-157S65 (manufactured by Mitsubishi Chemical Corporation) (polymerizable compound) | 24.5 parts by mass |
| Pentaerythritol tetraacrylate (A-TMMT manufactured by Shin-Nakamura Chemical Co., Ltd.) (polymerizable compound) | 50.0 parts by mass |
| PGMEA | 200.0 parts by mass |

(Composition F for Copper Compound-Containing Film)

| | |
|---|---|
| Copper nitrate | 100.0 parts by mass |
| MX-RD-F8 (manufactured by Nippon Shokubai Co., Ltd.) (polymerizable compound) | 50.0 parts by mass |
| Pentaerythritol tetraacrylate (A-TMMT manufactured by Shin-Nakamura Chemical Co., Ltd.) (polymerizable compound) | 50.0 parts by mass |
| PGMEA | 200.0 parts by mass |

(Composition 1 for Pigment-Containing Film)

| | |
|---|---|
| Phthalocyanine-based pigment A (Excolor TX-EX 720 manufactured by Nippon Shokubai Co., Ltd.; a maximum absorption wavelength ($\lambda_{max}$) = 720 nm) | 1.0 part by mass |
| The above JER-157S65 (manufactured by Mitsubishi Chemical Corporation) (polymerizable compound) | 15.8 parts by mass |
| Pentaerythritol tetraacrylate (A-TMMT manufactured by Shin-Nakamura Chemical Co., Ltd.) (polymerizable compound) | 15.8 parts by mass |
| MEGAFAC F-781F (manufactured by DIC Corporation) (surfactant) | 0.3 parts by mass |
| PGMEA | 136.1 parts by mass |

(Composition 2 for Pigment-Containing Film)

A composition 2 for a pigment-containing film was prepared in the same manner as for the composition 1 for a pigment-containing film, except that a phthalocyanine-based pigment B (Excolor TX-EX 708K manufactured by Nippon Shokubai Co., Ltd.; a maximum absorption wavelength ($\lambda_{max}$)=755 nm (film)) was used instead of the phthalocyanine-based pigment A.

(Composition 3 for Pigment-Containing Film)

A composition 3 for a pigment-containing film was prepared in the same manner as for the composition 1 for a pigment-containing film, except that a cyanine-based pigment (Daito Chemix 1371F manufactured by Daito Chemix Corporation; a maximum absorption wavelength ($\lambda_{max}$)=805 nm (film)) was used instead of the phthalocyanine-based pigment A.

(Composition 4 for Pigment-Containing Film)

A composition 4 for a pigment-containing film was prepared in the same manner as for the composition 1 for a pigment-containing film, except that a quaterrylene-based pigment (Lumogen IR 765 manufactured by BASF Japan, Ltd.; a maximum absorption wavelength ($\lambda_{max}$)=705 nm (film)) was used instead of the phthalocyanine-based pigment A.

(Composition 5 for Pigment-Containing Film)

| | |
|---|---|
| Phthalocyanine-based pigment A (Excolor TX-EX 720 manufactured by Nippon Shokubai Co., Ltd.; maximum absorption wavelength ($\lambda_{max}$) = 720 nm (film)) | 1.0 part by mass |
| MX-RD-F8 (manufactured by Nippon Shokubai Co., Ltd.) (polymerizable compound) | 15.8 parts by mass |
| Pentaerythritol tetraacrylate (A-TMMT manufactured by Shin-Nakamura Chemical Co., Ltd.) (polymerizable compound) | 15.8 parts by mass |
| MEGAFAC F-781F (manufactured by DIC Corporation) (surfactant) | 0.3 parts by mass |
| PGMEA | 136.1 parts by mass |

(Composition 6 for Pigment-Containing Film)

| | |
|---|---|
| Phthalocyanine-based pigment A (Excolor TX-EX 720 manufactured by Nippon Shokubai Co., Ltd.; maximum absorption wavelength ($\lambda_{max}$) = 720 nm (film)) | 1.0 part by mass |
| EHPE-3150 (manufactured by Daicel Corporation; an adduct of 2,2-bis(hydroxymethyl)-1-butanol with 1,2-epoxy-4-(2-oxiranyl)cyclohexane) (polymerizable compound) | 15.8 parts by mass |
| KAYARAD DPHA (manufactured by Nippon Kayaku Co., Ltd.) (polymerizable compound) | 15.8 parts by mass |
| MEGAFAC F-781F (manufactured by DIC Corporation) (surfactant) | 0.3 parts by mass |
| PGMEA | 136.1 parts by mass |

(Composition 7 for Pigment-Containing Film)

| | |
|---|---|
| Phthalocyanine-based pigment A (Excolor TX-EX 720 manufactured by Nippon Shokubai Co., Ltd.; a maximum absorption wavelength ($\lambda_{max}$) = 720 nm (film)) | 0.67 parts by mass |
| MX-RD-F8 (manufactured by Nippon Shokubai Co., Ltd.) (polymerizable compound) | 31.5 parts by mass |
| Pentaerythritol tetraacrylate (A-TMMT manufactured by Shin-Nakamura Chemical Co., Ltd.) (polymerizable compound) | 31.5 parts by mass |
| MEGAFAC F-781F (manufactured by DIC Corporation) (surfactant) | 0.3 parts by mass |
| PGMEA | 104 parts by mass |

(Composition 8 for Pigment-Containing Film for Comparative Example)

| | |
|---|---|
| 670T (manufactured by Exciton Inc.; a maximum absorption wavelength ($\lambda_{max}$) = 670 nm (film state)) | 0.67 parts by mass |
| MX-RD-F8 (manufactured by Nippon Shokubai Co., Ltd.) (polymerizable compound) | 31.6 parts by mass |
| Pentaerythritol tetraacrylate (A-TMMT manufactured by Shin-Nakamura Chemical Co., Ltd.) (polymerizable compound) | 31.6 parts by mass |
| PGMEA | 104 parts by mass |

(Composition A for Metal Oxide-Containing Film)

| | |
|---|---|
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 99.0 parts by mass |
| ACRYBASE FF-187 (a copolymer of benzyl methacrylate and methacrylic acid (a molar ratio of repeating units = 70:30; and an acid value = 110 mgKOH/g) manufactured by Fujikura Kasei Co., Ltd.) (binder) | 99.0 parts by mass |
| MEGAFAC F-781F (manufactured by DIC Corporation) (surfactant) | 2.0 parts by mass |
| PGMEA | 100.0 parts by mass |

(Composition B for Metal Oxide-Containing Film)

| | |
|---|---|
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 99.0 parts by mass |
| ACRYBASE FF-187 (a copolymer of benzyl methacrylate and methacrylic acid (a molar ratio of repeating units = 70:30; and an acid value = 110 mgKOH/g) manufactured by Fujikura Kasei Co., Ltd.) (binder) | 49.5 parts by mass |
| KAYARAD DPHA (manufactured by Nippon Kayaku Co., Ltd.) (polymerizable compound) | 49.5 parts by mass |
| MEGAFAC F-781F (manufactured by DIC Corporation) (surfactant) | 2.0 parts by mass |
| PGMEA | 100.0 parts by mass |

(Composition D for Metal Oxide-Containing Film)

| | |
|---|---|
| YMF-02 (manufactured by Sumitomo Metal Mining Co., Ltd. cesium tungsten oxide (a 18.5%- by-mass dispersion of $Cs_{0.33}WO_3$ (average dispersed particle diameter of 800 nm or less; a maximum absorption wavelength ($\lambda_{max}$) = 1550 nm to 1650 nm (film)))) | 80.0 parts by mass |
| ACRYBASE FF-187 (a copolymer of benzyl methacrylate and methacrylic acid (a molar ratio of repeating units = 70:30; and an acid value = 110 mgKOH/g) manufactured by Fujikura Kasei Co., Ltd.) (binder) | 118.0 parts by mass |
| MEGAFAC F-781F (manufactured by DIC Corporation) (surfactant) | 2.0 parts by mass |
| PGMEA | 100.0 parts by mass |

(Composition E for Metal Oxide-Containing Film)

| | |
|---|---|
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 120.0 parts by mass |
| ACRYBASE FF-187 (a copolymer of benzyl methacrylate and methacrylic acid (a molar ratio of repeating units = 70:30; and an acid value = 110 mgKOH/g) manufactured by Fujikura Kasei Co., Ltd.) (binder) | 78.0 parts by mass |
| MEGAFAC F-781F (manufactured by DIC Corporation) (surfactant) | 2.0 parts by mass |
| PGMEA | 100.0 parts by mass |

(Composition C for Comparative Example)

| | |
|---|---|
| Vanadium chloride (manufactured by Wako Pure Chemical Industries, Ltd.) | 100.0 parts by mass |
| MX-RD-F8 (manufactured by Nippon Shokubai Co., Ltd.) (polymerizable compound) | 50.0 parts by mass |
| A-TMMT (manufactured by Shin Nakamura Chemical Co., Ltd.) (polymerizable compound) | 50.0 parts by mass |
| PGMEA | 200.0 parts by mass |

<Preparation of Infrared Ray Cut Filter>

Example 1

A metal oxide-containing film having a film thickness of 1.1 μm was obtained by spin-coating (using MIKASA SPIN COATER 1H-D7 manufactured by Mikasa Co., Ltd.) the composition A for a metal oxide-containing film A at 3000 rpm on a glass substrate, and carrying out pre-heating (pre-baking) at 100° C. for 120 seconds, and then post-heating (post-baking) at 200° C. for 300 seconds.

An infrared ray cut filter composed of a metal oxide-containing film and a copper compound-containing film was obtained by coating the composition A for a copper compound-containing film on the metal oxide-containing film formed as above, using a YBA type baker applicator (manufactured by Yoshimitsu Seiki Co., Ltd.), and carrying out pre-heating (pre-baking) at 100° C. for 120 seconds, and then post-heating (post-baking) at 200° C. for 120 seconds to form a copper compound-containing film having a film thickness of 100 μm.

Examples 2, 3, 10, and 11

An infrared ray cut filter composed of a metal oxide-containing film and a copper compound-containing film was obtained in the same manner as in Example 1, except that the composition A for a metal oxide-containing film was changed to the composition for a metal oxide-containing film described in Table 8 below and the composition A for a copper compound-containing film was changed to the copper compound-containing film described in Table 8 below.

Example 4

An infrared-ray cut filter composed of a copper compound- and metal oxide-containing film having a film thickness of 100 μm was obtained by coating the composition E for a copper compound- and metal oxide-containing film on a glass substrate using a YBA type baker applicator (manufactured by Yoshimitsu Seiki Co., Ltd.), and carrying out pre-heating (pre-baking) at 100° C. for 120 seconds, and then post-heating (post-baking) at 200° C. for 120 seconds.

Examples 6 to 9

An infrared ray cut filter composed of a copper compound- and metal oxide-containing film was obtained in the same manner as in Example 4, except that the composition E for a copper compound- and metal oxide-containing film was changed to the composition for a copper compound- and metal oxide-containing film described in Table 8 below.

Example 5

A copper compound-containing film having a film thickness of 100 μm was obtained by coating the composition B for a copper compound-containing film on a glass substrate using a YBA type baker applicator (manufactured by Yoshimitsu Seiki Co., Ltd.), and carrying out pre-heating (pre-baking) at 100° C. for 120 seconds, and then post-heating (post-baking) at 200° C. for 120 seconds.

An infrared ray cut filter composed of a metal oxide-containing film and a copper compound-containing film was obtained by spin-coating the composition B for a metal oxide-containing film at 3000 rpm on the copper compound-containing film formed as above, and carrying out pre-heating (pre-baking) at 100° C. for 120 seconds, and then post-heating (post-baking) at 200° C. for 300 seconds to form a metal oxide-containing film having a film thickness of 1.1 μm.

Comparative Examples 1 and 4

An infrared ray cut filter composed of a copper compound-containing film having a film thickness of 100 μm was obtained by coating the composition A or F for a copper compound-containing film on a glass substrate using a YBA type baker applicator (manufactured by Yoshimitsu Seiki Co., Ltd.), and carrying out pre-heating (pre-baking) at 100° C. for 120 seconds, and then post-heating (post-baking) at 200° C. for 120 seconds.

Reference Examples 2 and 3

An infrared ray cut filter composed of a metal oxide-containing film having a film thickness of 1.1 μm was obtained by spin-coating the composition A or B for a metal oxide-containing film at 3000 rpm on a glass substrate, and carrying out pre-heating (pre-baking) at 100° C. for 120 seconds, and then post-heating (post-baking) at 200° C. for 300 seconds.

Comparative Example 5

A copper compound-containing film having a film thickness of 100 μm was obtained by coating the composition F for a copper compound-containing film on a glass substrate using a YBA type baker applicator (manufactured by Yoshimitsu Seiki Co., Ltd.), and carrying out pre-heating (pre-baking) at 100° C. for 120 seconds, and then post-heating (post-baking) at 200° C. for 120 seconds.

An infrared ray cut filter composed of a vanadium chloride-containing film and a copper compound-containing film was obtained by spin-coating the composition C for comparative example at 3000 rpm on the copper compound-containing film formed as above, and carrying out pre-heating (pre-baking) at 100° C. for 120 seconds, and then post-heating (post-baking) at 200° C. for 300 seconds to form a vanadium chloride-containing film having a film thickness of 1.1 μm.

Example B1

A metal oxide-containing film having a film thickness of 1.1 μm was obtained by spin-coating the composition A for a metal oxide-containing film at 3000 rpm on a glass substrate (using MIKASA SPIN COATER 1H-D7 manufactured by Mikasa Co., Ltd.), and carrying out pre-heating (pre-baking) at 100° C. for 120 seconds, and then post-heating (post-baking) at 200° C. for 300 seconds.

An infrared ray cut filter composed of a metal oxide-containing film and a pigment-containing film was obtained by spin-coating the composition 1 for a pigment-containing film on the metal oxide-containing film formed as above (using MIKASA SPIN COATER 1H-D7 manufactured by Mikasa Co., Ltd.), and carrying out pre-heating (pre-baking) at 100° C. for 120 seconds, and then post-heating (post-baking) at 200° C. for 300 seconds to form a pigment-containing film having a film thickness of 0.5 μm.

Examples B2 to B16

An infrared ray cut filter composed of a metal oxide-containing film and a pigment-containing film was obtained in the same manner as in Example B1, except that the composition A for a metal oxide-containing film was changed to the composition for a metal oxide-containing film described in Tables 9 below, and the composition 1 for a pigment-containing film was changed to the composition for a pigment-containing film described in Tables 9 below.

Comparative Examples B1 and B2

An infrared ray cut filter composed of a pigment-containing film having a film thickness of 0.5 μm was obtained by spin-coating the composition 1 or 8 for a pigment-containing film on a glass substrate (using MIKASA SPIN COATER 1H-D7 manufactured by Mikasa Co., Ltd.), and carrying out pre-heating (pre-baking) at 100° C. for 120 seconds, and then post-heating (post-baking) at 200° C. for 300 seconds.

Comparative Example B3

A pigment-containing film having a film thickness of 0.5 μm was obtained by spin-coating the composition 8 for a pigment-containing film on a glass substrate (using MIKASA SPIN COATER 1H-D7 manufactured by Mikasa Co., Ltd.), and carrying out pre-heating (pre-baking) at 100° C. for 120 seconds, and then post-heating (post-baking) at 200° C. for 300 seconds.

An infrared ray cut filter composed of a vanadium chloride-containing film and a pigment-containing film was obtained by spin-coating the composition C for comparative example at 3000 rpm on the pigment-containing film formed as above, and carrying out pre-heating (pre-baking) at 100° C. for 120 seconds, and then post-heating (post-baking) at 200° C. for 300 seconds to form a vanadium chloride-containing film having a film thickness of 1.1 μm.

<Evaluation of Infrared Ray Cut Filter>

(Evaluation of Near Infrared Ray Shielding Property and Infrared Ray Shielding Property)

The transmittance at a wavelength of 900 nm of the infrared ray cut filter obtained as above was measured by using an ultraviolet-visible-near infrared spectrophotometer (UV-3600 manufactured by Shimadzu Corporation). As the numerical value is lower, the near infrared ray shielding property is evaluated to be excellent. With respect to the transmittance at a wavelength of 900 nm, when the near infrared ray transmittance is 10% or less, it can be said that the filter exhibits practically good near infrared ray shielding property.

Furthermore, the transmittance at a wavelength of 1300 nm of the infrared ray cut filter was measured by using a spectrophotometer (U-4100 manufactured by Hitachi High-Technologies Corporation). As the numerical value is lower, the infrared ray shielding property is evaluated to be excellent. When the infrared ray transmittance is less than 30%, it can be said that the filter exhibits practically good infrared ray shielding property.

(Evaluation 1 of Heat Resistance)

The obtained infrared ray cut filter was subjected to a heat treatment at 220° C. for 3 minutes in a hot plate. Before and after the test of heat resistance, the absorbance at a wavelength range of 400 nm to 700 nm of the infrared ray cut filter was measured by using a spectrophotometer (U-4100 manufactured by Hitachi High-Technologies Corporation), and an integrated change rate in absorbance was determined.

|(Absorbance area at a wavelength range of 400 nm to 700 nm before the test−Absorbance area at a wavelength range of 400 nm to 700 nm after the test)/Absorbance area at a wavelength range of 400 nm to 700 nm before the test×100|(%)

The change rate of absorbance area determined by the above calculation formula was evaluated in accordance with the following criteria.

A: Change rate of absorbance area≤2%
B: 2%<Change rate of absorbance area≤4%
C: 4%<Change rate of absorbance area≤7%
D: 7%<Change rate of absorbance area (Evaluation 2 of Heat Resistance in Visible Region (400 nm to 500 nm))

The obtained infrared ray cut filter was subjected to a heat treatment at 220° C. for 3 minutes in a hot plate. Before and after the test of heat resistance, the absorbance at a wavelength range of 400 nm to 500 nm of the infrared ray cut filter was measured by using a spectrophotometer (U-4100 manufactured by Hitachi High-Technologies Corporation), and an integrated change rate in absorbance was determined.

|(Absorbance area at a wavelength range of 400 nm to 500 nm before the test−Absorbance area at a wavelength range of 400 nm to 500 nm after the test)/Absorbance area at a wavelength range of 400 nm to 500 nm before the test×100|(%)

The change rate of absorbance area determined by the above calculation formula was evaluated in accordance with the following criteria.

A: Change rate of absorbance area≤2%
B: 2%<Change rate of absorbance area≤4%
C: 4%<Change rate of absorbance area≤7%
D: 7%<Change rate of absorbance area (Evaluation of Moisture Resistance)

By using Temperature and Humidity Chamber IW222 (manufactured by Yamada Kagaku Co., Ltd.), the infrared ray cut filters of Examples 1 to 11, Comparative Examples 1 to 5, Examples B1 to B16, and Comparative Examples B1 to B3 were subjected to a moisture resistance test, in which they were left to stand for 20 hours in an atmosphere at 85° C. and a humidity of 95% RH.

The visible light transmittance (at a wavelength of 550 nm) of the infrared ray cut filter after the moisture resistance test was measured in accordance with the above method, and the change rate in visible light transmittance represented by |(Visible light transmittance (%) before the test−Visible light transmittance (%) after the test)/Visible light transmittance (%) before the test×100|(%) was evaluated in accordance with the following criteria.

A: Change rate of visible light transmittance<3%
B: 3%≤Change rate of visible light transmittance<5%
C: 5%≤Change rate of visible light transmittance≤15%
D: 15%<Change rate of visible light transmittance The evaluation results are shown in Tables 8 and 9 below.

Herein, "<A %" in Tables 8 and 9 is intended to indicate a range of less than A % to more than A %-0.1, that is, a range of more than (A-0.1)% to less than A %. For example, "<5%" is intended to indicate a range of more than 4.9% and less than 5%.

TABLE 8

| | Composition for copper compound-containing film | | Composition for metal oxide-containing film | | | Near | | | | |
|---|---|---|---|---|---|---|---|---|---|---|
| | Type | Content of copper compound (% by mass)*[1] | Type | Content of metal oxide (% by mass)*[1] | Mass ratio (metal oxide/copper compound) | infrared ray shielding property | Infrared ray shielding property | Heat resistance | Heat resistance (visible region) | moisture resistance |
| Example 1 | A | 74.5 | A | 15.35 | | <5% | <25% | A | A | A |
| Example 2 | A | 74.5 | B | 15.35 | | <5% | <25% | A | B | A |
| Example 3 | B | 50.0 | B | 15.35 | | <5% | <25% | B | A | A |
| Example 4 | E | 57.2 | | 0.212*[2] | 0.0037 | <5% | <25% | A | A | C |
| Example 5 | B | 50.0 | B | 15.35 | | <5% | <25% | B | A | B |
| Example 6 | G | 70.5 | | 0.290*[2] | 0.0041 | <7% | <20% | A | A | C |
| Example 7 | H | 53.8 | | 1.660*[2] | 0.0308 | <9% | <10% | A | A | C |
| Example 8 | K | 28.0 | | 2.587*[2] | 0.0925 | <7% | <25% | A | B | B |
| Example 9 | L | 83.8 | | 0.581*[2] | 0.00694 | <7% | <25% | A | A | C |
| Example 10 | C | 88.7 | A | 15.35 | | <5% | <25% | A | B | B |
| Example 11 | D | 28.2 | A | 15.35 | | <5% | <30% | A | A | A |
| Comparative Example 1 | A | 74.5 | None | None | | <20% | <50% | A | A | D |
| Reference Example 2 | None | None | A | 15.35 | | <50% | <25% | A | A | A |
| Reference Example 3 | None | None | B | 15.35 | | <50% | <25% | A | A | A |
| Comparative Example 4 | F | 50.0 | None | None | | <20% | <50% | D | D | D |
| Comparative Example 5 | F | 50.0 | C | 50.0 | | <20% | <5% | D | D | D |

*[1]Content with respect to the mass of the total solid content of the composition.
*[2]Content with respect to the mass of the total solid content of the composition for a copper compound- and metal oxide-containing film.
Each of E, G, H, K, and L is a composition for a copper compound- and metal oxide-containing film.

TABLE 9

| | Composition for pigment-containing film | | Composition for metal oxide-containing film | | Near infrared ray shielding property | Infrared ray shielding property | Heat resistance | Heat resistance (visible region) | moisture resistance |
|---|---|---|---|---|---|---|---|---|---|
| | Type | Content of pigment (% by mass)*1 | Type | Content of metal oxide (% by mass)*1 | | | | | |
| Example B1 | Composition 1 | 3% | A | 15.35 | <5% | <5% | A | A | A |
| Example B2 | Composition 1 | 3% | B | 15.35 | <5% | <5% | A | A | A |
| Example B3 | Composition 2 | 3% | A | 15.35 | <5% | <5% | A | A | A |
| Example B4 | Composition 2 | 3% | B | 15.35 | <5% | <5% | A | A | A |
| Example B5 | Composition 3 | 3% | A | 15.35 | <5% | <5% | A | A | A |
| Example B6 | Composition 3 | 3% | B | 15.35 | <5% | <5% | A | A | B |
| Example B7 | Composition 4 | 3% | A | 15.35 | <5% | <5% | A | A | A |
| Example B8 | Composition 4 | 3% | B | 15.35 | <5% | <5% | A | A | A |
| Example B9 | Composition 5 | 3% | A | 15.35 | <5% | <5% | B | A | A |
| Example B10 | Composition 5 | 3% | B | 15.35 | <5% | <5% | A | A | B |
| Example B11 | Composition 6 | 3% | A | 15.35 | <5% | <5% | A | A | A |
| Example B12 | Composition 6 | 3% | B | 15.35 | <5% | <5% | B | A | A |
| Example B13 | Composition 7 | 1% | A | 15.35 | <5% | <5% | A | A | A |
| Example B14 | Composition 7 | 1% | B | 15.35 | <5% | <5% | A | A | A |
| Example B15 | Composition 6 | 3% | D | 10.98 | <7% | <5% | A | A | A |
| Example B16 | Composition 6 | 3% | E | 21.72 | <2% | <5% | A | A | A |
| Comparative Example B1 | Composition 1 | 3% | None | None | <7% | >90% | A | B | C |
| Comparative Example B2 | Composition 8 | 1% | None | None | <7% | >90% | D | B | C |
| Comparative Example B3 | Composition 8 | 1% | C | 50 | <20% | <25% | D | A | B |

*1Content with respect to the mass of the total solid content of the composition.

As apparent from the results shown in Tables above, it can be seen that in Comparative Examples 1 and 4 having no metal oxide-containing film, the infrared ray shielding property and the moisture resistance are deteriorated and the near infrared ray shielding property is also slightly deteriorated, and in particular, in Comparative Example 4 using copper nitrate as a copper compound, the heat resistance is also deteriorated.

In addition, it can be seen that in Reference Examples 2 and 3 having no copper compound-containing film, the near infrared ray shielding property is deteriorated. Although in Reference Examples 2 and 3, the near-infrared ray-shielding property is deteriorated, in the case where such an evaluation level of the near infrared ray shielding property is not problematic, the films of Reference Examples 2 and 3 can be used as a material for the near infrared ray absorbing filter of a solid state imaging element.

It can be seen that in Comparative Example 5 having a vanadium chloride-containing film, not a metal oxide-containing film, and also using copper nitrate as a copper compound, the heat resistance and the moisture resistance are deteriorated.

In contrast, it can be seen that in Examples 1 to 11 using the metal oxide and the copper compound, all of the near infrared ray shielding property, the infrared ray shielding property, the heat resistance, and the moisture resistance are excellent.

Particularly, it can be seen that in Examples 1 to 3 and 5, 10, and 11 having a copper compound-containing film and a metal oxide-containing film, all of the near infrared ray shielding property, the infrared ray shielding property, the heat resistance, and the moisture resistance are particularly excellent.

Furthermore, it can be seen that in Comparative Examples B1 and B2 having no metal oxide-containing film, the infrared ray shielding property is deteriorated, and in particular, in Comparative Example B2 using a pigment with a $\lambda_{max}$ shorter than 700 nm, the heat resistance is also deteriorated. It can be seen that in Comparative Example B3 having a vanadium chloride-containing film and using a pigment with a $\lambda_{max}$ shorter than 700 nm, the near infrared ray shielding property is slightly deteriorated, and the infrared ray shielding property and the heat resistance are deteriorated.

In contrast, it can be seen that in Examples B1 to B16 using a pigment with a $\lambda_{max}$ at 700 nm to 1000 nm and a metal oxide, all of the near infrared ray shielding property, the infrared ray shielding property, the heat resistance, and the moisture resistance are excellent.

<Preparation of Infrared Ray Absorbing Composition>

Example C1

The following constituents were mixed by a stirrer to prepare an infrared ray absorbing composition of Example C1.

| | |
|---|---|
| YMF-02 (manufactured by Sumitomo Metal Mining Co., Ltd. cesium tungsten oxide (a 18.5%-by-mass dispersion of $Cs_{0.33}WO_3$ (average dispersed particle diameter of 800 nm or less; a maximum absorption wavelength ($\lambda_{max}$) = 1550 nm to 1650 nm (film)))) | 108.3 parts by mass |
| Phthalocyanine-based pigment A (Excolor TX-EX 720 manufactured by Nippon Shokubai Co., Ltd.; a maximum absorption wavelength ($\lambda_{max}$) = 720 nm (film)) | 1.0 part by mass |
| KAYARAD DPHA (manufactured by Nippon Kayaku Co., Ltd.) (polymerizable compound) | 5.8 parts by mass |
| ACRYBASE FF-187 (a copolymer of benzyl methacrylate and methacrylic acid (a molar ratio of repeating units = 70:30; and an acid value = 110 mgKOH/g) manufactured by Fujikura Kasei Co., Ltd.) (binder) | 5.8 parts by mass |

| | |
|---|---|
| PGMEA | 48.3 parts by mass |
| MEGAFAC F-781 (manufactured by DIC Corporation) (surfactant) | 0.3 parts by mass |

Example C2

An infrared ray absorbing composition of Example C2 was prepared in the same manner as in Example C1, except that 0.5 parts by mass of the phthalocyanine-based pigment A and 0.5 parts by mass of a phthalocyanine-based pigment B (Excolor TX-EX 708K manufactured by Nippon Shokubai Co., Ltd.; a maximum absorption wavelength ($\lambda_{max}$)=755 nm (film)) were used instead of 1.0 part by mass of the phthalocyanine-based pigment A.

Example C3

An infrared ray absorbing composition of Example C3 was prepared in the same manner as in Example C1, except that 0.5 parts by mass of the phthalocyanine-based pigment A and 0.5 parts by mass of a cyanine-based pigment (Daito Chemix 1371F manufactured by Daito Chemix Corporation; a maximum absorption wavelength ($\lambda_{max}$)=805 nm (film)) were used instead of 1.0 part by mass of the phthalocyanine-based pigment A.

Example C4

An infrared ray absorbing composition of Example C4 was prepared in the same manner as in Example C1, except that 0.5 parts by mass of the phthalocyanine-based pigment A and 0.5 parts by mass of a quaterrylene-based pigment (Lumogen IR 765 manufactured by BASF Japan, Ltd.; a maximum absorption wavelength ($\lambda_{max}$)=705 nm (film)) were used instead of 1.0 part by mass of the phthalocyanine-based pigment A.

Example C5

An infrared ray absorbing composition of Example C5 was prepared in the same manner as in Example C1, except that 1.0 part by mass of a phthalocyanine-based pigment B (Excolor TX-EX 708K manufactured by Nippon Shokubai Co., Ltd.; a maximum absorption wavelength ($\lambda_{max}$)=755 nm (film)) was used instead of 1.0 part by mass of the phthalocyanine-based pigment A.

Example C6

An infrared ray absorbing composition of Example C6 was prepared in the same manner as in Example C1, except that 0.5 parts by mass of a phthalocyanine-based pigment B (Excolor TX-EX 708K manufactured by Nippon Shokubai Co., Ltd.; a maximum absorption wavelength ($\lambda_{max}$)=755 nm (film)) and 0.5 parts by mass of a cyanine-based pigment (Daito Chemix 1371F manufactured by Daito Chemix Corporation; a maximum absorption wavelength ($\lambda_{max}$)=805 nm (film)) were used instead of 1.0 part by mass of the phthalocyanine-based pigment A.

Example C7

An infrared ray absorbing composition of Example C7 was prepared in the same manner as in Example C1, except that 0.5 parts by mass of a phthalocyanine-based pigment B (Excolor TX-EX 708K manufactured by Nippon Shokubai Co., Ltd.; a maximum absorption wavelength ($\lambda_{max}$)=755 nm (film)) and 0.5 parts by mass of a quaterrylene-based pigment (Lumogen IR 765 manufactured by BASF Japan, Ltd.; a maximum absorption wavelength ($\lambda_{max}$)=705 nm (film)) were used instead of 1.0 part by mass of the phthalocyanine-based pigment A.

Example C8

An infrared ray absorbing composition of Example C8 was prepared in the same manner as in Example C1, except that 1.0 part by mass of a cyanine-based pigment (Daito Chemix 1371F manufactured by Daito Chemix Corporation; a maximum absorption wavelength ($\lambda_{max}$)=805 nm (film)) was used instead of 1.0 part by mass of the phthalocyanine-based pigment A.

Example C9

An infrared ray absorbing composition of Example C9 was prepared in the same manner as in Example C1, except that 0.5 parts by mass of a cyanine-based pigment (Daito Chemix 1371F manufactured by Daito Chemix Corporation; a maximum absorption wavelength ($\lambda_{max}$)=805 nm (film)) and 0.5 parts by mass of a quaterrylene-based pigment (Lumogen IR 765 manufactured by BASF Japan, Ltd.; a maximum absorption wavelength ($\lambda_{max}$)=705 nm (film)) were used instead of 1.0 part by mass of the phthalocyanine-based pigment A.

Example C10

An infrared ray absorbing composition of Example C10 was prepared in the same manner as in Example C1, except that 1.0 part by mass of a quaterrylene-based pigment (Lumogen IR 765 manufactured by BASF Japan, Ltd.; a maximum absorption wavelength ($\lambda_{max}$)=705 nm (film)) was used instead of 1.0 part by mass of the phthalocyanine-based pigment A.

Example C11

An infrared ray absorbing composition of Example C11 was prepared in the same manner as in Example C1, except that 5.8 parts by mass of ARONICS M-305 (manufactured by Toagosei Co., Ltd.) was used instead of 5.8 parts by mass of KAYARAD DPHA (manufactured by Nippon Kayaku Co., Ltd.).

Example C12

An infrared ray absorbing composition of Example C12 was prepared in the same manner as in Example C1, except that 5.8 parts by mass of CYCLOMER P ACA230AA (manufactured by Daicel Corporation) was used instead of 5.8 parts by mass of ACRYBASE FF-187 (manufactured by Fujikura Kasei Co., Ltd.).

Example C13

An infrared ray absorbing composition of Example C13 was prepared in the same manner as in Example C1, except that 5.8 parts by mass of ARONICS M-305 (manufactured by Toagosei Co., Ltd.) and 5.8 parts by mass of CYCLOMER P ACA230AA (manufactured by Daicel Corporation) were respectively used instead of 5.8 parts by mass of KAYARAD DPHA (manufactured by Nippon Kayaku Co., Ltd.) and 5.8 parts by mass of ACRYBASE FF-187 (manufactured by Fujikura Kasei Co., Ltd.).

Example C14

An infrared ray absorbing composition of Example C14 was prepared in the same manner as in Example C1, except that 48.3 parts by mass of propylene glycol monomethyl ether (PGME) was used instead of 48.3 parts by mass of PGMEA.

Example C15

An infrared ray absorbing composition of Example C15 was prepared in the same manner as in Example C1, except that the amount of the phthalocyanine-based pigment A to be used was changed from 1.0 part by mass to 0.2 parts by mass.

Example C16

An infrared ray absorbing composition of Example C16 was prepared in the same manner as in Example C1, except that the amount of the YMF-02 was changed from 108.3 parts by mass to 10 parts by mass and the amount of the phthalocyanine-based pigment A was changed from 1.0 part by mass to 5 parts by mass.

Reference Example C1

An infrared ray absorbing composition of Reference Example C1 was prepared in the same manner as in Example C1, except that the phthalocyanine-based pigment A was not used and 48.3 parts by mass of PGMEA was replaced with 26.0 parts by mass of PGMEA.

Comparative Example C2

An infrared ray absorbing composition of Comparative Example C2 was prepared in the same manner as in Example C1, except that the YMF-02 was not used and 48.3 parts by mass of PGMEA was replaced with 49.3 parts by mass of PGMEA.

Comparative Example C3

An infrared ray absorbing composition of Comparative Example C3 was prepared in the same manner as in Example C1, except that the YMF-02 was not used, 0.5 parts by mass of the above phthalocyanine-based pigment A and 0.5 parts by mass of a cyanine-based pigment (manufactured by Daito Chemix Corporation 1371 F; a maximum absorption wavelength ($\lambda_{max}$)=805 nm (film)) were used instead of 1.0 part by mass of phthalocyanine-based pigment A, and 48.3 parts by mass of PGMEA was replaced with 156.6 parts by mass of PGMEA.

Reference Example C4

An infrared ray absorbing composition of Reference Example C4 was prepared in the same manner as in Example C1, except that 1.0 part by mass of 670T (manufactured by Exciton Inc.; a maximum absorption wavelength ($\lambda_{max}$) =670 nm (film state)) was used instead of 1.0 parts by mass of the phthalocyanine-based pigment A.

Hereinafter, the characteristics of the infrared ray absorbing compositions of Examples C1 to C16, Reference Example C1, Comparative Examples C2 and C3, and Reference Example C4 are summarized in Table 10 below.

TABLE 10

| | Metal oxide | | Pigment | | | Mass ratio of metal oxide to pigment |
|---|---|---|---|---|---|---|
| | Type | Content (% by mass)*3 | Type | | Content (% by mass)*4 | |
| Example C1 | Cesium tungsten oxide | 60.8 | Phthalocyanine-based pigment A | | 3.0 | 20.0 |
| Example C2 | Cesium tungsten oxide | 60.8 | Phthalocyanine-based pigment A | Phthalocyanine-based pigment B | 3.0 | 20.0 |
| Example C3 | Cesium tungsten oxide | 60.8 | Phthalocyanine-based pigment A | Cyanine-based pigment | 3.0 | 20.0 |
| Example C4 | Cesium tungsten oxide | 60.8 | Phthalocyanine-based pigment A | Quaterrylene-based pigment | 3.0 | 20.0 |
| Example C5 | Cesium tungsten oxide | 60.8 | Phthalocyanine-based pigment B | | 3.0 | 20.0 |
| Example C6 | Cesium tungsten oxide | 60.8 | Phthalocyanine-based pigment B | Cyanine-based pigment | 3.0 | 20.0 |
| Example C7 | Cesium tungsten oxide | 60.8 | Phthalocyanine-based pigment B | Quaterrylene-based pigment | 3.0 | 20.0 |
| Example C8 | Cesium tungsten oxide | 60.8 | Cyanine-based pigment | | 3.0 | 20.0 |
| Example C9 | Cesium tungsten oxide | 60.8 | Cyanine-based pigment | Quaterrylene-based pigment | 3.0 | 20.0 |
| Example C10 | Cesium tungsten oxide | 60.8 | Quaterrylene-based pigment | | 3.0 | 20.0 |
| Example C11 | Cesium tungsten oxide | 60.8 | Phthalocyanine-based pigment A | | 3.0 | 20.0 |
| Example C12 | Cesium tungsten oxide | 60.8 | Phthalocyanine-based pigment A | | 3.0 | 20.0 |
| Example C13 | Cesium tungsten oxide | 60.8 | Phthalocyanine-based pigment A | | 3.0 | 20.0 |
| Example C14 | Cesium tungsten oxide | 60.8 | Phthalocyanine-based pigment A | | 3.0 | 20.0 |
| Example C15 | Cesium tungsten oxide | 62.3 | Phthalocyanine-based pigment A | | 0.62 | 100.1 |
| Example C16 | Cesium tungsten oxide | 9.9 | Phthalocyanine-based pigment A | | 26.7 | 0.4 |
| Reference Example C1 | Cesium tungsten oxide | 62.7 | Not contained | | 0 | — |
| Comparative Example C2 | Not contained | 0 | Phthalocyanine-based pigment A | | 7.8 | — |
| Comparative Example C3 | Not contained | 0 | Phthalocyanine-based pigment A | Cyanine-based pigment | 7.8 | — |

TABLE 10-continued

| | Metal oxide | | Pigment | | Mass ratio of metal oxide to pigment |
|---|---|---|---|---|---|
| | Type | Content (% by mass)*3 | Type | Content (% by mass)*4 | |
| Reference Example C4 | Cesium tungsten oxide | 60.8 | 670T manufactured by Exciton Inc. | 3.0 | 20.0 |

3*Content with respect to the mass of the total solid content of the composition.
4*Content with respect to the mass of the total solid content of the composition (in the case where a plurality of pigments are present, the content represents the total content of the pigments.)

<Preparation of Infrared Ray Cut Filter>

A coating film was formed from each of the obtained infrared ray absorbing compositions of Examples C1 to C16, Reference Example C1, Comparative Examples C2 and C3, and Reference Example C4 by using a spin-coating method (using MIKASA SPIN COATER 1H-D7 manufactured by Mikasa Co., Ltd.; 340 rpm). The obtained coating film was subjected to pre-heating (pre-baking) at 100° C. for 120 seconds and then, to whole surface exposure treatment using an i-line stepper at 2000 mJ/cm$^2$. Subsequently, the resultant was subjected to post-heating (post-baking) at 200° C. for 5 minutes to obtain an infrared ray cut filter having a film thickness of about 2 μm.

<Evaluation of Infrared Ray Cut Filter>

With respect to the obtained infrared ray cut filters, the aforementioned evaluations (Evaluation of near infrared ray shielding property and infrared ray shielding property), (Evaluation 1 of heat resistance), (Evaluation 2 of heat resistance in visible region (400 nm to 500 nm)), and (Evaluation of moisture resistance) were performed by the methods described above.

The evaluation results are shown in Table 11 below.

TABLE 11

| | Near infrared ray shielding property | Infrared ray shielding property | Heat resistance | Heat resistance (visible region) | Moisture resistance |
|---|---|---|---|---|---|
| Example C1 | <5% | <5% | A | A | A |
| Example C2 | <5% | <5% | A | A | A |
| Example C3 | <5% | <5% | C | C | C |
| Example C4 | <5% | <5% | A | B | B |
| Example C5 | <5% | <20% | A | A | A |
| Example C6 | <5% | <20% | C | C | C |
| Example C7 | <5% | <20% | C | B | B |
| Example C8 | <5% | <10% | C | B | B |
| Example C9 | <5% | <20% | C | B | B |
| Example C10 | <5% | <30% | A | B | B |
| Example C11 | <5% | <5% | A | B | B |
| Example C12 | <5% | <5% | A | A | A |
| Example C13 | <5% | <5% | A | A | A |
| Example C14 | <5% | <5% | A | A | A |
| Example C15 | <5% | <10% | A | A | A |
| Example C16 | <5% | <1% | B | B | A |
| Reference Example C1 | <20% | >40% | A | B | B |
| Comparative Example C2 | >90% | <5% | A | D | D |
| Comparative Example C3 | >90% | <5% | D | D | D |
| Reference Example C4 | <5% | >40% | A | B | A |

As apparent from the results shown in Table 11 above, it can be seen that in Reference Example C1 containing no pigment and Reference Example C4 in which the $\lambda_{max}$ of the pigment deviates from the scope of the present invention, the infrared ray shielding property is deteriorated. Although in Reference Examples C1 and C4, the near infrared ray shielding property is deteriorated, in the case where such an evaluation level of near infrared ray shielding property is not problematic, the films of Reference Examples C1 and C4 can be used as a material of the near infrared ray absorbing filter of a solid state imaging element.

It can be seen that in Comparative Examples C2 and C3 containing no metal oxide, all of the near infrared ray shielding property, the heat resistance, and the moisture resistance are deteriorated.

In contrast, it can be seen that in Examples C1 to C16, all of the near infrared ray shielding property, the infrared ray shielding property, the heat resistance, and the moisture resistance are excellent.

Next, infrared ray absorbing compositions of Examples C17 to C25 were prepared in the same formulation as in Example C1, except that the amounts of the YMF-02 and the phthalocyanine-based pigment A to be used were respectively changed such that the content (% by mass) of cesium tungsten oxide as a metal oxide, and the content (% by mass) of the phthalocyanine-based pigment A were adjusted to the values in Table 12 below (here, the amounts of the components other than cesium tungsten oxide and the phthalocyanine-based pigment A to be used are the same as in Example C1, and a sum of the amounts of cesium tungsten oxide and the phthalocyanine-based pigment A to be used are the same as in Example C1).

By using the infrared ray absorbing compositions of Examples C17 to C25, respective infrared-ray cut filters were prepared based on the method described in the above <Preparation of infrared ray cut filter>, and the evaluation described in the above (Evaluation of near infrared ray shielding property and infrared ray shielding property) was performed thereon. As a result, the near infrared ray shielding property and the infrared ray shielding property of the respective infrared ray cut filters were practically good.

Furthermore, with respect to these infrared ray cut filters, the evaluations described in the above (Evaluation of heat resistance) and (Evaluation of moisture resistance) were performed. As a result, in Examples C18 to C20, C23, and C24, the results of good heat resistance and moisture resistance were obtained as in Example C1. In contrast, in Examples C17 and C25, the heat resistance and the moisture resistance were deteriorated as compared with Example C1, but practically sufficient results were obtained. Also in Example C22, the near infrared ray shielding property was deteriorated as compared with Example C1, but practically sufficient results were obtained.

TABLE 12

| | Metal oxide | | Pigment | | Mass ratio of metal oxide to pigment |
|---|---|---|---|---|---|
| | Type | Content (% by mass)*5 | Type | Content (% by mass)*6 | |
| Example C1 | Cesium tungsten oxide | 60.8 | Phthalocyanine-based pigment A | 3 | 20 |
| Example C17 | The same as above | 30 | The same as above | 3 | 10 |
| Example C18 | The same as above | 40 | The same as above | 3 | 13 |
| Example C19 | The same as above | 50 | The same as above | 3 | 17 |
| Example C20 | The same as above | 70 | The same as above | 3 | 23 |
| Example C21 | The same as above | 80 | The same as above | 3 | 27 |
| Example C22 | The same as above | 60.8 | The same as above | 1.5 | 41 |
| Example C23 | The same as above | 60.8 | The same as above | 2 | 30 |
| Example C24 | The same as above | 60.8 | The same as above | 5 | 12 |
| Example C25 | The same as above | 60.8 | The same as above | 10 | 6 |

*5Content with respect to the mass of the total solid content of the composition
*6Content with respect to the mass of the total solid content of the composition As described above, it can be seen that according to the infrared ray absorbing composition of the present invention, it is possible to prepare an infrared ray cut filter which is excellent in all of near infrared ray shielding property, infrared ray shielding property, heat resistance, and moisture resistance.

Furthermore, according to the infrared ray absorbing composition of the present invention, a film can be formed, for example, by spin-coating and thus, in this regard, an infrared ray cut filter can be produced without requiring a complicated step. Therefore, the insufficient productivity in the aforementioned conventional infrared ray cut filters can be improved.

As described above, the infrared ray absorbing composition of the present invention is an infrared ray absorbing composition suitable for preparing a camera module composed of a solid state imaging element substrate and an infrared ray cut filter disposed on the light-receiving side of the solid imaging element substrate.

What is claimed is:

1. An infrared ray absorbing composition kit comprising:
   a composition containing a copper compound having a maximum absorption wavelength in the wavelength range of 700 nm to 1000 nm; and
   a composition containing a metal oxide having a maximum absorption wavelength in the wavelength range of 800 nm to 2000 nm, and
   wherein the copper compound is a copper complex represented by the following General formula (1-1) or General formula (1-2):

$Cu(L)_{n1}$            General Formula (1-1)

$Cu(L)_{n1} \cdot (X)_{n2}$            General Formula (1-2)

in General Formulas (1-1) and (1-2), L represents a ligand coordinated to copper, the ligand being a sulfonic acid, a phosphoric acid, a phosphoric acid ester, a phosphonic acid, a phosphonic acid ester, a phosphinic acid, a carboxylic acid, a carbonyl (ester or ketone), an amine, an amide, a sulfonamide, a urethane, a urea, an alcohol, or a thiol; X represents a halogen atom, $H_2O$, $NO_3$, $ClO_4$, $SO_4$, $CN$, $SCN$, $BF_4$, $PF_6$, $BPh_4$ or an alcohol; Ph represents a phenyl group; and each of n1 and n2 independently represents an integer of 1 to 4.

2. The infrared ray absorbing composition kit according to claim 1,
   wherein the content of the metal oxide in the composition containing the metal oxide is from 1% by mass to 50% by mass with respect to the mass of the total solid content of the composition.

3. The infrared ray absorbing composition kit according to claim 1,
   wherein the content of the copper compound in the composition containing the copper compound is from 50% by mass to 80% by mass with respect to the mass of the total solid content of the composition.

4. The infrared ray absorbing composition kit according to claim 1,
   wherein the content of the pigment in the composition containing the copper compound is from 1% by mass to 20% by mass with respect to the mass of the total solid content of the composition.

5. The infrared ray absorbing composition kit according to claim 1, wherein the metal oxide is cesium tungsten oxide.

6. The infrared ray absorbing composition kit according to claim 1,
   wherein the ligand L in General Formulas (1-1) and (1-2) is a sulfonic acid, a carboxylic acid, a phosphoric acid, a phosphoric acid ester, a phosphonic acid, phosphonic acid ester, or a phosphinic acid.

7. The infrared ray absorbing composition kit according to claim 1, wherein the mass ratio of the metal oxide to the copper compound is from 0.0001 to 0.5.

8. An infrared ray cut filter formed by using the infrared ray absorbing composition kit according to claim 1.

9. A method for producing an infrared ray cut filter, comprising a step of coating the infrared ray absorbing composition kit according to claim 1 to form a film.

10. A method for producing a camera module composed of a solid state imaging element substrate and an infrared ray cut filter disposed on the light-receiving side of the solid state imaging element substrate, comprising a step of coating the infrared ray absorbing composition kit according to claim 1 at the light-receiving side of the solid imaging element substrate to form a film.

* * * * *